(12) United States Patent
Kim et al.

(10) Patent No.: US 11,482,596 B2
(45) Date of Patent: Oct. 25, 2022

(54) SEMICONDUCTOR DEVICE

(71) Applicant: SAMSUNG ELECTRONICS CO., LTD., Suwon-si (KR)

(72) Inventors: Jinbum Kim, Seoul (KR); Seokhoon Kim, Suwon-si (KR); Kwanheum Lee, Suwon-si (KR); Choeun Lee, Pocheon-si (KR); Sujin Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 34 days.

(21) Appl. No.: 17/207,690

(22) Filed: Mar. 21, 2021

(65) Prior Publication Data

US 2022/0059654 A1 Feb. 24, 2022

(30) Foreign Application Priority Data

Aug. 19, 2020 (KR) ........................ 10-2020-0104157

(51) Int. Cl.
*H01L 29/08* (2006.01)
*H01L 29/78* (2006.01)
*H01L 29/167* (2006.01)
*H01L 29/786* (2006.01)
*H01L 29/06* (2006.01)
*H01L 29/423* (2006.01)

(52) U.S. Cl.
CPC ...... *H01L 29/0847* (2013.01); *H01L 29/0653* (2013.01); *H01L 29/167* (2013.01); *H01L 29/785* (2013.01); *H01L 29/78696* (2013.01); *H01L 29/0673* (2013.01); *H01L 29/42392* (2013.01)

(58) Field of Classification Search
CPC ......... H01L 29/66628; H01L 29/41783; H01L 29/42392; H01L 29/0653
See application file for complete search history.

(56) References Cited

U.S. PATENT DOCUMENTS

| 7,274,651 | B2 | 9/2007 | Kim et al. |
|---|---|---|---|
| 9,293,581 | B2 | 3/2016 | Yu et al. |
| 9,972,682 | B2 | 5/2018 | Gluschenkov et al. |
| 9,972,892 | B2 | 5/2018 | Choi et al. |
| 10,079,305 | B2 | 9/2018 | Lee et al. |
| 10,109,717 | B2 | 10/2018 | Lee et al. |
| 10,153,270 | B2 | 12/2018 | Kang et al. |

(Continued)

*Primary Examiner* — Changhyun Yi
(74) *Attorney, Agent, or Firm* — F. Chau & Associates, LLC

(57) ABSTRACT

A semiconductor device includes a channel, a first source/drain structure on a first side surface of the channel, a second source/drain structure on a second side surface of the channel, a gate structure surrounding the channel, an inner spacer layer on a side surface of the gate structure, and an outer spacer layer on an outer surface of the inner spacer layer. The first source/drain structure includes a first source/drain layer on the channel and a second source/drain layer on the first source/drain layer, and on a plane of the semiconductor device that passes through the channel, at least one of a first boundary line of the first source/drain layer in contact with the second source/drain layer and a second boundary line of the first source/drain layer in contact with the channel may be convex, extending toward the channel.

20 Claims, 102 Drawing Sheets

(56) References Cited

U.S. PATENT DOCUMENTS

| | | | |
|---|---|---|---|
| 10,186,579 B2 | 1/2019 | Min et al. | |
| 10,365,600 B2 | 7/2019 | Choi et al. | |
| 2013/0037867 A1* | 2/2013 | Adachi | H01L 21/76224 |
| | | | 438/303 |
| 2013/0099314 A1* | 4/2013 | Lu | H01L 29/66628 |
| | | | 257/288 |
| 2019/0067490 A1* | 2/2019 | Yang | H01L 29/775 |

\* cited by examiner

SEMICONDUCTOR DEVICE

CROSS-REFERENCE TO RELATED APPLICATION

This application is based on and claims priority under 35 U.S.C. § 119 to Korean Patent Application No. 10-2020-0104157, filed on Aug. 19, 2020, in the Korean Intellectual Property Office, the disclosure of which is incorporated by reference herein in its entirety.

TECHNICAL FIELD

The present disclosure relates to a semiconductor device, and more particularly, to a non-planar field effect transistor (FET).

DISCUSSION OF THE RELATED ART

To reduce the size of semiconductor devices of a given structure, the size of each transistor therein may be reduced. However, the reduction in the size of a transistor may causes a short channel effect. In order to mitigate this short channel effect, a FinFET, in which a gate contacts three sides of a channel, has been developed. In addition, a gate-all-around FET, in which a gate surrounds four sides of a channel, and a nanosheet FET have been developed.

SUMMARY

A semiconductor device includes a channel. A first source or drain structure is disposed on a first side surface of the channel. A second source or drain structure is disposed on a second side surface of the channel that is spaced apart from the first side surface of the channel in a first horizontal direction. A gate structure including a gate electrode layer at least partially surrounds an upper surface of the channel, a third side surface of the channel, a fourth side surface of the channel 110 spaced apart from the third side surface of the channel in a second horizontal direction, and a gate insulating layer disposed between the gate electrode layer and the channel. An inner spacer layer is disposed on a side surface of the gate structure. An outer spacer layer is disposed on an outer surface of the inner spacer layer. The first source or drain structure includes a first source or drain layer disposed on the channel and a second source or drain layer disposed on the first source or drain layer, and on a plane of the semiconductor device that passes through the channel and is parallel to the first horizontal direction and the second horizontal direction, at least one of a first boundary line of the first source or drain layer in contact with the second source or drain layer and a second boundary line of the first source or drain layer in contact with the channel is convex, extending toward the channel.

A semiconductor device includes a channel. A first source or drain structure including a first source or drain layer is disposed on a first side surface of the channel and a second source or drain layer is disposed on the first source or drain layer. A second source or drain structure including a third source or drain layer is disposed on a second side surface of the channel spaced apart from the first side surface of the channel in a first horizontal direction and a fourth source or drain layer is disposed on the third source or drain layer. A gate structure including a gate electrode layer at least partially surrounding an upper surface of the channel, a third side surface of the channel, a fourth side surface of the channel spaced from the third side surface of the channel in a second horizontal direction, and a gate insulating layer disposed between the gate electrode layer and the channel. A first inner spacer layer is disposed on a first side surface of the gate structure. A second inner spacer layer is disposed on a second side surface of the gate structure spaced apart from the first side surface of the gate structure in the first horizontal direction. A first outer spacer layer is disposed on an outer surface of the first inner spacer layer. A second outer spacer layer is disposed on an outer surface of the second inner spacer layer. On a plane of the semiconductor device that passes through the channel and is parallel to the first horizontal direction and the second horizontal direction, a first distance between the second source or drain layer and the fourth source or drain layer along a first horizontal line that passes through the third side surface of the channel 110 and is parallel to the first horizontal direction is greater than a second distance between the second source or drain layer and the fourth source or drain layer along a second horizontal line that passes between the third side surface of the channel 110 and the fourth side surface of the channel 110 and is parallel to the first horizontal direction.

A semiconductor device includes a plurality of channels spaced apart from each other in a vertical direction. A first source or drain structure is in contact with a first side surface of each of the plurality of channels. A second source or drain structure in contact with a second side surface of each of the plurality of channels is spaced apart from the first side surface of each of the plurality of channels in a first horizontal direction. A gate structure includes a gate electrode layer at least partially surrounding an upper surface of each of the plurality of channels, a lower surface of each of the plurality of channels, a third side surface of each of the plurality of channels, and a fourth side surface of each of the plurality of channels spaced apart from the third side surface of each of the plurality of channels in a second horizontal direction, and a gate electrode layer disposed between the gate electrode layer and each of the plurality of channels. An inner spacer layer is disposed on a side surface of the gate structure perpendicular to the first horizontal direction. An outer spacer layer is disposed on the outer surface of the inner spacer layer. The first source or drain structure includes a first source or drain layer in contact with the gate insulating layer and a second source or drain layer in contact with the first source or drain layer, and on a plane of the semiconductor device that passes through a portion of the gate electrode layer between the plurality of channels and is perpendicular to the vertical direction, at least one of a first boundary line of the first source or drain layer in contact with the second source or drain layer and a second boundary line of the first source or drain layer in contact with the gate insulating layer is convex, extending toward the gate insulating layer.

BRIEF DESCRIPTION OF THE DRAWINGS

Embodiments of the inventive concept will be more clearly understood from the following detailed description taken in conjunction with the accompanying drawings in which:

FIGS. 12A to 20A are plan views illustrating a method of manufacturing a semiconductor device, according to an embodiment of the present disclosure;

FIGS. 12B to 20B are cross-sectional views illustrating the semiconductor device taken along line B-B' of FIGS. 12A to 20A, respectively;

FIGS. 12C to 20C are cross-sectional views illustrating the semiconductor device taken along line C-C' of FIGS. 12A to 20A, respectively;

FIGS. 15D to 20D are cross-sectional views illustrating the semiconductor device taken along line E-E' of FIGS. 15B to 20B and 15C to 20C, respectively;

FIGS. 21A to 25A are plan views illustrating a method of manufacturing a semiconductor device, according to an embodiment of the present disclosure;

FIGS. 21B to 25B are cross-sectional views illustrating the semiconductor device taken along line B-B' of FIGS. 21A to 25A, respectively;

FIGS. 21C to 25C are cross-sectional views illustrating the semiconductor device taken along line C-C' of FIGS. 21A to 25A, respectively;

FIGS. 23D to 25D are cross-sectional views illustrating the semiconductor device taken along line G-G' of FIGS. 23B to 25B and 23C to 25C, respectively;

FIGS. 26A to 29A are plan views illustrating a method of manufacturing a semiconductor device, according to an embodiment of the present disclosure;

FIGS. 26B to 29B are cross-sectional views illustrating the semiconductor device taken along line B-B' of FIGS. 26A to 29A, respectively;

FIGS. 26C to 29C are cross-sectional views illustrating the semiconductor device taken along line C-C' of FIGS. 26A to 29A, respectively;

FIGS. 27D to 29D are cross-sectional views illustrating the semiconductor device taken along line G-G' of FIGS. 27B to 29B and 27C to 29C, respectively;

DETAILED DESCRIPTION OF THE EMBODIMENTS

Figure 1A:
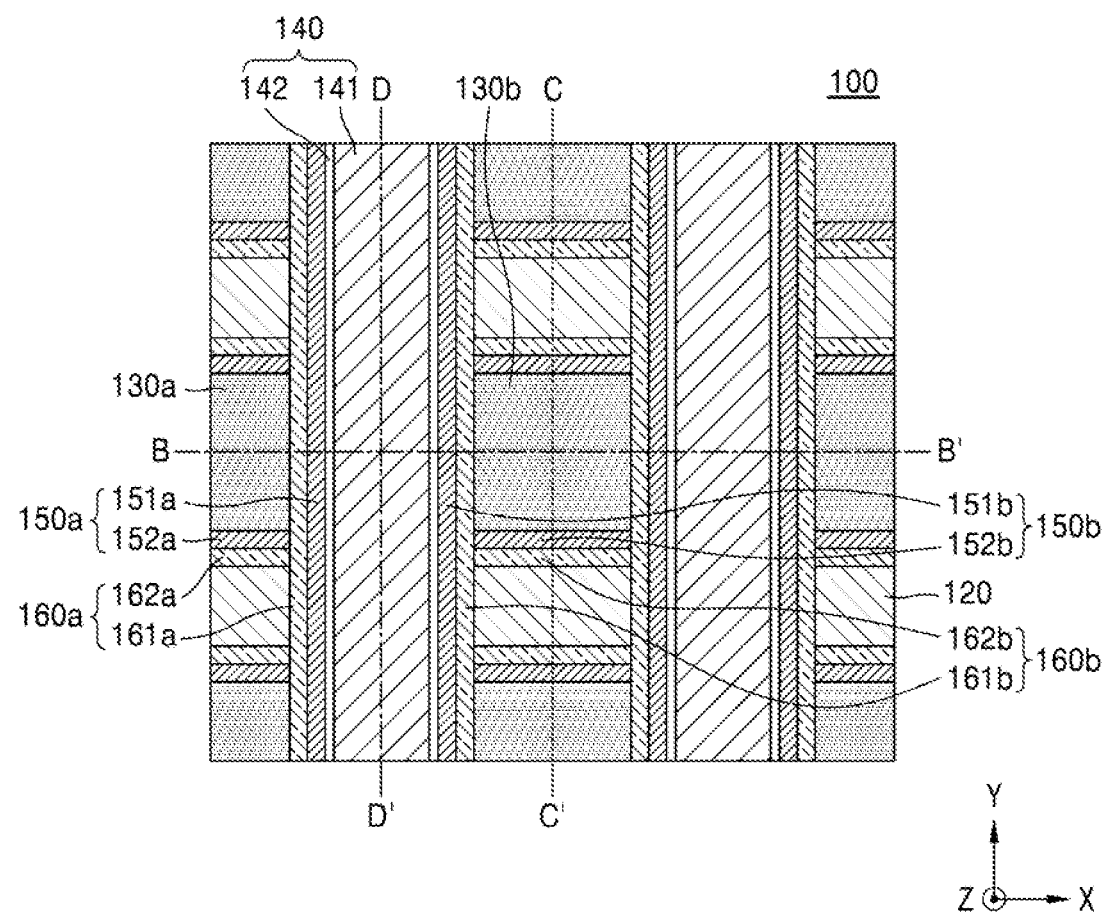
FIG. 1A is a plan view illustrating a semiconductor device according to an embodiment of the present disclosure.
Figure 1B:
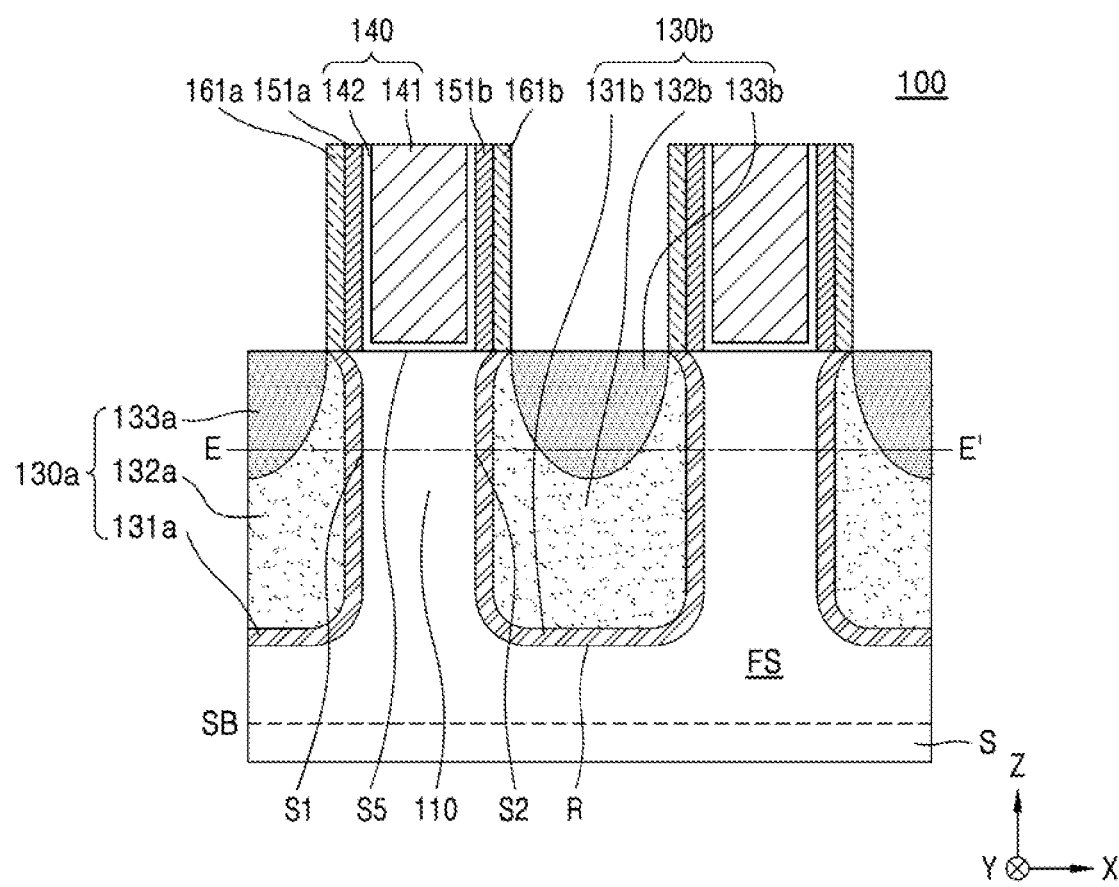
FIG. 1B is a cross-sectional view illustrating the semiconductor device taken along line B-B' of FIG. 1A.
Figure 1C:
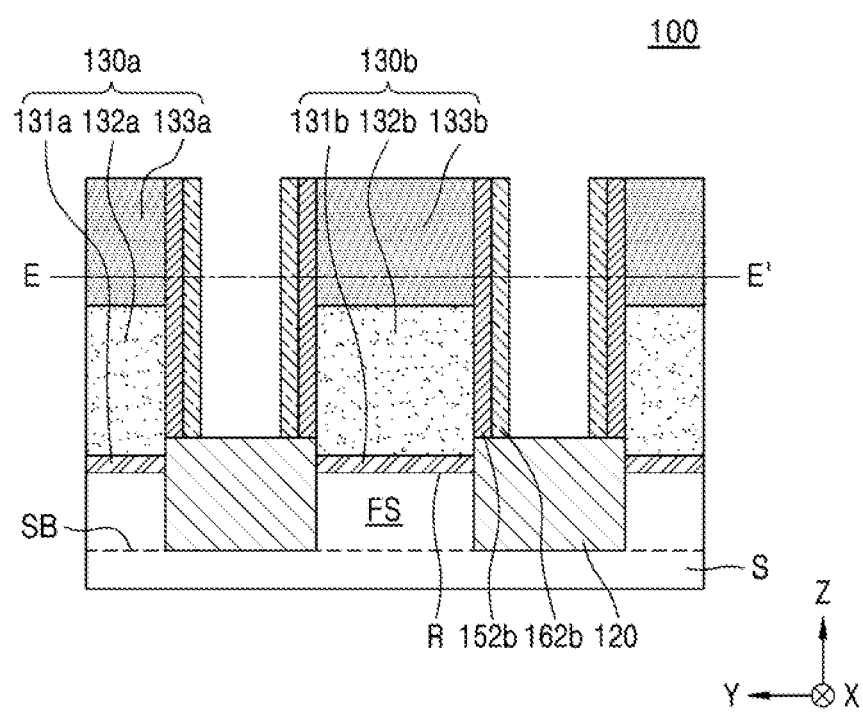
FIG. 1C is a cross-sectional view illustrating the semiconductor device taken along line C-C' of FIG. 1A.
Figure 1D:
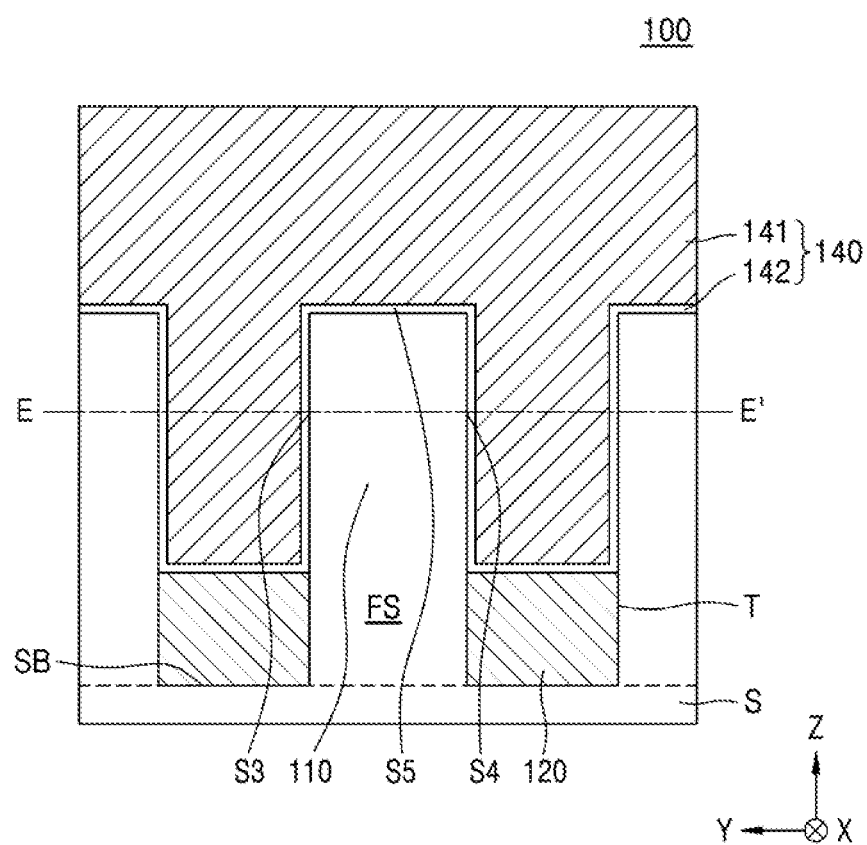
FIG. 1D is a cross-sectional view illustrating the semiconductor device taken along line D-D' of FIG. 1A.
Figure 1E:
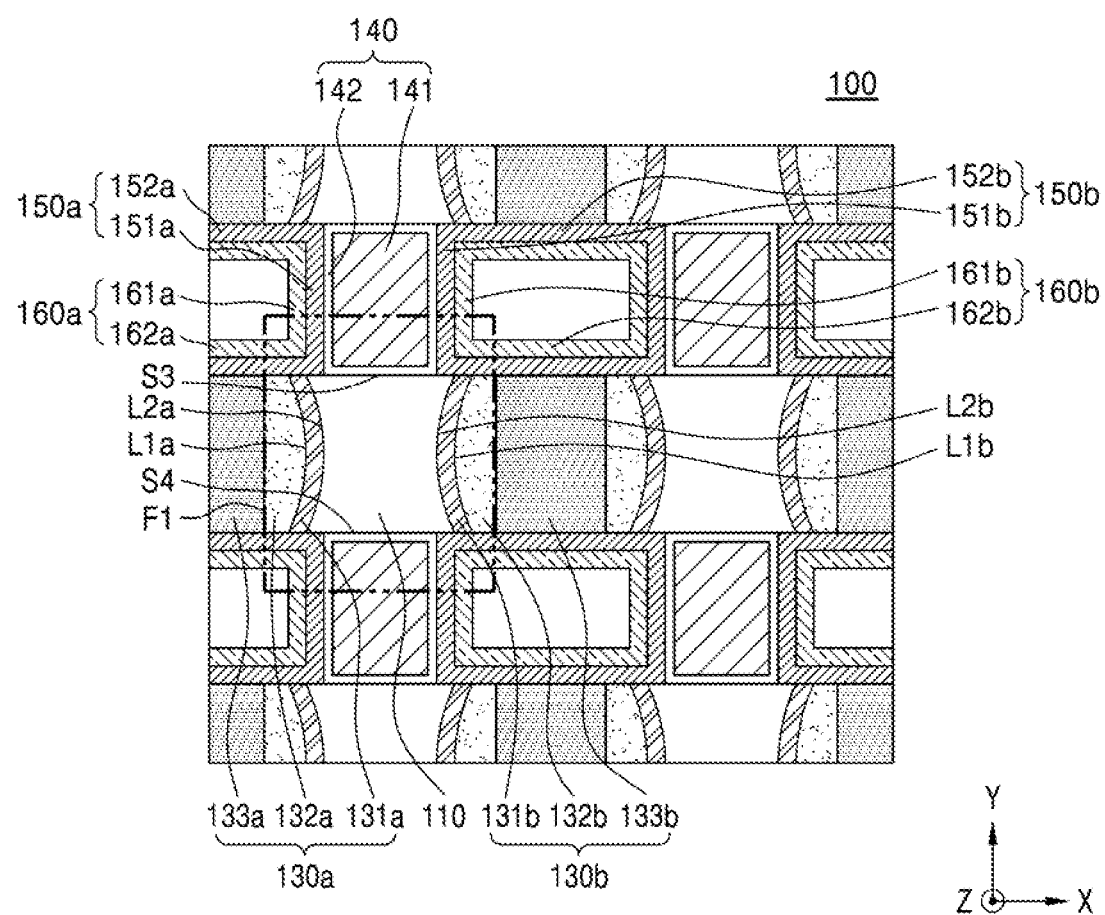
FIG. 1E is a cross-sectional view illustrating the semiconductor device taken along line E-E' of FIGS. 1B to 1D.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. FIG. 1A is a plan view illustrating a semiconductor device according to an embodiment of the present disclosure. FIG. 1B is a cross-sectional view illustrating the semiconductor device taken along line B-B' of FIG. 1A. FIG. 1C is a cross-sectional view illustrating the semiconductor device taken along line C-C' of FIG. 1A. FIG. 1D is a cross-sectional view illustrating the semiconductor device taken along line D-D' of FIG. 1A. FIG. 1E is a cross-sectional view illustrating the semiconductor device taken along line E-E' of FIGS. 1B to 1D. FIG. 1 F is an enlarged view illustrating area Fl of FIG. 1E.

Referring to FIG. 1A to FIG. 1D, a semiconductor device 100 may include a channel 110, a first source or drain structure 130a disposed on a first side surface S1 of the channel 110, a second source or drain structure 130b disposed on a second side surface S2 of the channel 110, a gate structure 140 disposed on an upper surface S5 of the channel 110, a third side surface S3 of the channel 110, and a fourth side surface S4 of the channel 110, a first inner spacer layer 150a and a second inner spacer layer 150b respectively located on both side surfaces of the gate structure 140, and a first outer spacer layer 160a and a second outer spacer layer 160b respectively located on side surfaces of the first inner spacer layer 150a and the second inner spacer layer 150b.

The channel 110 may be a portion of a fin structure FS disposed between the first source or drain structure 130a and the second source or drain structure 130b. The fin structure FS protrudes from a base surface SB of the substrate S and may extend in a first horizontal direction (e.g., an X direction). In some embodiments of the present disclosure, the fin structure FS may be a portion of the substrate S. In some embodiment, the fin structure FS may be a structure grown or deposited on a base surface SB of the substrate S separately from the substrate S. The fin structure FS may be defined by two trenches T extending in the first horizontal direction (e.g., the X direction) from both sides of the fin structure FS. The two trenches T may each define a third side surface S3 of the channel 110 and a fourth side surface S4 of the channel 110. A lower portion of a trench T may be filled by a device isolation layer 120. The device isolation layer 120 may expose an upper portion of the fin structure FS. The device isolation layer 120 may electrically separate fin structures FS from each other. The fin structure FS may have two recesses R respectively defining the first side surface S1 of the channel and the second side surface S2 of the channel 110.

The channel 110 may include a semiconductor material such as silicon (Si). The device isolation layer 120 may include an insulating material such as silicon oxide, silicon nitride, or a combination thereof.

The first source or drain structure 130a may be the first side surface S1 of the channel 110 and may fill a recess R defining the first side surface S1 of the channel 110. The second source or drain structure 130b may be disposed on the second side surface S2 of the channel 110 and may at least partially fill the recess R defining the second side surface S2 of the channel 110. The first side surface S I of the channel 110 and the second side surface S2 of the channel 110 may face each other. The first side surface S1 of the channel 110 and the second side surface S2 of the channel 110 may be substantially perpendicular to the first horizontal direction (e.g., the X direction). The second side surface S2 of the channel 110 may be spaced apart from the first side surface S1 of the channel 110 in the first horizontal direction (e.g., the X direction).

The first source or drain structure 130a may include a plurality of layers, such as a first source or drain layer 131a, a second source or drain layer 132a, and a third source or drain layer 133a. Similarly, the second source or drain structure 130b may include a plurality of layers, such as a fourth source or drain layer 131b, a fifth source or drain layer 132b, and a sixth source or drain layer 133b. The number of layers constituting each of the first source or drain structure 130a and the second source or drain structure 130b is not necessarily limited to three, and may be more or less than three.

Each of the first to sixth source or drain layers 131a to 133a and 131b to 133b may include a semiconductor material. In some embodiments of the present disclosure, the first source or drain layer 131a, the second source or drain layer 132a, the fourth source or drain layer 131b, and the fifth source or drain layer 132b may include SiGe. When the semiconductor device 100 is a p-type device, the first to sixth source or drain layers 131a to 133a and 131b to 133b including SiGe generate stress in the channel 110 including Si to increase hole mobility, thereby enhancing the performance of the semiconductor device 100.

In some embodiments of the present disclosure, Ge concentration of the second source or drain layer 132a may be higher than Ge concentration of the first source or drain layer 131a, and Ge concentration of the fifth source or drain layer 132b may be higher than Ge concentration of the fourth source or drain layer 132b. In some embodiments of the present disclosure, the Ge concentration of the first source or drain layer 131a and the fourth source or drain layer 131b may be about 0% to about 50%, by mass, volume, or moles, and may be doped with a dopant such as B, P, As, C, Si, and Sn. The second source or drain layer 132a, the third source or drain layer 133a, the fifth source or drain layer 132b, and the sixth source or drain layer 133b may be doped with a dopant such as C, B, P, As, Sn, In, and Ga.

The gate structure 140 may extend in a second horizontal direction (e.g., a −Y direction). The gate structure 140 may include a gate electrode layer 141 at least partially surrounding the upper surface S5 of the channel 110, the third side surface S3 of the channel 110, and the fourth side surface S4 of the channel 110, and a gate insulating layer 142 between the gate electrode layer 141 and the channel 110. The gate insulating layer 142 may contact the upper surface S5 of the channel 110, the third side surface S3 of the channel 110, and the fourth side surface S4 of the channel 110. The third side surface S3 of the channel 110 and the fourth side surface S4 of the channel 110 may face each other, and may be substantially perpendicular to the second horizontal direction (e.g., the −Y direction). The fourth side surface S4 of the channel 110 may be spaced apart from the third side surface S3 of the channel 110 in the second horizontal direction (e.g., the −Y direction).

The gate electrode layer 141 may include a metal, metal nitride, metal carbide, or a combination thereof. The metal may include titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), palladium (Pd), or a combination thereof. The metal nitride may include TiN or TaN. The metal carbide may include TiAlC. The gate insulating layer 142 may include an interface layer in contact with the channel 110 and a high-κ dielectric layer on the interface layer. As used herein, the high-κ dielectric layer may be a layer having a dielectric constant κ that is greater than that of silicon dioxide. The interface layer may include a low-κ dielectric material having a dielectric constant κ of about 9 or less, such as silicon oxide, silicon nitride, or a combination thereof. The interface layer may be omitted. The high-κ dielectric layer may include, for example, a material having a dielectric constant κ of about 10 to about 25. The high-κ dielectric layer may include, for example, hafnium oxide ($HfO_2$), zirconium oxide ($ZrO_2$), aluminum oxide ($Al_2O_3$), or a combination thereof.

The first inner spacer layer 150a may include a first portion 151a on a side surface of the gate structure 140 and a second portion 152a on a side surface of the first source or drain structure 130a. Similarly, the second inner spacer layer 150b may include a first portion 151b on the opposite side surface of the gate structure 140 and a second portion 152b on a side surface of the second source or drain structure 130b. The first portion 151b of the second inner spacer layer 150b may be spaced apart from the first portion 151a of the first inner spacer layer 150a in the first horizontal direction (e.g., the X direction).

In some embodiments of the present disclosure, the gate insulating layer 142 may further extend between the first portion 151a of the first inner spacer layer 150a and the gate electrode layer 141 and between the first portion 151b of the second inner spacer layer 150b and the gate electrode layer 141, and the first portion 151a of the first inner spacer layer 150a and the first portion 151b of the second inner spacer layer 150b may contact the gate insulating layer 142. In some embodiments of the present disclosure, the gate insulating layer 142 might not extend between the first portion 151a of the first inner spacer layer 150a and the gate electrode layer 141 and between the first portion 151b of the second inner spacer layer 150b and the gate electrode layer 141, and the first portion 151a of the first inner spacer layer 150a and the first portion 151b of the second inner spacer layer 150b may directly contact the gate insulating layer 142.

A thickness of the first inner spacer layer 150a and the second inner spacer layer 150b (e.g., a thickness of the first portion 151a of the first inner spacer layer 150a in the first horizontal direction (e.g., the X direction), a thickness of the second portion 152a of the first inner spacer layer 150a in the second horizontal direction (e.g., the −Y direction), a thickness of the first portion 151b of the second inner spacer layer 150b in the first horizontal direction (e.g., the X direction), and a thickness of the second portion 152b of the second inner spacer layer 150b in the second horizontal direction (e.g., the −Y direction)) may be about 0.5 nm to about 10 nm. The first inner spacer layer 150a and the second inner spacer layer 150b may include silicon oxide, silicon nitride, or a combination thereof.

The first outer spacer layer 160a may include a first portion 161a on an outer surface of the first portion 151a of the first inner spacer layer 150a, and a second portion 162a on an outer surface of the second portion 152a of the first inner spacer layer 150a. Similarly, the second outer spacer layer 160b may include a first portion 161b on an outer surface of the first portion 151b of the second inner spacer layer 150b, and a second portion 162b on the outer surface of the second portion 152b of the second inner spacer layer 150b. A thickness of the first outer spacer layer 160a and the second outer spacer layer 160b (e.g., a thickness of the first portion 161a of the first outer spacer layer 160a in the first horizontal direction (e.g., the X direction), a thickness of the second portion 162a of the first outer spacer layer 160a in the second horizontal direction (e.g., the −Y direction), a thickness of the first portion 161b of the second outer spacer layer 160b in the first horizontal direction (e.g., the X direction), and a thickness of the second portion 162b of the second outer spacer layer 160b in the second horizontal direction (e.g., the −Y direction)) may be about 0.5 nm to about 50 nm. The first outer spacer layer 160a and the second outer spacer layer 160b may include silicon oxide, silicon nitride, or a combination thereof.

Figure 1F:
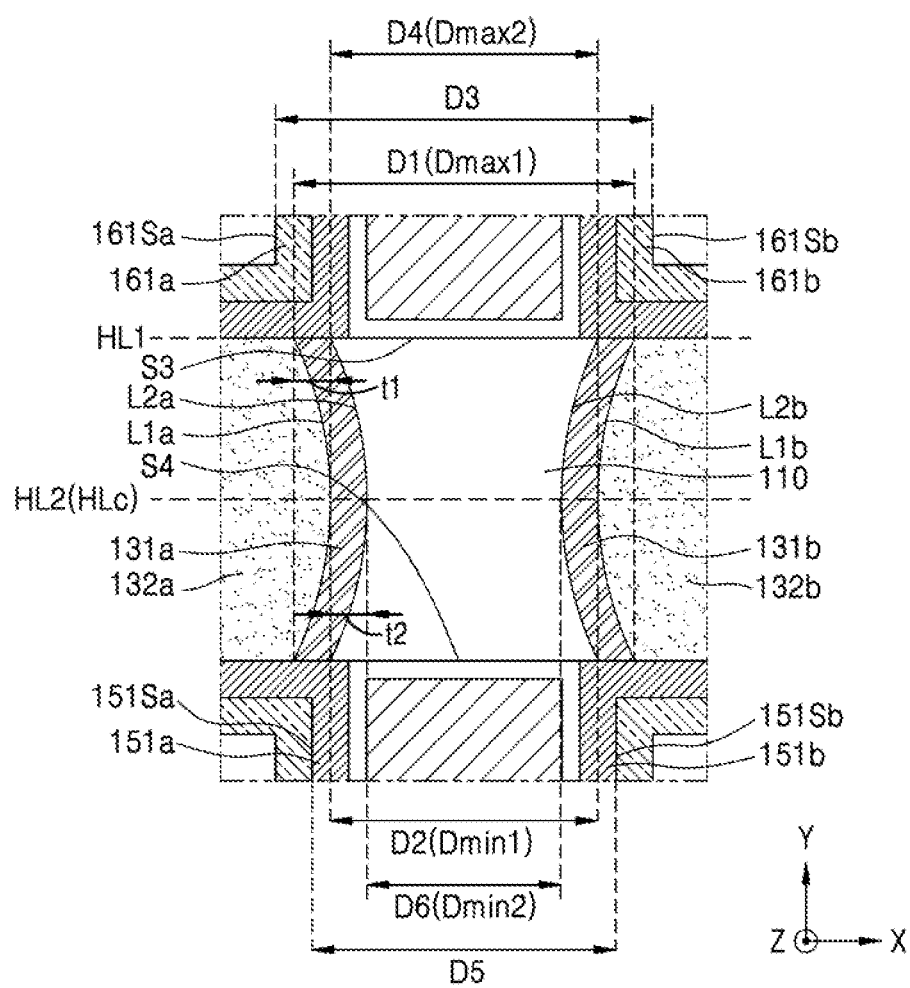
FIG. 1F is an enlarged view illustrating area F1 of FIG. 1E.

FIG. 1E shows a cross-section that passes through the channel 110 and is parallel to the first horizontal direction (e.g., the X direction) and the second horizontal direction (e.g., the −Y direction). Referring to FIGS. 1E and 1F, the first source or drain layer 131a may have a first boundary line L1a in contact with the second source or drain layer 132a and a second boundary line L2a in contact with the channel 110. The fourth source or drain layer 131b may have a third boundary line L1b in contact with the fifth source or drain layer 132b and a fourth boundary line L2b in contact with the channel 110. The first boundary line L1a and the second boundary line L2a may be convex, extending toward the channel 110 in the first horizontal direction (e.g., the X direction). The third boundary line L1b and the fourth boundary line L2b may be convex, extending toward the channel 110 in a direction (e.g., the −X direction) opposite to the first horizontal direction.

Therefore, a distance between the second source or drain layer 132a and the fifth source or drain layer 132b in the first horizontal direction (e.g., the X direction) is spaced apart by the same distance from the third side surface S3 of the channel 110 and the fourth side surface S4 of the channel 110, and may have a minimum value Dmin1 along a central horizontal line HLc parallel to the first horizontal direction (e.g., the X direction). In addition, the distance between the second source or drain layer 132a and the fifth source or drain layer 132b in the first horizontal direction (e.g., the X direction) may have a maximum value Dmanx1 along a first horizontal line HL1 that passes through the third side surface S3 of the channel 110 and is parallel to the first horizontal direction (e.g., the X direction). For example, a distance D1 between the second source or drain layer 132a and the fifth source or drain layer 132b along the first horizontal line HL1 may be greater than a distance D2 between the second source or drain layer 132a and the fifth source or drain layer 132b along a second horizontal line HL2 that passes between the third side surface S3 of the channel 110 and the fourth side surface S4 of the channel 110 and is parallel to the first horizontal direction (e.g., the X direction). The distance between the second source or drain layer 132a and the fifth source or drain layer 132b may be a distance between the first boundary line L1a and the third boundary line L1b.

In some embodiments of the present disclosure, a maximum distance Dmax1 between the second source or drain layer 132a and the fifth source or drain layer 132b in the first horizontal direction (e.g., the X direction) may be less than or equal to a distance D3 between an outer surface 161Sa of the first portion 161a of the first outer spacer layer 160a and an outer surface 161Sb of the first portion 161b of the second outer spacer layer 160b in the first horizontal direction (e.g., the X direction). As will be described with reference to FIGS. 19A to 19D, this is because the first portion 161a of the first outer spacer layer 160a and the first portion 161b of the second outer spacer layer 160b are used as etching masks of the first source or drain layer 131a and the second source or drain layer 132a, respectively.

In addition, a distance between the first source or drain layer 131a and the fourth source or drain layer 131b in the first horizontal direction (e.g., the X direction) may have a minimum value Dmin2 along the central horizontal line HLc, and may have a maximum value Dmax2 along the horizontal line HL1. For example, a distance D4 between the first source or drain layer 131a and the fourth source or drain layer 131b along the first horizontal line HL1 may be greater than a distance D6 between the first source or drain layer 131a and the fourth source or drain layer 131b along the second horizontal line HL2. The distance between the first source or drain layer 131a and the fourth source or drain layer 131b may be a distance between the second boundary line L2a and the fourth boundary line L2b. In addition, the distance between the first source or drain layer 131a and the fourth source or drain layer 131b in the first horizontal direction (e.g., the X direction) may be a length of the channel 110 in the first horizontal direction (e.g., the X direction).

A maximum distance Dmax2 between the first source or drain layer 131a and the fourth source or drain layer 131b in the first horizontal direction (e.g., the X direction) may be less than or equal to a distance D5 between an outer surface 151Sa of the first portion 151a of the first inner spacer layer 150a and an outer surface 151Sb of the first portion 151b of the second inner spacer layer 150b in the first horizontal direction (e.g., the X direction). As will be described with reference to FIGS. 15A to 15D, this is because the first portion 151a of the first inner spacer layer 150a and the first portion 151b of the second inner spacer layer 150b are used as etching masks of the channel 110.

In some embodiments of the present disclosure, a thickness of the first source or drain layer 131a in the first horizontal direction (e.g., the X direction) may be uniform. For example, a thickness t1 of the first source or drain layer 131a along the first horizontal line HL1 may be the same as a thickness t2 of the first source or drain layer 131a along the second horizontal line HL2. In addition, a thickness of the fourth source or drain layer 131b may be uniform.

The first source or drain layer 131a and the fourth source or drain layer 131b may contact the first inner spacer layer 150a and the second inner spacer layer 150b, respectively. In addition, the first source or drain layer 131a and the fourth source or drain layer 131b may be spaced apart from the first outer spacer layer 160a and the second outer spacer layer 160b, respectively, by the first inner spacer layer 150a and the second inner spacer layer 150b. The second source or drain layer 132a and the fifth source or drain layer 132b may contact the first inner spacer layer 150a and the second inner spacer layer 150b, respectively. In addition, the second source or drain layer 132a and the fifth source or drain layer 132b may be spaced apart from the first outer spacer layer 160a and the second outer spacer layer 160b, respectively, by the first inner spacer layer 150a and the second inner spacer layer 150b.

According to the inventive concept, the uniformity of thicknesses of the first source or drain layer 131a and the fourth source or drain layer 131b may be increased. In particular, it may be prevented that thicknesses of opposite ends of the first source or drain layer 131a and the fourth source or drain layer 131b near the gate structure 140 are formed more thinly due to a difference in growth rate according to a crystal plane. The first source or drain layer 131a and the fourth source or drain layer 131b that are uniform may increase the performance of a semiconductor device.

In addition, because an etchant for removing a dummy gate structure passes through thin portions of the first source or drain layer 131a and the fourth source or drain layer 131b, etching of the second source or drain layer 132a, the third source or drain layer 133a, the fifth source or drain layer 132b, and the sixth source or drain layer 133b having a faster etching rate for the etchant may be prevented. In addition, by doping the first source or drain layer 131a and the fourth source or drain layer 131b with carbon, the resistance to an etchant of the first source or drain layer 131a and the fourth source or drain layer 131b may be increased, and accordingly, the first source or drain layer 131a and the fourth source or drain layer 131b may better protect the second source or drain layer 132a, the third source or drain layer 133a, the fifth source or drain layer 132b, and the sixth source or drain layer 133b from an etchant. Therefore, a manufacturing yield of the semiconductor device may be increased.

In addition, in general, when Ge concentration of the first source or drain layer 131a and the fourth source or drain layer 131b increases, the resistance of the first source or drain layer 131a and the fourth source or drain layer 131b to an etchant decreases. However, when the first source or drain layer 131a and the fourth source or drain layer 131b that have a uniform thickness and are doped with carbon are used, even if the Ge concentration of the first source or drain layer 131 a and the fourth source or drain layer 131b is increased, the first source or drain layer 131a and the fourth source or drain layer 131b may sufficiently protect the second source or drain layer 132a, the third source or drain layer 133a, the fifth source or drain layer 132b, and the sixth source or drain layer 133b from an etchant. Accordingly, the performance of the semiconductor device may be increased by increasing the Ge concentration of the first source or drain layer 131a and the fourth source or drain layer 131b without reducing the manufacturing yield of the semiconductor device.

In addition, as will be described with reference to FIGS. 19A to 20D, a loading effect of growth of the first source or drain layer 131a, the second source or drain layer 132a, the fourth source or drain layer 131b, and the fifth source or drain layer 132b may be reduced.

Figure 2A:
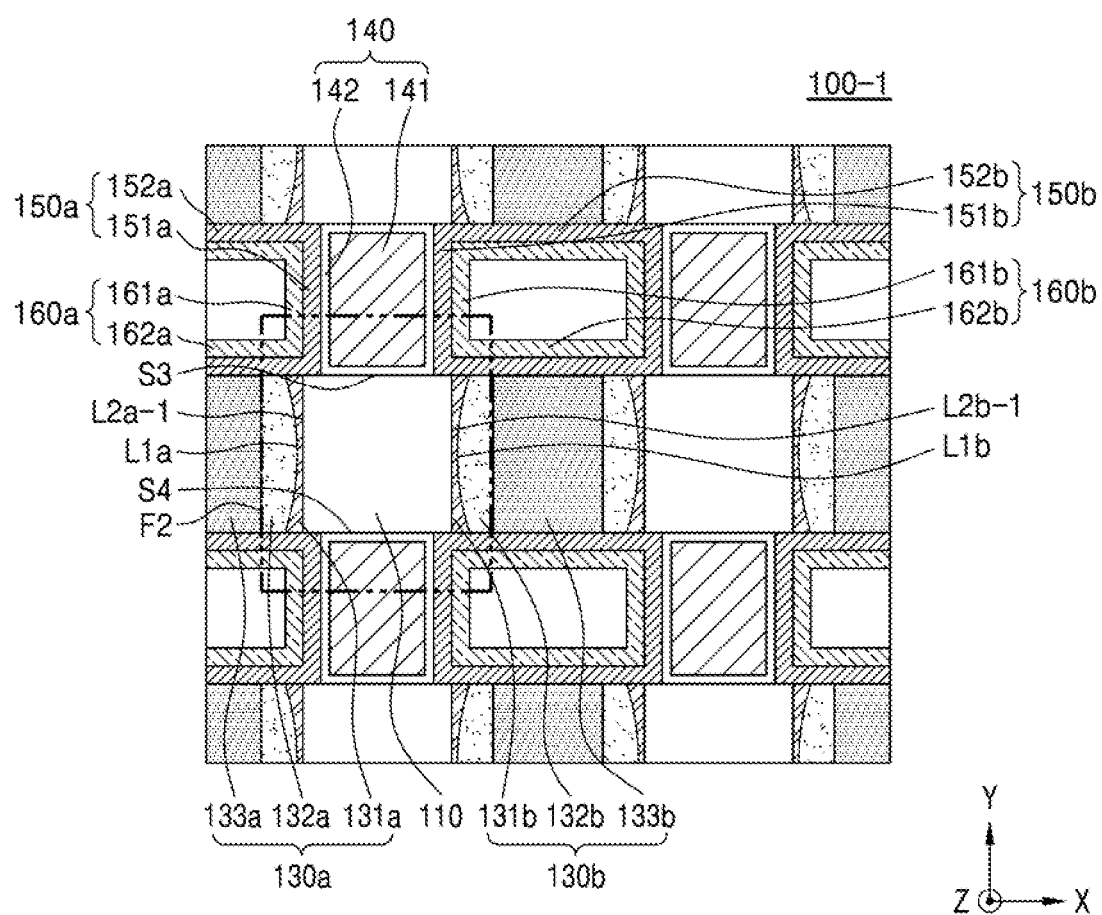
FIG. 2A is a cross-sectional view illustrating a semiconductor device according to an embodiment of the present disclosure.
Figure 2B:
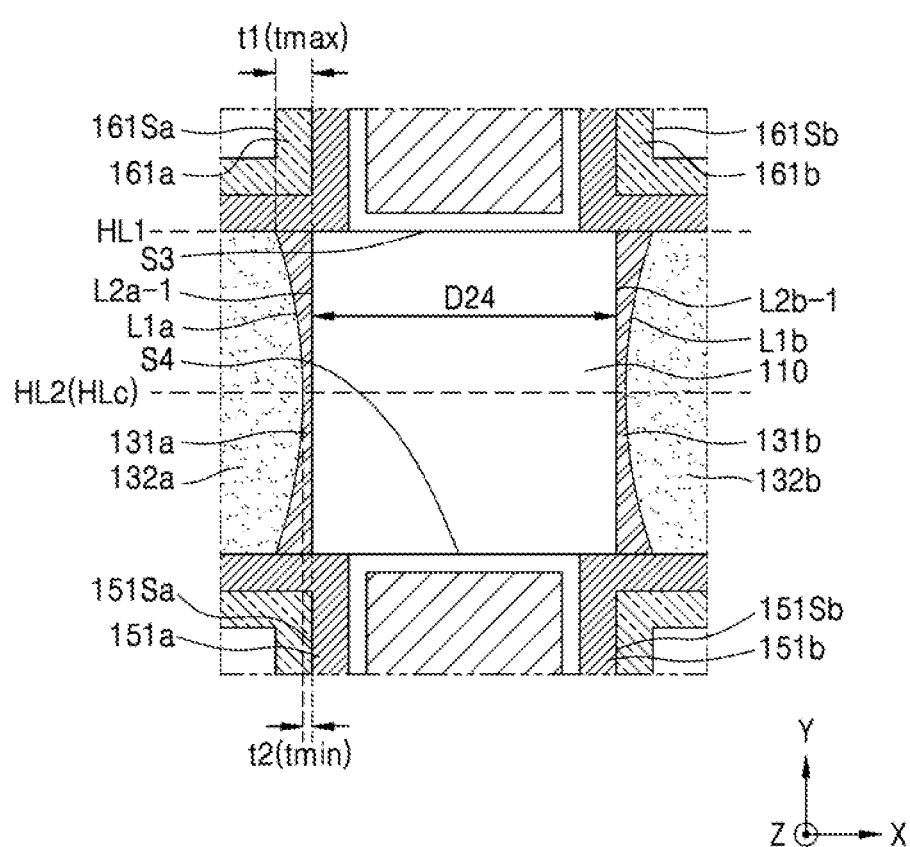
FIG. 2B is an enlarged view illustrating area F2 of FIG. 2A.

FIG. 2A is a cross-sectional view illustrating a semiconductor device 100-1 according to an embodiment of the present disclosure. FIG. 2B is an enlarged view illustrating area F2 of FIG. 2A. Hereinafter, differences between the semiconductor device 100 described with reference to FIGS. 1E and 1F and the semiconductor device 100-1 described with reference to FIGS. 2A and 2B will be described. To the extent that other elements are not described, it may be assumed that these other elements are at least similar to corresponding elements that are described in detail elsewhere within the specification.

Referring to FIGS. 2A and 2B, the first boundary line L1a of the first source or drain layer 131a in contact with the second source or drain layer 132a is convex extending in the first direction (e.g., the X direction) extending toward the channel 110, while a second boundary line L2a-1 of the first source or drain layer 131a in contact with the channel 110 may be a straight line. Similarly, the third boundary line L1b of the fourth source or drain layer 131b in contact with the fifth source or drain layer 132b is convex extending in the direction (e.g., the −X direction) extending opposite to the first direction toward the channel 110, while a fourth boundary line L2b-1 of the fourth source or drain layer 131b in contact with the channel 110 may be a straight line.

Accordingly, a distance D24 between the first source or drain layer 131a and the fourth source or drain layer 131b in the first horizontal direction (e.g., the X direction) may be constant. For example, the distance between the first source or drain layer 131a and the fourth source or drain layer 131b along the first horizontal line HL1 may be greater than the distance between the first source or drain layer 131a and the fourth source or drain layer 131b along the second horizontal line HL2. A thickness of the first source or drain layer 131a in the first horizontal direction (e.g., the X direction) may have a maximum value tmax along the first horizontal line HL1, and a minimum value tmin along the central horizontal line HLc. For example, the thickness t1 of the first source or drain layer 131a along the first horizontal line HL1 may be greater than the thickness t2 of the first source or drain layer 131a along the second horizontal line HL2. The fourth source or drain layer 131b may also have a thickness that changes similarly to that of the first source or drain layer 131a.

In some embodiments of the present disclosure, the second boundary line L2a-1 may lie on the same line as the outer surface 151Sa of the first portion 151a of the first inner spacer layer 150a. Similarly, the fourth boundary line L2b-1 may lie on the same line as the outer surface 151Sb of the first portion 151b of the second inner spacer layer 150b.

Figure 3A:
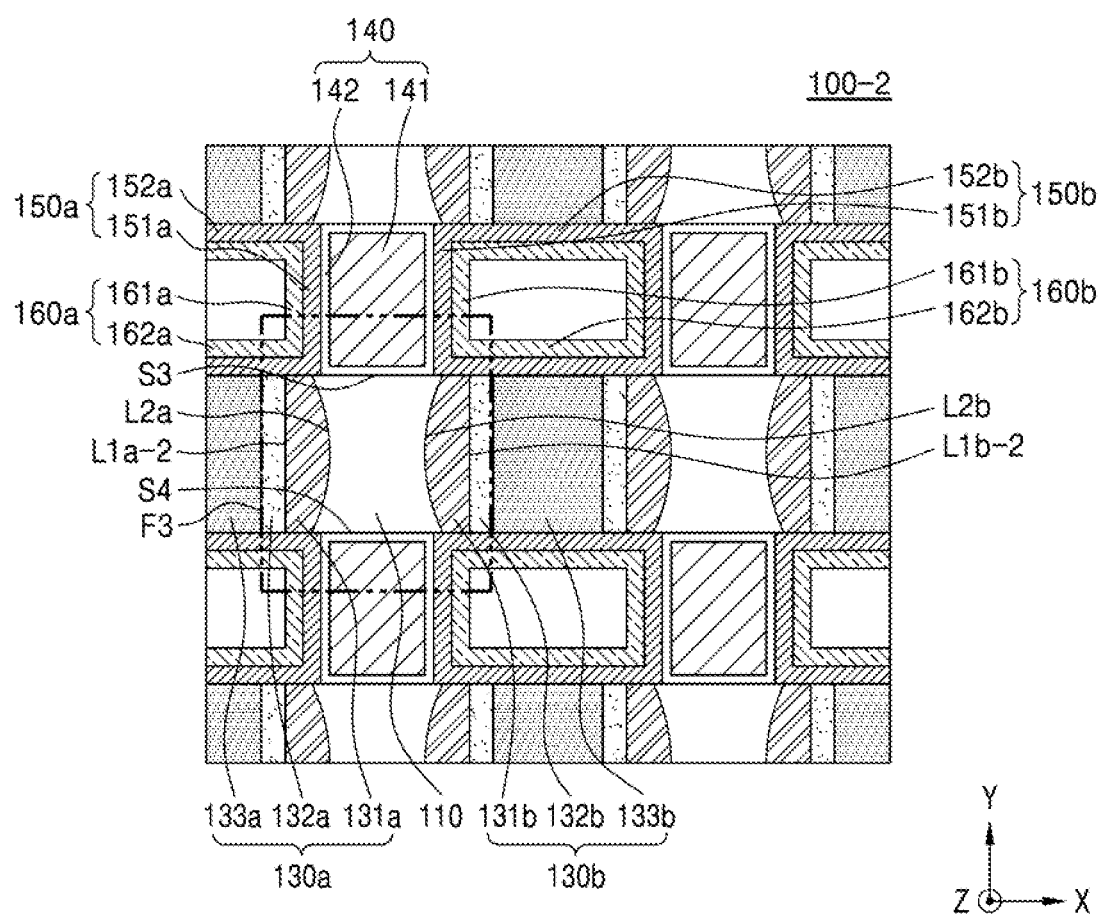
FIG. 3A is a cross-sectional view illustrating a semiconductor device according to an embodiment of the present disclosure.
Figure 3B:
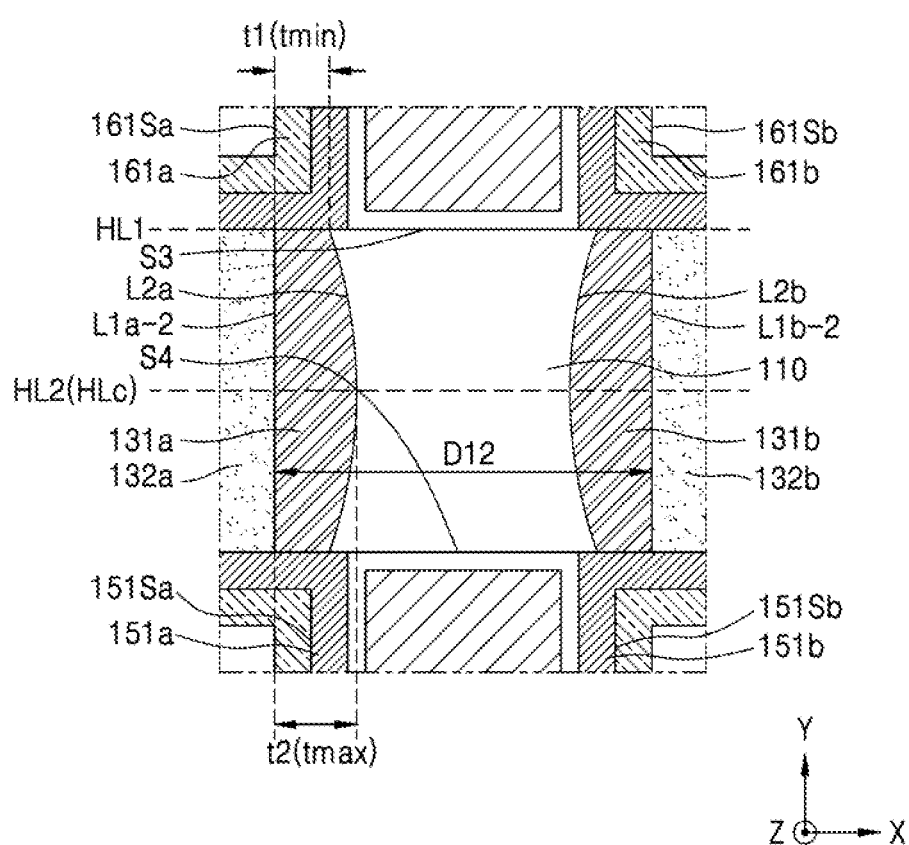
FIG. 3B is an enlarged view illustrating area F3 of FIG. 3A.

FIG. 3A is a cross-sectional view illustrating a semiconductor device 100-2 according to an embodiment of the present disclosure. FIG. 3B is an enlarged view illustrating area F3 of FIG. 3A. Hereinafter, differences between the semiconductor device 100 described with reference to FIGS. 1E and 1F and the semiconductor device 100-2 described with reference to FIGS. 3A and 3B will be described. To the extent that other elements are not described, it may be assumed that these other elements are at least similar to corresponding elements that are described in detail elsewhere within the specification.

Referring to FIGS. 3A and 3B, the second boundary line L2a of the first source or drain layer 131a in contact with the channel 110 is convex extending in the first direction (e.g., the X direction) toward the channel 110, while a first boundary line L1a-2 of the first source or drain layer 131a in contact with the second source or drain layer 132a may be a straight line. Similarly, the fourth boundary line L2b of the fourth source or drain layer 131b in contact with the channel 110 is convex extending in the direction (e.g., the −X direction) opposite to the first direction toward the channel 110, while a third boundary line L1b-2 of the fourth source or drain layer 131b in contact with the fifth source or drain layer 132b may be a straight line. However, the first boundary line L1a-2 and the third boundary line L1b-2 may be either straight or convex extending toward the channel 110. For example, the first boundary line L1a-2 and the third boundary line L1b-2 might not be convex, extending toward the second source or drain layer 132a and the fifth source or drain layer 132b, respectively.

Accordingly, a distance D12 between the second source or drain layer 132a and the fifth source or drain layer 132b in the first horizontal direction (e.g., the X direction) may be constant. For example, the distance between the second source or drain layer 132a and the fifth source or drain layer 132b along the first horizontal line HL1 may be the same as the distance between the second source or drain layer 132a and the fifth source or drain layer 132b along the second horizontal line HL2. A thickness of the first source or drain layer 131a in the first horizontal direction (e.g., the X direction) may have the minimum value tmin along the first horizontal line HL1, and the maximum value tmax along the central horizontal line HLc. For example, the thickness t1 of the first source or drain layer 131a along the first horizontal line HL1 may be less than the thickness t2 of the first source or drain layer 131a along the second horizontal line HL2. The fourth source or drain layer 131b may also have a thickness that changes similarly to that of the first source or drain layer 131a.

In some embodiments of the present disclosure, the first boundary line L1a-2 may lie on the same line as the outer surface 161Sa of the first portion 161a of the first outer spacer layer 160a. Similarly, the third boundary line L1b-2 may lie on the same line as the outer surface 151Sb of the first portion 151b of the second inner spacer layer 150b.

Figure 4A:
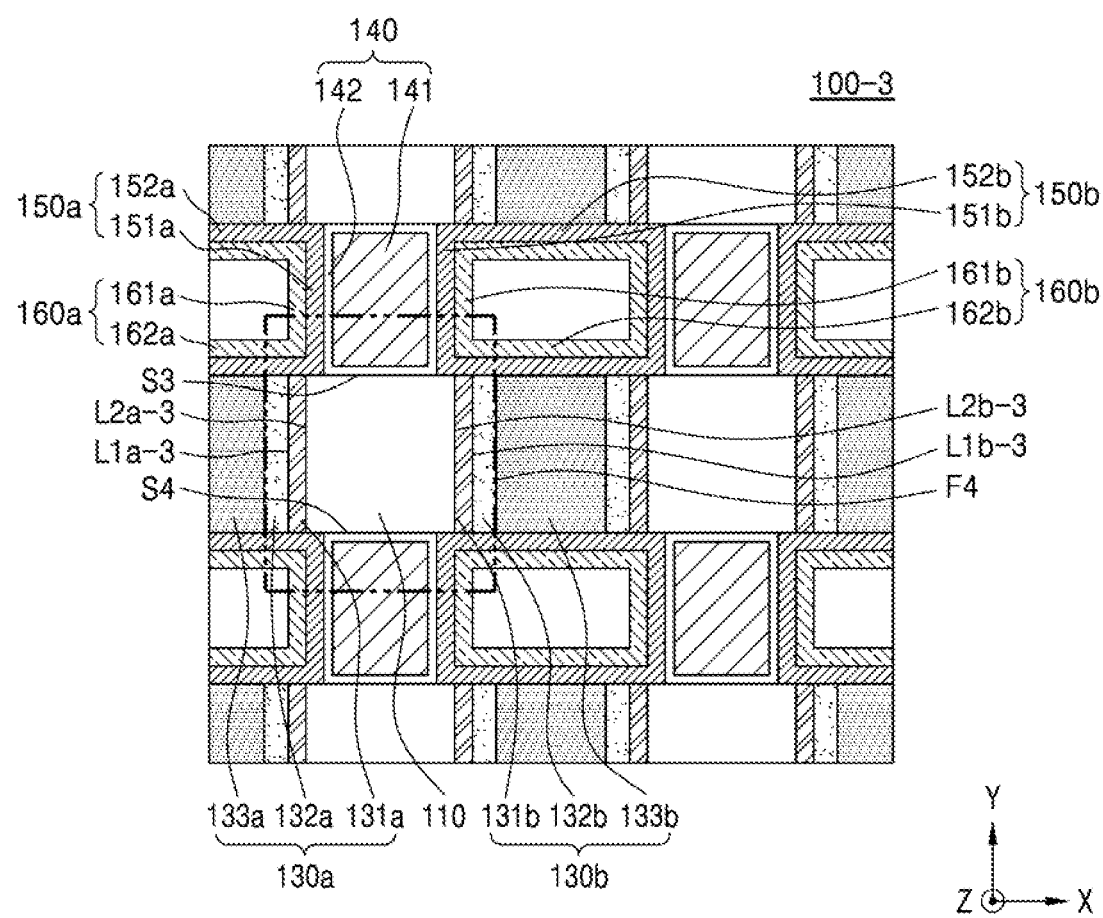
FIG. 4A is a cross-sectional view illustrating a semiconductor device according to an embodiment of the present disclosure.
Figure 4B:
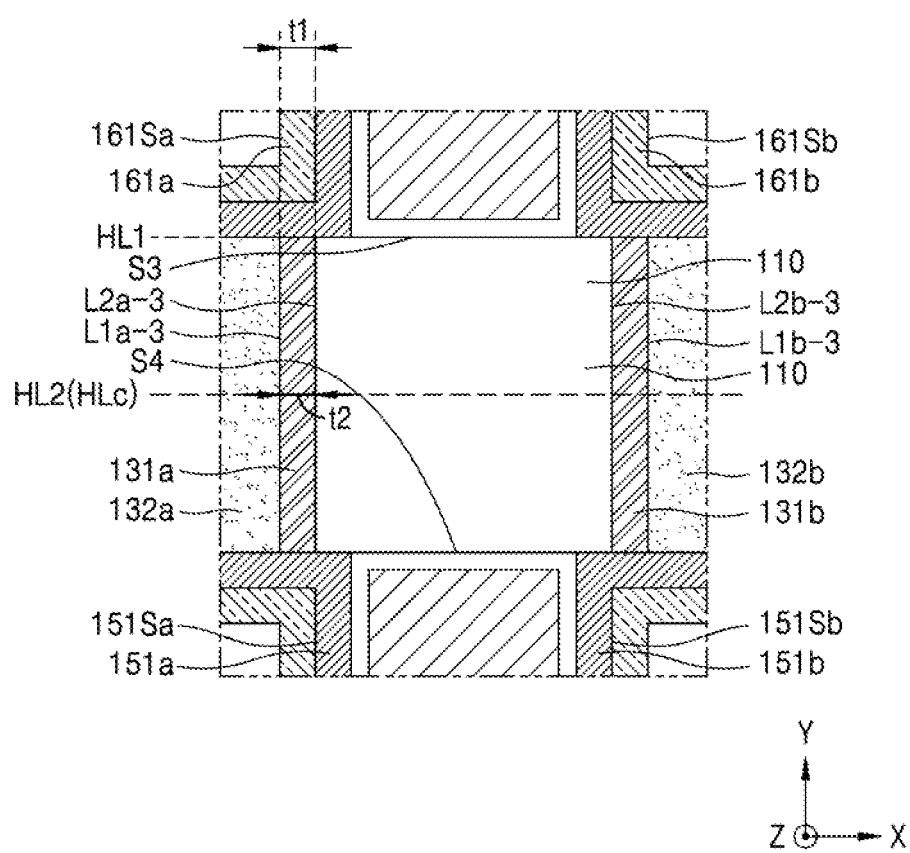
FIG. 4B is an enlarged view illustrating area F4 of FIG. 4A.

FIG. 4A is a cross-sectional view illustrating a semiconductor device 100-3 according to an embodiment of the present disclosure. FIG. 4B is an enlarged view illustrating area F4 of FIG. 4A. Hereinafter, differences between the semiconductor device 100 described with reference to FIGS. 1E and 1F and the semiconductor device 100-3 described with reference to FIGS. 4A and 4B will be described. To the extent that other elements are not described, it may be assumed that these other elements are at least similar to corresponding elements that are described in detail elsewhere within the specification.

Referring to FIGS. 4A and 4B, both a first boundary line L1a-3 of the first source or drain layer 131a in contact with the second source or drain layer 132a and a second boundary line L2a-3 of the first source or drain layer 131a in contact with the channel 110 may be straight lines. Similarly, both a third boundary line L1b-3 of the fourth source or drain layer 131b in contact with the fifth source or drain layer 132b and a fourth boundary line L2b-3 of the fourth source or drain layer 131b in contact with the channel 110 may be straight lines. In addition, a thickness of the first source or drain layer 131a in the first horizontal direction (e.g., the X direction) may be uniform. For example, the thickness t1 of the first source or drain layer 131a along the first horizontal line HL1 may be the same as the thickness t2 of the first source or drain layer 131a along the second horizontal line HL2. The first boundary line L1a-3 and the third boundary line L1b-3 may be either straight or convex extending toward the channel 110.

Figure 5A:
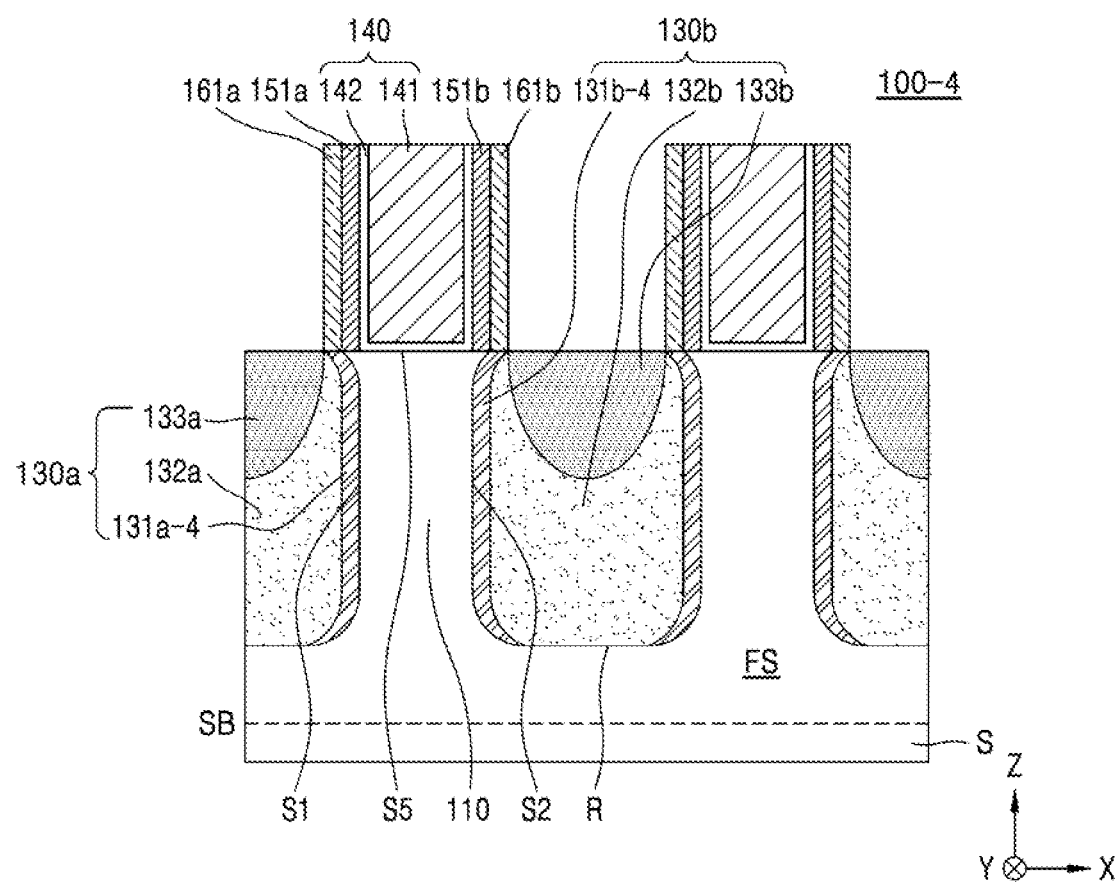
FIGS. 5A and 5B are cross-sectional views illustrating a semiconductor device according to an embodiment of the present disclosure.
Figure 5B:
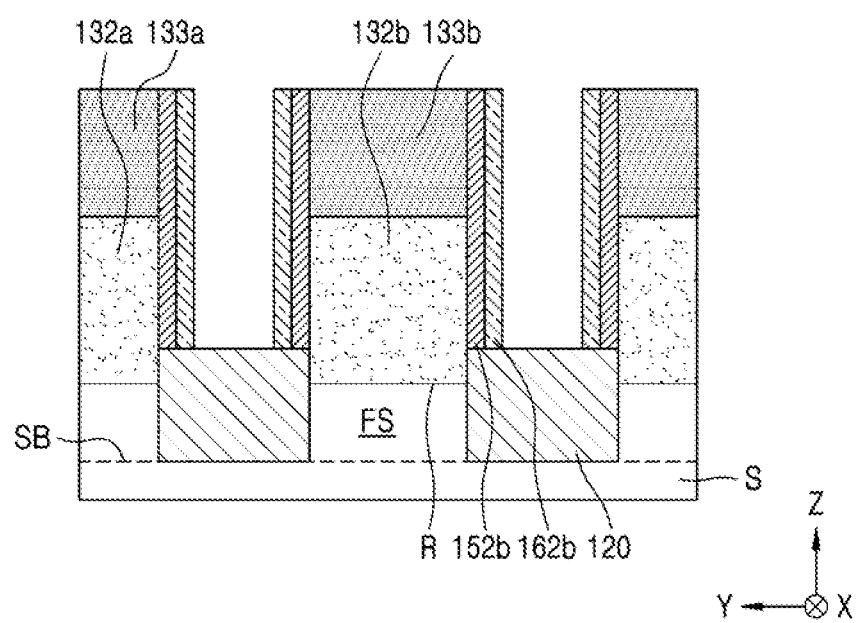

FIGS. 5A and 5B are cross-sectional views illustrating a semiconductor device 100-4 according to an embodiment of the present disclosure. Hereinafter, differences between the semiconductor device 100 described with reference to FIGS. 1E and 1F and the semiconductor device 100-4 described with reference to FIGS. 5A and 5B will be described. To the extent that other elements are not described, it may be assumed that these other elements are at least similar to corresponding elements that are described in detail elsewhere within the specification.

Referring to FIGS. 5A and 5B, a first source or drain layers 131a-4 and a fourth source or drain layers 131b-4 might not cover at least a portion of the bottoms of the recesses R, respectively. Accordingly, the second source or drain layer 132a and the fifth source or drain layer 132b may directly contact the bottoms of the recesses R, respectively. However, the first source or drain layer 131a-4 and the fourth source or drain layer 131b-4 may cover side surfaces of the recesses R, respectively.

Figure 6A:
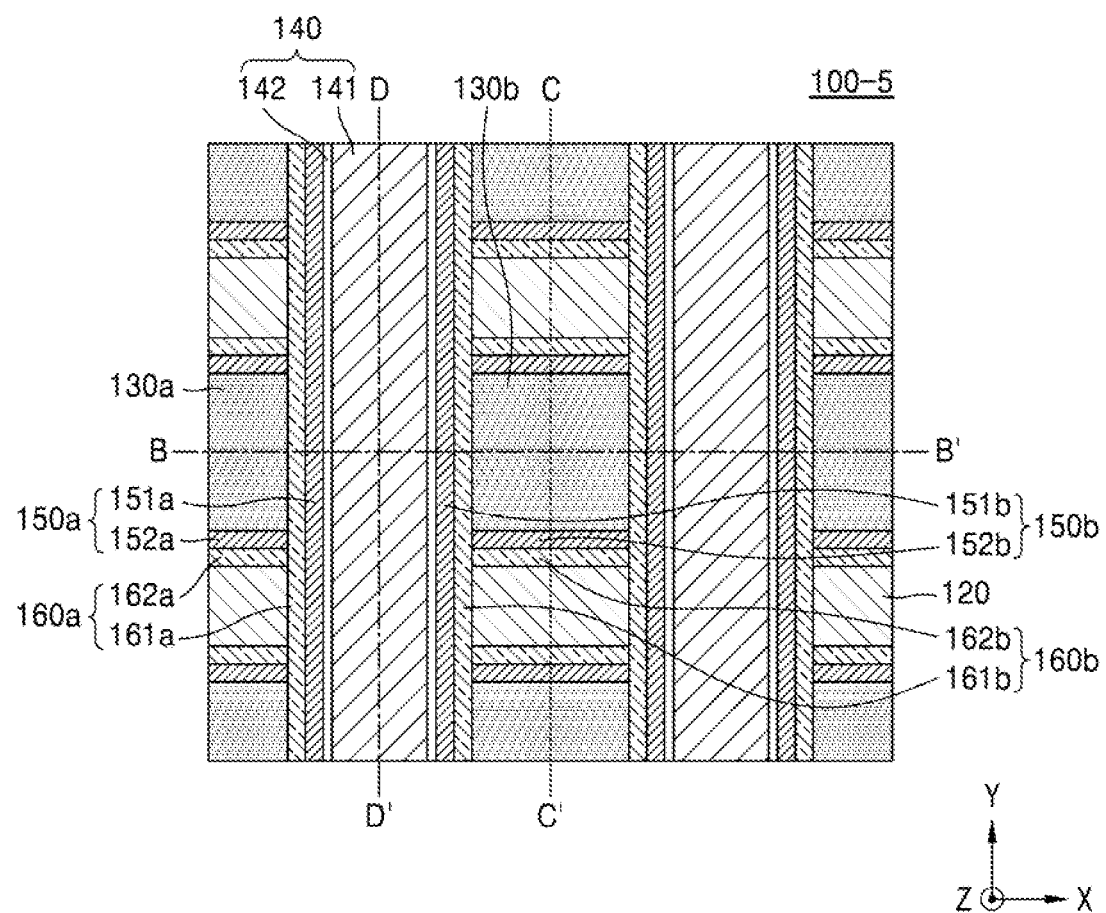
FIG. 6A is a plan view illustrating a semiconductor device according to an embodiment of the present disclosure.
Figure 6B:
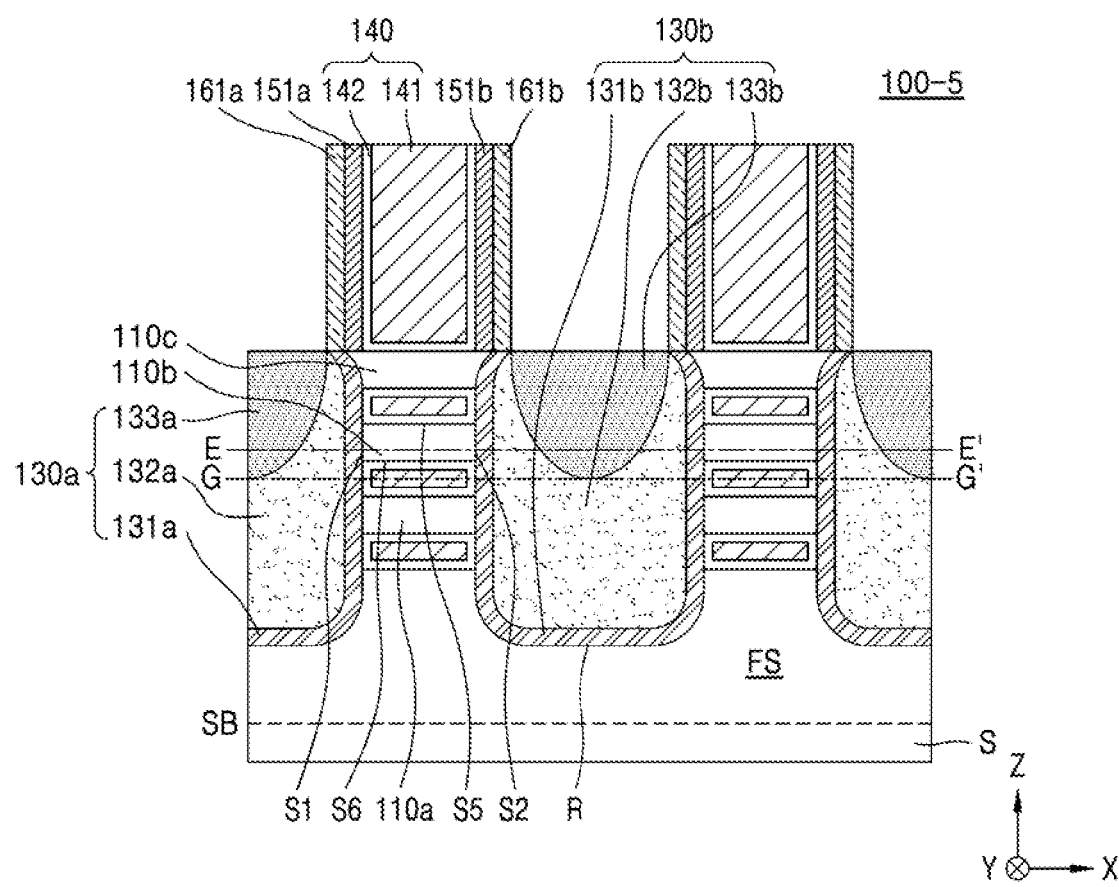
FIG. 6B is a cross-sectional view illustrating the semiconductor device taken along line B-B' of FIG. 6A.
Figure 6C:
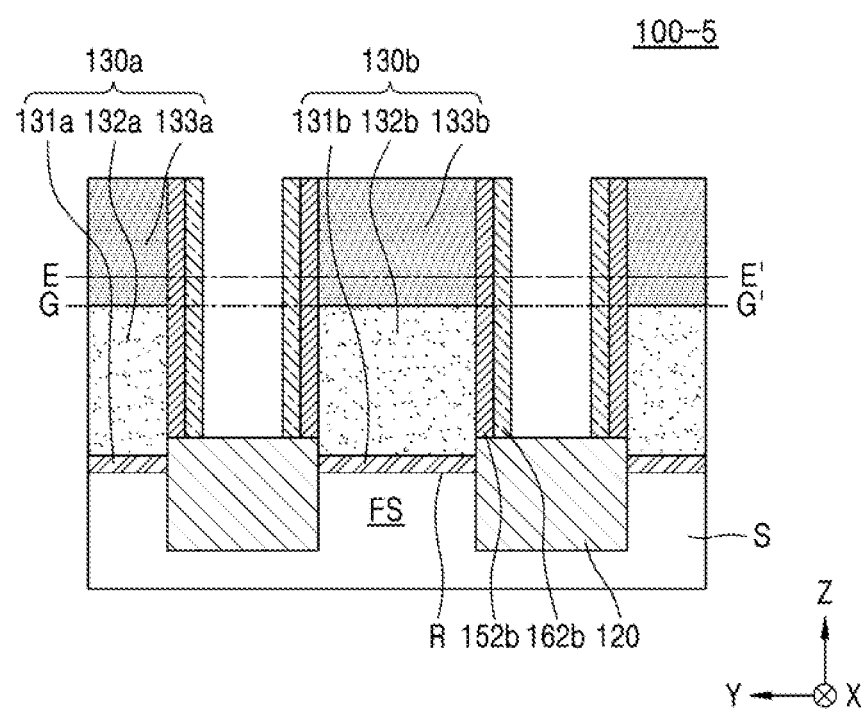
FIG. 6C is a cross-sectional view illustrating the semiconductor device taken along line C-C' of FIG. 6A.
Figure 6D:
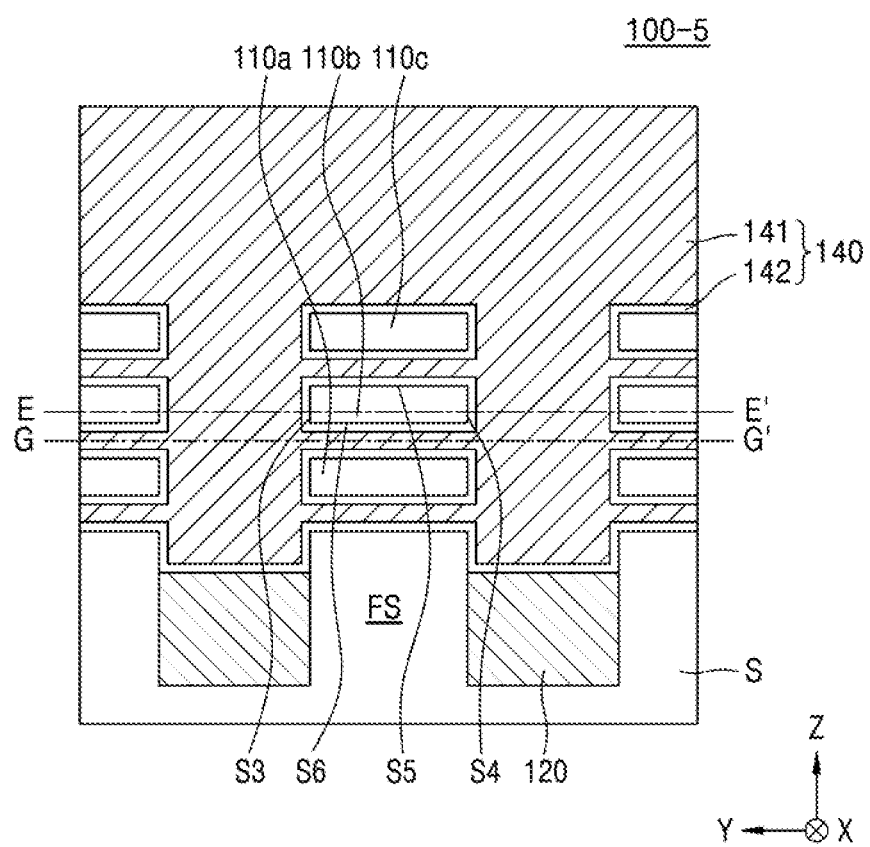
FIG. 6D is a cross-sectional view illustrating the semiconductor device taken along line D-D' of FIG. 6A.
Figure 6E:
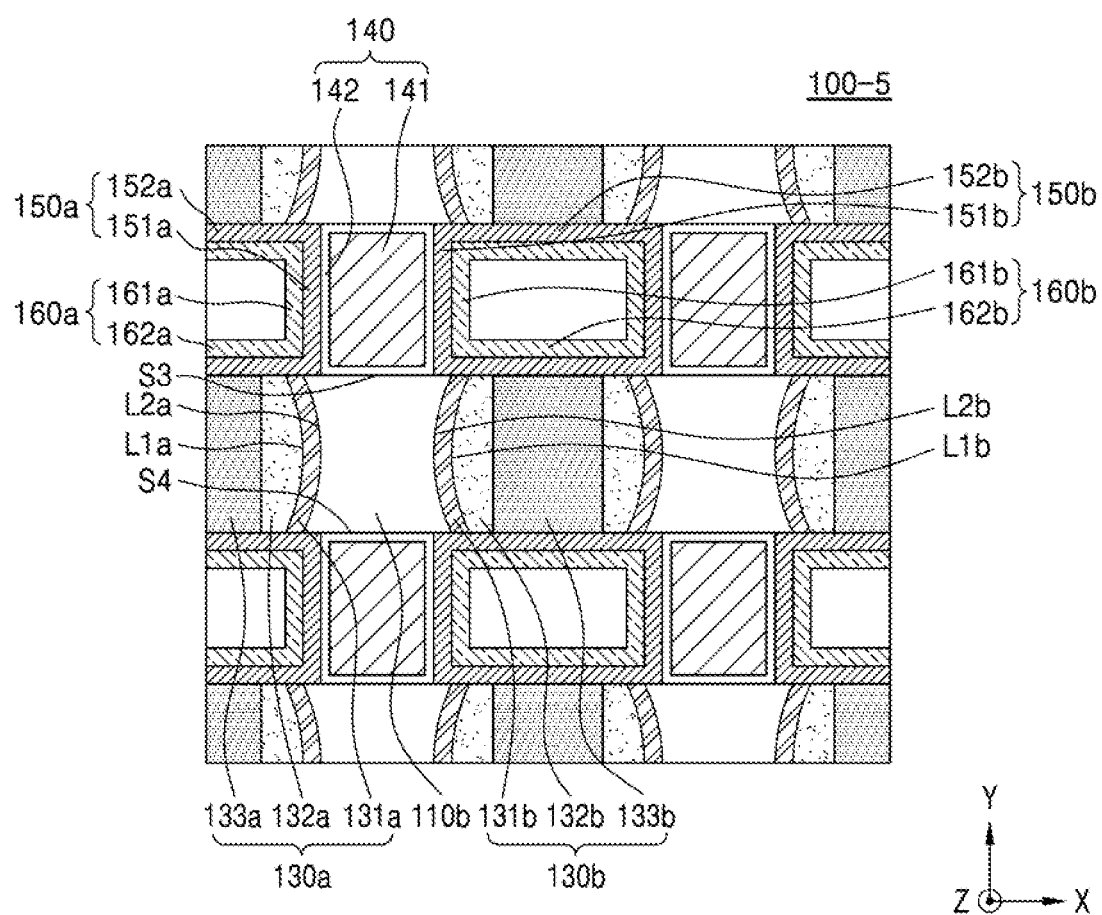
FIG. 6E is a cross-sectional view illustrating the semiconductor device taken along line E-E' of FIGS. 6B to 6D.
Figure 6F:
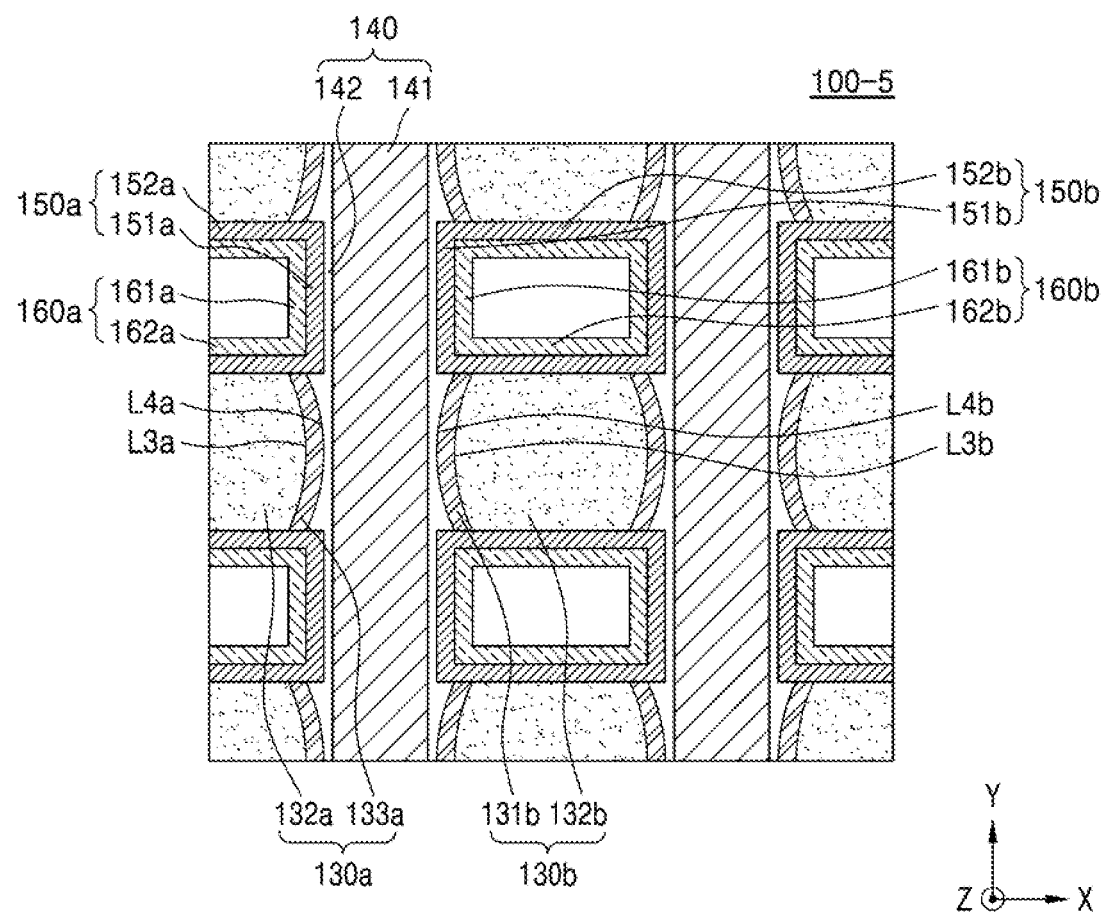
FIG. 6F is a cross-sectional view illustrating the semiconductor device taken along line G-G' of FIGS. 6B to 6D.

FIG. 6A is a plan view illustrating a semiconductor device 100-5 according to an embodiment of the present disclosure. FIG. 6B is a cross-sectional view illustrating the semiconductor device 100-5 taken along line B-B' of FIG. 6A. FIG. 6C is a cross-sectional view illustrating the semiconductor device 100-5 taken along line C-C' of FIG. 6A. FIG. 6D is a cross-sectional view illustrating the semiconductor device 100-5 taken along line D-D' of FIG. 6A. FIG. 6E is a cross-sectional view illustrating the semiconductor device 100-5 taken along line E-E' of FIGS. 6B to 6D. FIG. 6F is a cross-sectional view illustrating the semiconductor device 100-5 taken along line G-G' of FIGS. 6B to 6D. Hereinafter, differences between the semiconductor device 100 described with reference to FIGS. 1E and 1F and the semiconductor device 100-5 described with reference to FIGS. 6A to 6F will be described. To the extent that other elements are not described, it may be assumed that these other elements are at least similar to corresponding elements that are described in detail elsewhere within the specification.

Referring to FIGS. 6A to 6F, the fin structure FS may include a plurality of channels 110a to 110c apart from each other in a vertical direction (e.g., a Z direction). Although three channels 110a to 110c are illustrated in FIGS. 6B and 6D, the number of channels spaced apart in the vertical direction (e.g., the Z direction) may be more or less than 3. The first source or drain structure 130a may contact the first side surface S1 of each of the channels 110a to 110c. The second source or drain structure 130b may contact the second side surface S2 of each of the channels 110a to 110c.

The gate structure 140 may surround the upper surface S5 of each of the channels 110a to 110c, a lower surface S6 of each of the channels 110a to 110c, the third side surface S3 of each of the channels 110a to 110c, and the fourth side surface S4 of each of the channels 110a to 110c. For example, the semiconductor device 100-5 may be a gate-all-around field effect transistor (FET) or a nanosheet FET. The gate structure 140 may fill spaces between the channels 110a to 110c.

FIG. 6F is a cross-sectional view illustrating the semiconductor device 100-5 that passes through a portion of the gate electrode layer 141 between the first channel 110a and the second channel 110b adjacent to each other and is perpendicular to the vertical direction (e.g., the Z direction). Referring to FIG. 6F, the first source or drain layer 131a may have a fifth boundary line L3a in contact with the second source or drain layer 132a and a sixth boundary line L4a in contact with the gate insulating layer 142. The fourth source or drain layer 131b may have a seventh boundary line L3b in contact with the fifth source or drain layer 132b and an eighth boundary line L4b in contact with the gate insulating layer 142. The fifth boundary line L3a and the sixth boundary line L4a may be convex, extending toward the gate insulating layer 142 in the first horizontal direction (e.g., the X direction). The seventh boundary line L3b and the eighth boundary line L4b may be convex, extending toward the gate insulating layer 142 in the direction (e.g., the −X direction) opposite to the first horizontal direction. In addition, each of the first source or drain layer 131a and the fourth source or drain layer 131b may have a constant thickness in the first horizontal direction (e.g., the X direction).

However, similar to the description given with reference to FIGS. 2A to 4B, some of the fifth to eighth boundary lines L3a, L4a, L3b, and L4b may be straight or convex, extending toward the gate insulating layer 142. In addition, the fifth boundary line L3a and the seventh boundary line L3b may be either straight or convex extending toward the gate insulating layer 142. In addition, similar to the description given with reference to FIGS. 2A to 3B, a thickness of each of the first source or drain layer 131a and the fourth source or drain layer 131b in the first horizontal direction (e.g., the X direction) might not be constant.

Figure 7A:
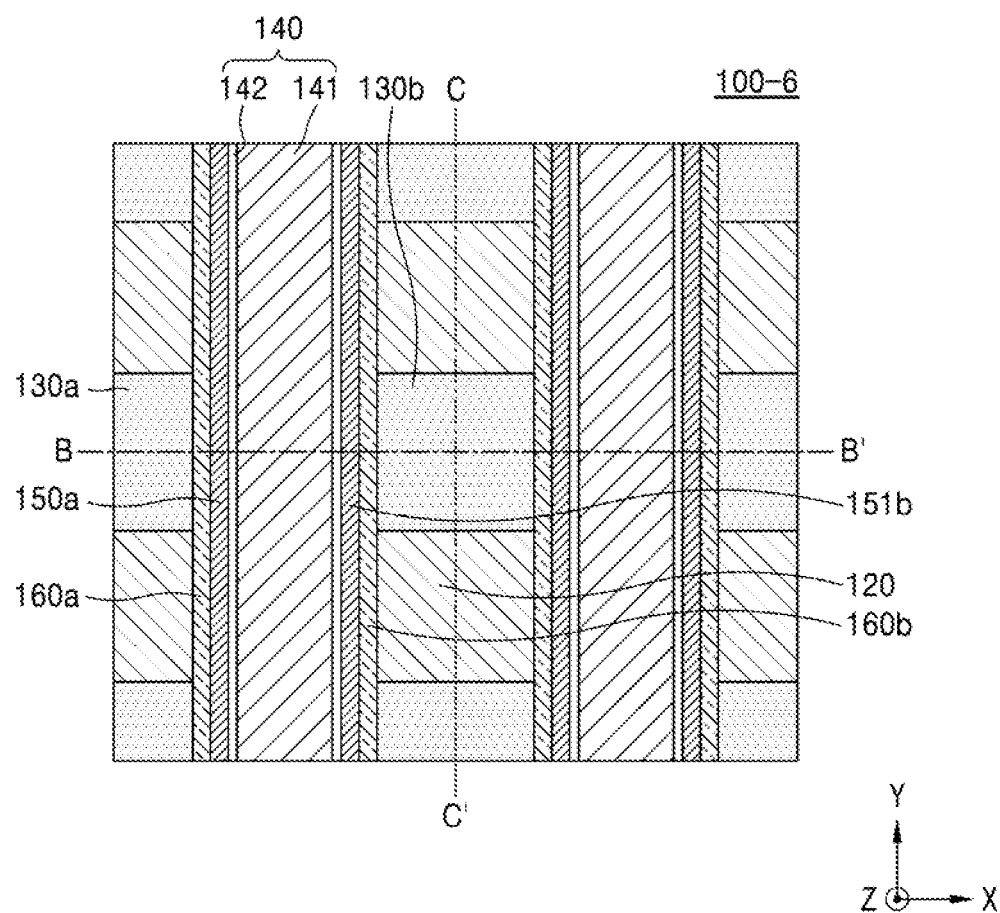
FIG. 7A is a plan view illustrating a semiconductor device according to an embodiment of the present disclosure.
Figure 7B:
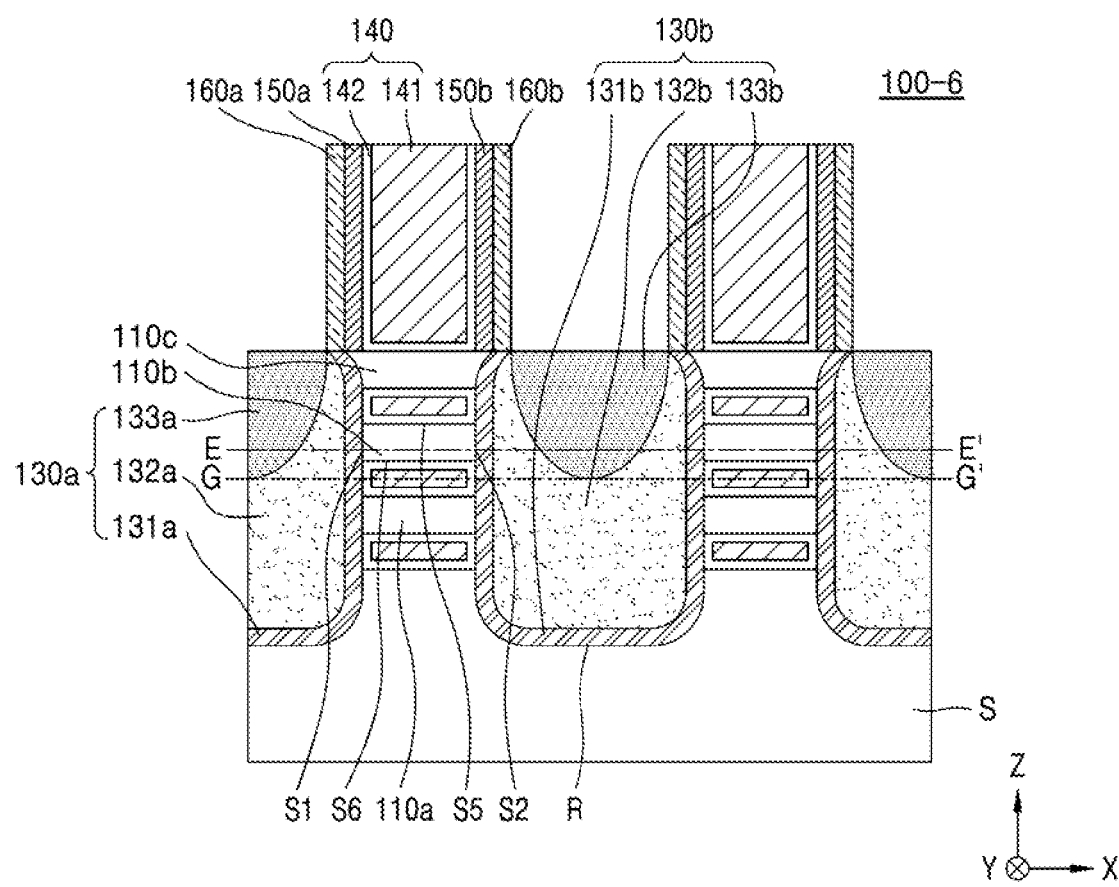
FIG. 7B is a cross-sectional view illustrating the semiconductor device taken along line B-B' of FIG. 7A.
Figure 7C:
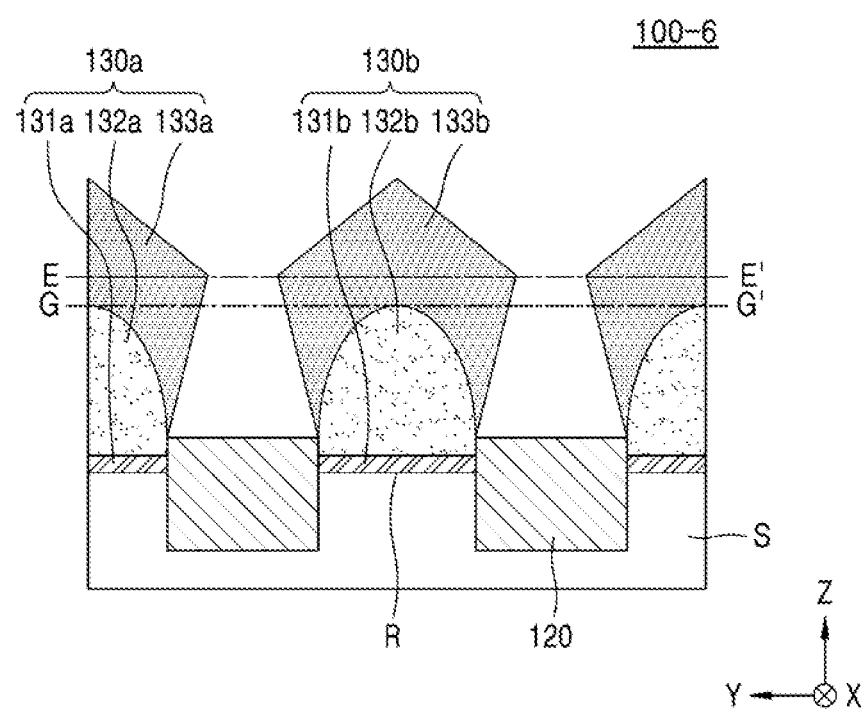
FIG. 7C is a cross-sectional view illustrating the semiconductor device taken along line C-C' of FIG. 7A.
Figure 7D:
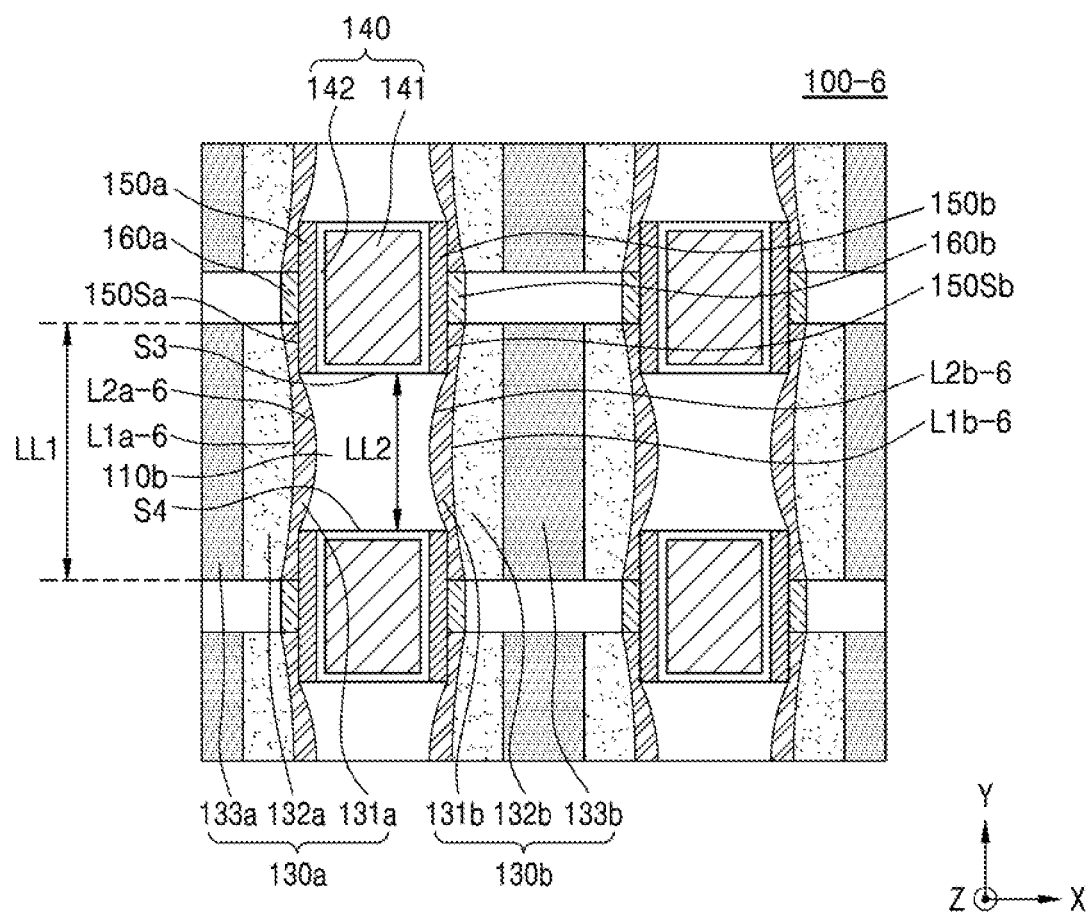
FIG. 7D is a cross-sectional view illustrating the semiconductor device taken along line E-E' of FIGS. 7B and 7C.
Figure 7E:
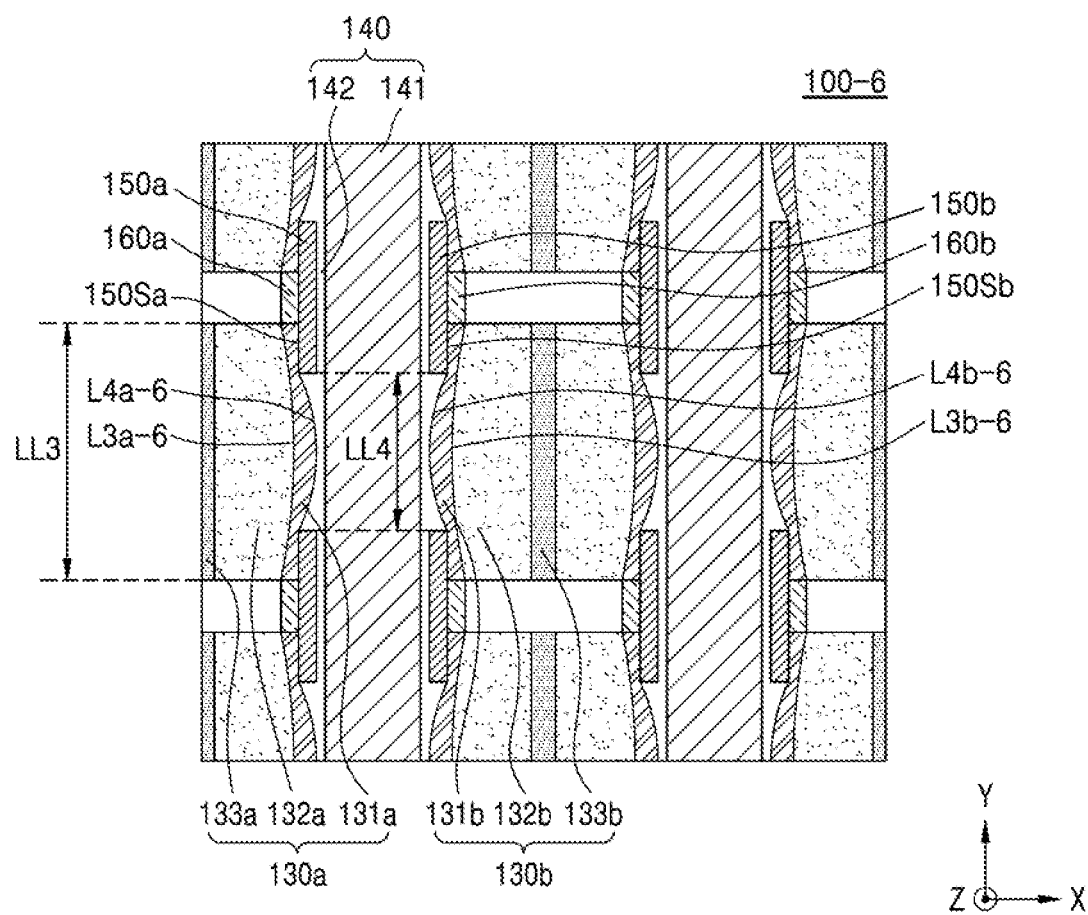
FIG. 7E is a cross-sectional view illustrating the semiconductor device taken along line G-G' of FIGS. 7B and 7C.

FIG. 7A is a plan view illustrating a semiconductor device 100-6 according to an embodiment of the present disclosure. FIG. 7B is a cross-sectional view illustrating the semiconductor device 100-6 taken along line B-B' of FIG. 7A. FIG. 7C is a cross-sectional view illustrating the semiconductor device 100-6 taken along line C-C' of FIG. 7A. FIG. 7D is a cross-sectional view illustrating the semiconductor device 100-6 taken along line E-E' of FIGS. 7B and 7C. FIG. 7E is a cross-sectional view illustrating the semiconductor device 100-6 taken along line G-G' of FIGS. 7B and 7C. Hereinafter, differences between the semiconductor device 100 described with reference to FIGS. 6A to 6F and the semiconductor device 100-6 described with reference to FIGS. 7A to 7E will be described. To the extent that other elements are not described, it may be assumed that these other elements are at least similar to corresponding elements that are described in detail elsewhere within the specification.

Referring to FIGS. 7A to 7E, the first inner spacer layer 150a might not include the second portion 152a (see FIGS. 6A to 6F) on a side surface of the first source or drain structure 130a. Similarly, the second inner spacer layer 150b might not include the second portion 152b (see FIGS. 6A to 6F) on the opposite side surface of the second source or drain structure 130b.

FIG. 7D shows a cross-section of the semiconductor device 100 that passes through the channel 110 and is parallel to the first horizontal direction (e.g., the X direction) and the second horizontal direction (e.g., the −Y direction).

Referring to FIG. 7D, a length LL1 of a first boundary line L1a-6 of the first source or drain layer 131a in contact with the second source or drain layer 132a in the second horizontal direction (e.g., the −Y direction) may be greater than a length LL2 of a second boundary line L2a-6 of the first source or drain layer 131a in contact with the channel 110 in the second horizontal direction (e.g., the −Y direction). Similarly, a length of a third boundary line L1b-6 of the fourth source or drain layer 131b in contact with the fifth source or drain layer 132b in the second horizontal direction (e.g., the −Y direction) may be greater than a length of a fourth boundary line L2b-6 of the fourth source or drain layer 131b in contact with the channel 110 in the second horizontal direction (e.g., the −Y direction).

In some embodiments of the present disclosure, the first source or drain layer 131a and the fourth source or drain layer 131b may contact an outer surface 150Sa of the first inner spacer layer 150a and an outer surface 150Sb of the second inner spacer layer 150b, respectively. In addition, the first source or drain layer 131a and the fourth source or drain layer 131b may contact the first outer spacer layer 160a and the second outer spacer layer 160b, respectively. The second source or drain layer 132a may be spaced apart from the first inner spacer layer 150a by the first source or drain layer 131a. The fifth source or drain layer 132b may be spaced apart from the second inner spacer layer 150b by the fourth source or drain layer 131b. Unlike what is shown in FIG. 7D, the second source or drain layer 132a may contact the first outer spacer layer 160a, and the fifth source or drain layer 132b may contact the second outer spacer layer 160b.

FIG. 7E is a cross-sectional view illustrating the semiconductor device 100-6 that passes through a portion of the gate electrode layer 141 between the first channel 110a and the second channel 110b adjacent to each other and is perpendicular to the vertical direction (e.g., the Z direction). Referring to FIG. 7E, a length LL3 of a fifth boundary line L3a-6 of the first source or drain layer 131a in contact with the second source or drain layer 132a in the second horizontal direction (e.g., the −Y direction) may be greater than a length LL4 of a sixth boundary line L4a-6 of the first source or drain layer 131a in contact with the gate insulating layer 142 in the second horizontal direction (e.g., the −Y direction). Similarly, a length of a seventh boundary line L3b-6 of the fourth source or drain layer 131b in contact with the fifth source or drain layer 132b in the second horizontal direction (e.g., the −Y direction) may be greater than a length of an eighth boundary line L4b-6 of the fourth source or drain layer 131b in contact with the gate insulating layer 142 in the second horizontal direction (e.g., the −Y direction).

Similar to the description given with reference to FIGS. 2A to 4B, each of the fifth to eighth boundary lines L1a-6, L4a-6, L3b-6, and L4b-6 the fifth to eighth boundary lines L3a, L4a, L3b, and L4b may be straight or convex, extending toward the gate insulating layer 142.

Figure 8:
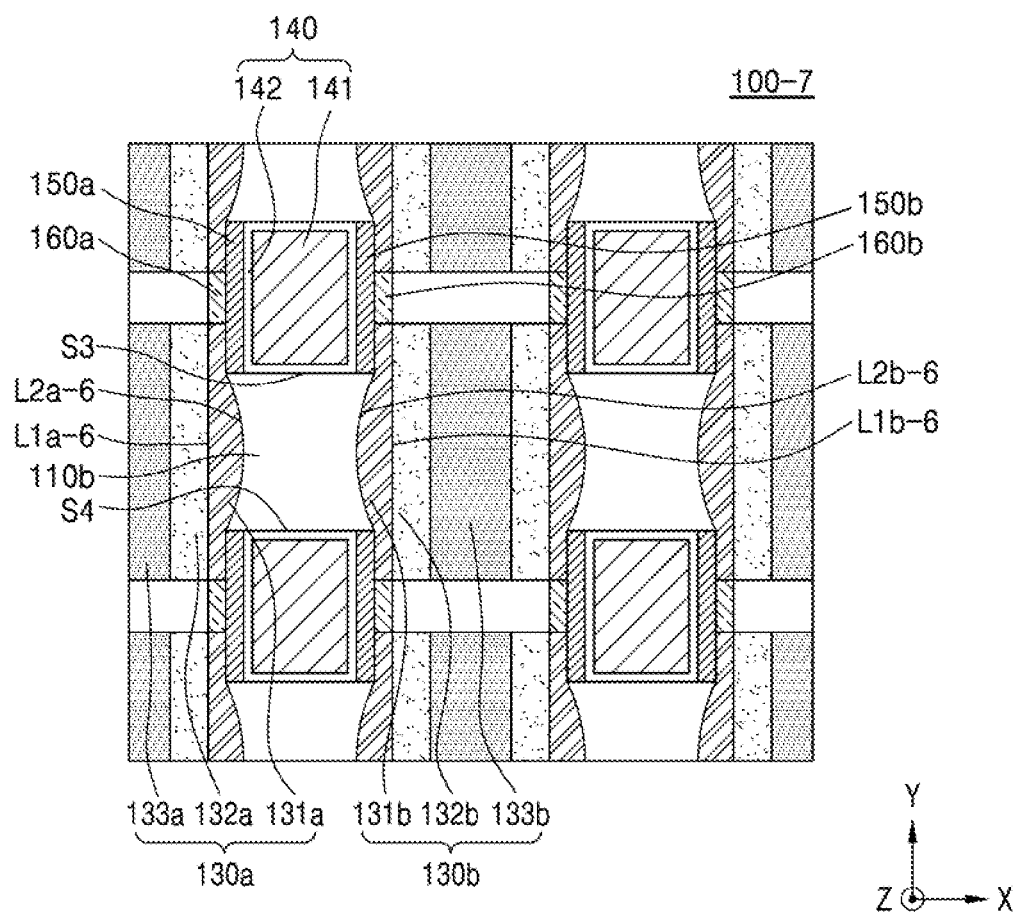
FIGS. 8 to 10 are cross-sectional views illustrating semiconductor devices according to embodiments of the present disclosure.
Figure 9:
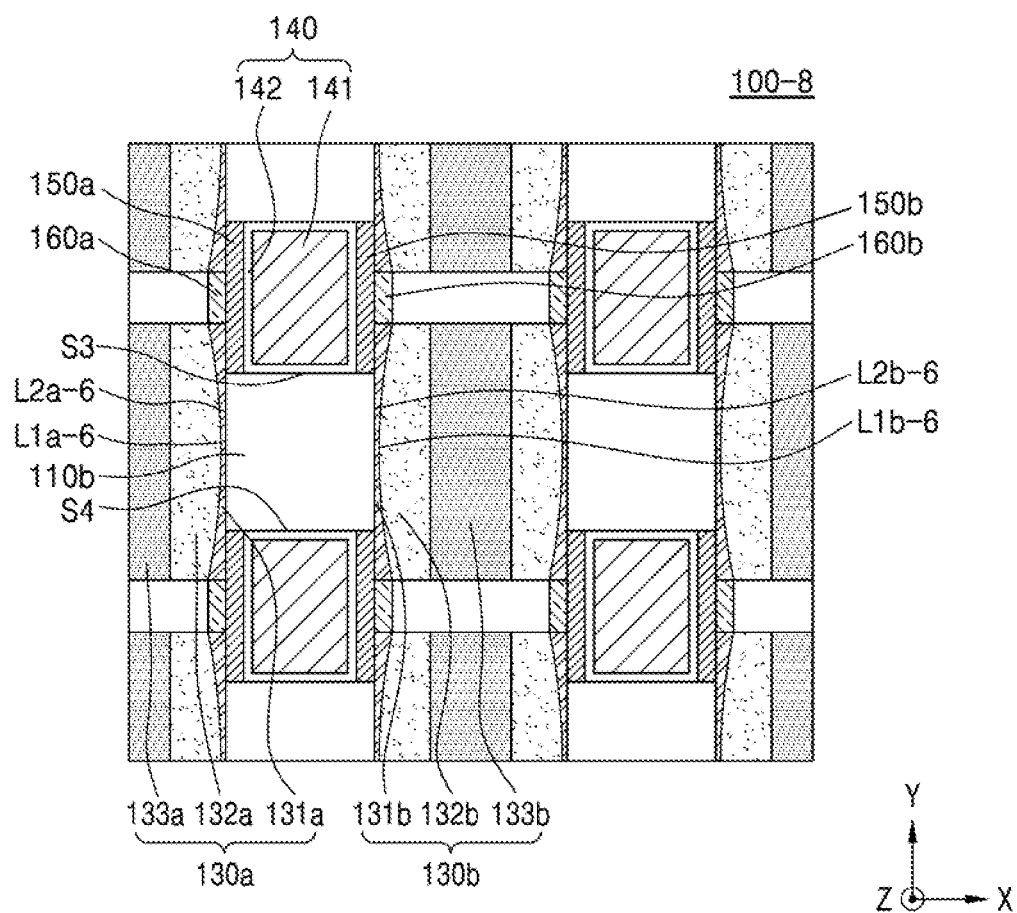
Figure 10:
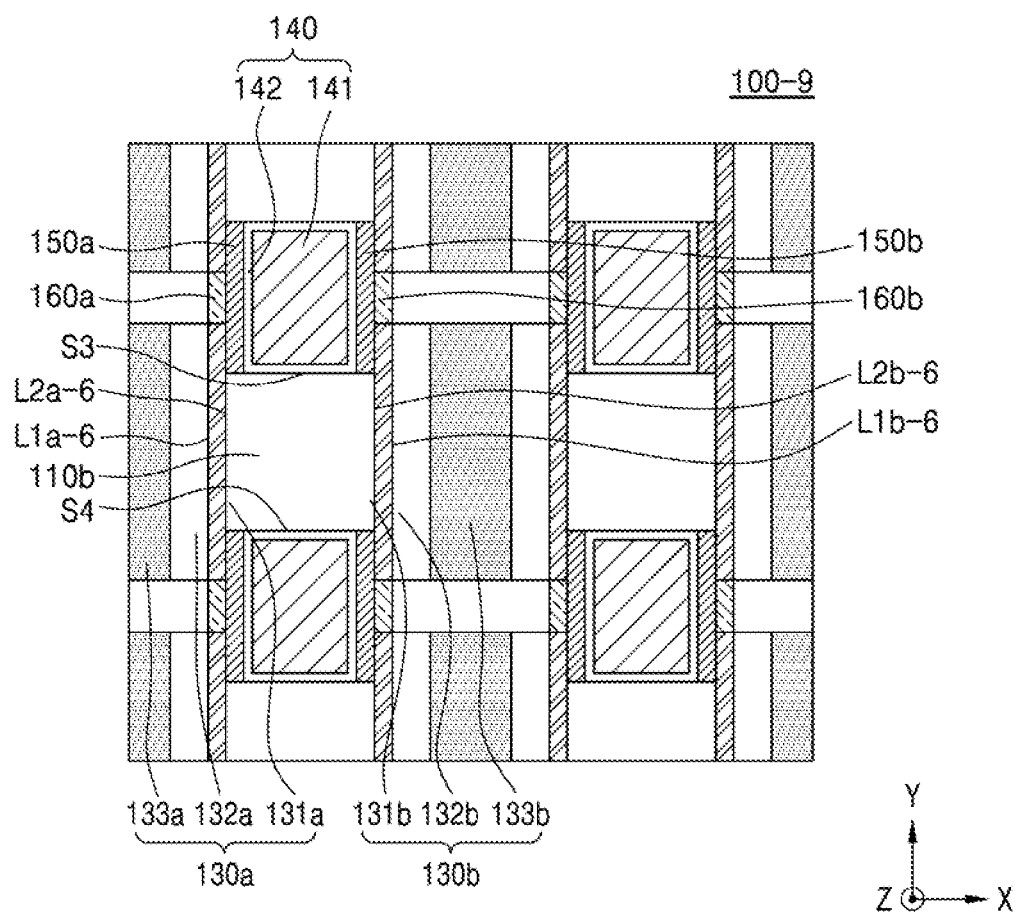

FIGS. 8 to 10 are cross-sectional views illustrating semiconductor devices 100-7, 100-8, and 100-9 according to embodiments of the present disclosure. Hereinafter, differences between the semiconductor device 100-6 described with reference to FIG. 7D and the semiconductor devices 100-7, 100-8, and 100-9 described with reference to FIGS. 8 to 10 will be described. To the extent that other elements are not described, it may be assumed that these other elements are at least similar to corresponding elements that are described in detail elsewhere within the specification.

Referring to FIGS. 8 to 10, as described with reference to FIGS. 2A to 4B, each of the first to fourth boundary lines L1a-6, L2a-6, L1b-6, and L2b-6 may be straight or convex, extending toward the gate insulating layer 142.

Figure 11A:
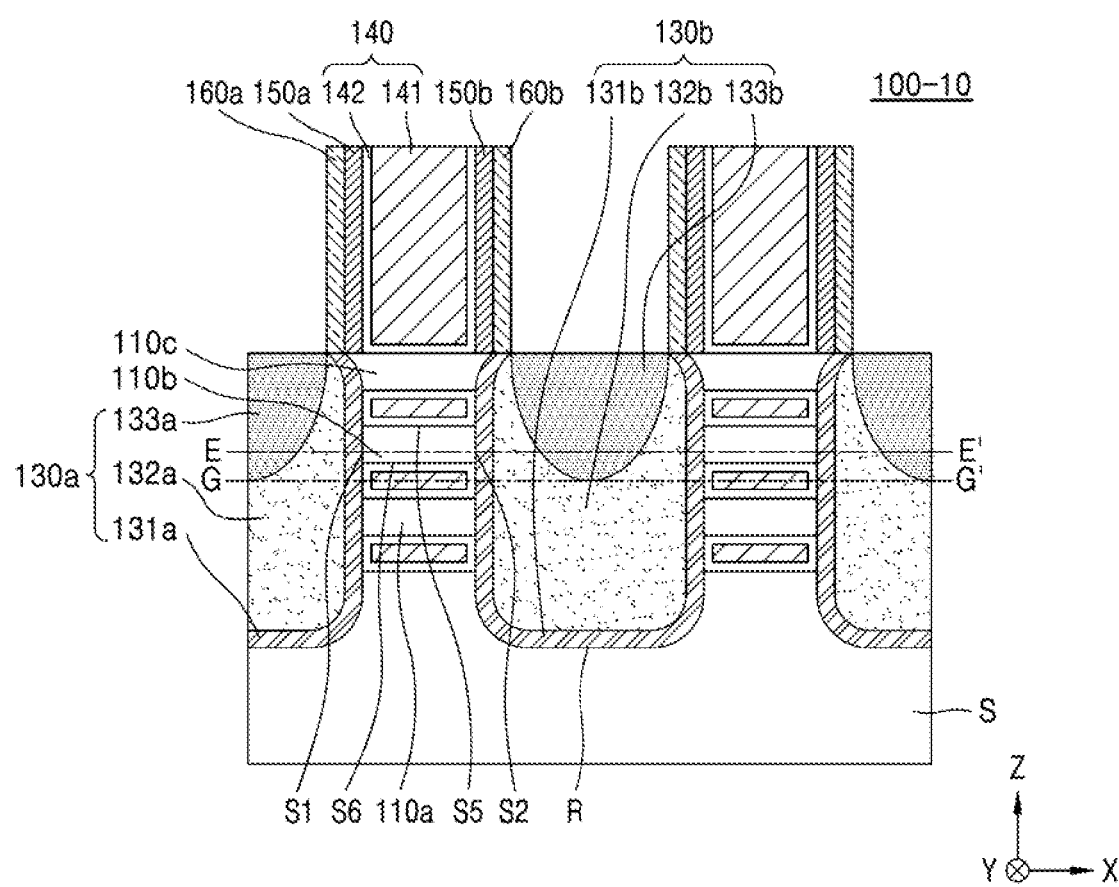
FIG. 11A is a cross-sectional view illustrating a semiconductor device according to an embodiment of the present disclosure.
Figure 11B:
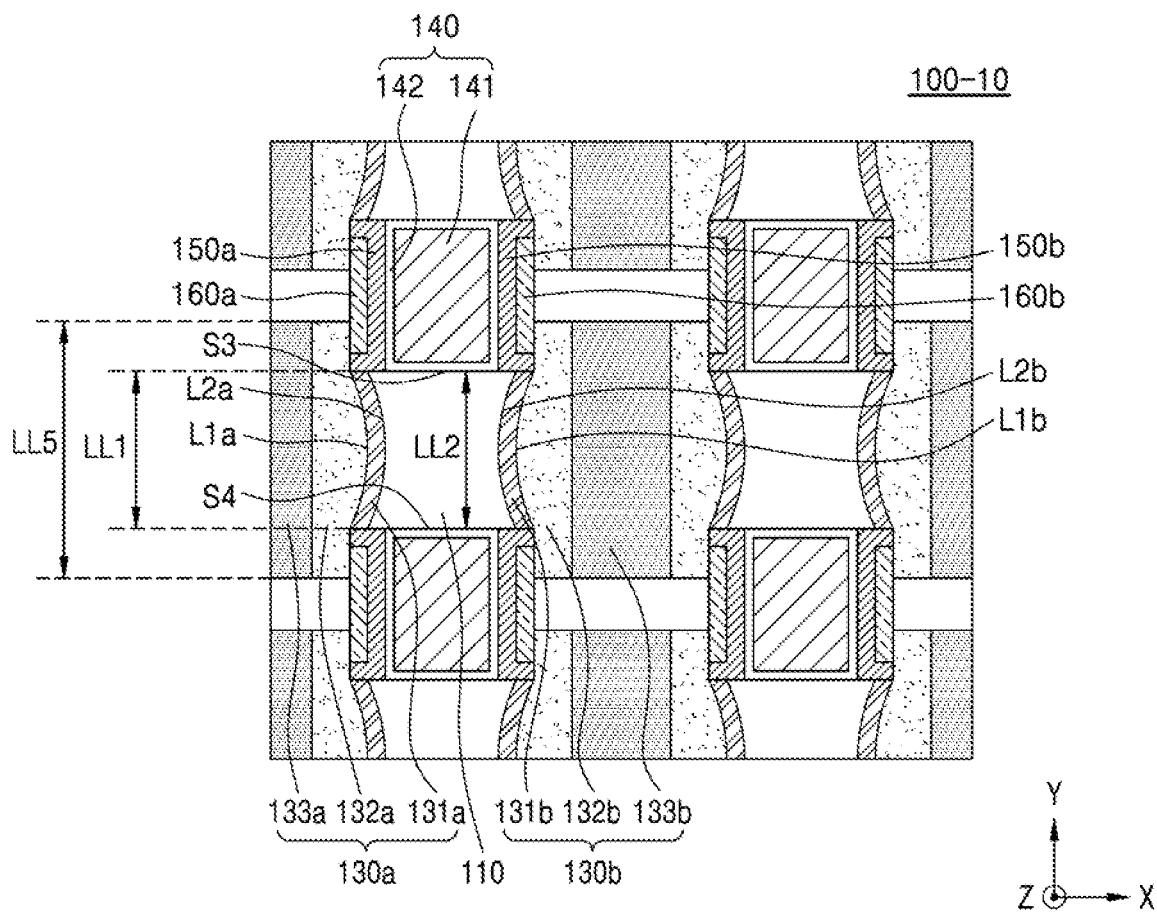
FIG. 11B is a cross-sectional view illustrating the semiconductor device taken along line E-E' of FIG. 11A.
Figure 11C:
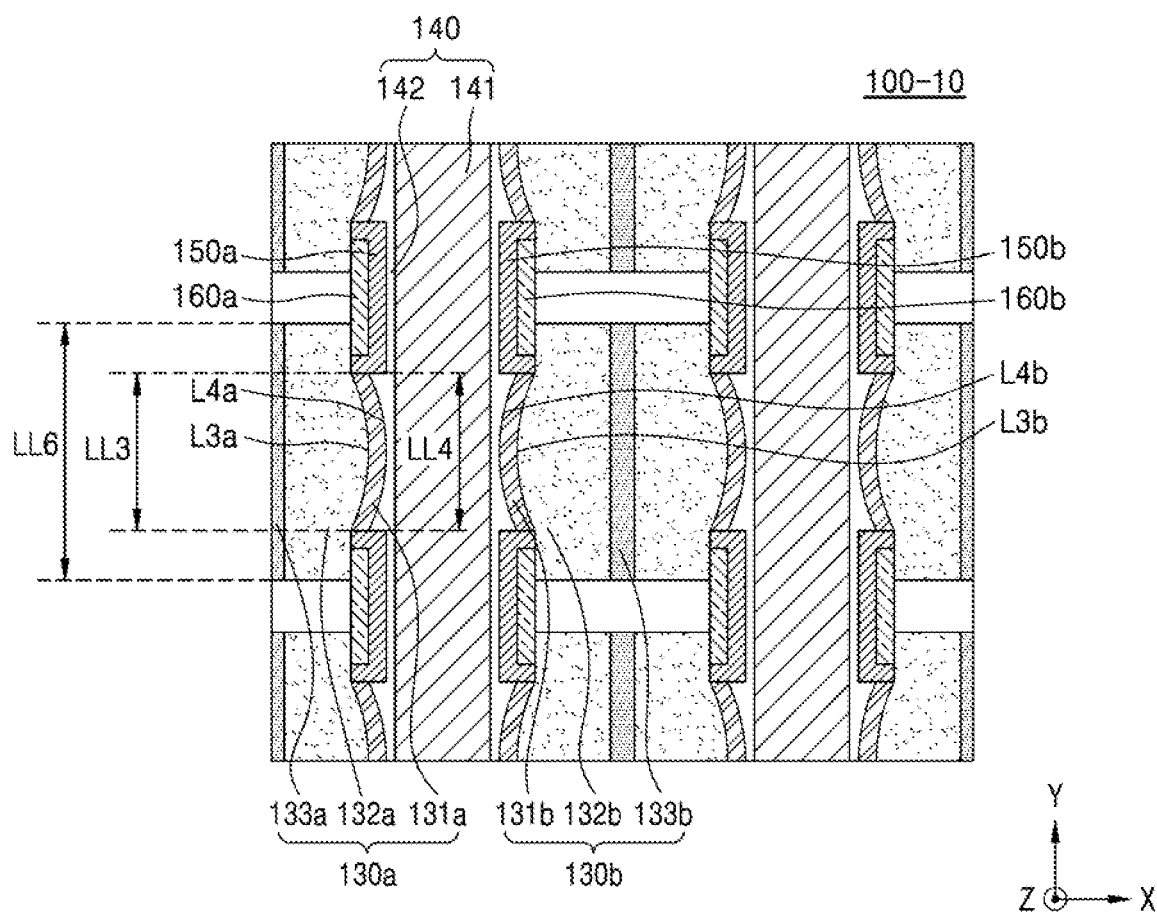
FIG. 11C is a cross-sectional view illustrating the semiconductor device taken along line G-G' of FIG. 11A.

FIG. 11A is a cross-sectional view illustrating a semiconductor device 100-10 according to an embodiment of the present disclosure. FIG. 11B is a cross-sectional view illustrating the semiconductor device 100-10 taken along line E-E' of FIG. 11A. FIG. 11C is a cross-sectional view illustrating the semiconductor device 100-10 taken along line G-G' of FIG. 11A. Hereinafter, differences between the semiconductor device 100-6 described with reference to FIGS. 7A to 7D and the semiconductor device 100-10 described with reference to FIGS. 11A to 11C will be described. To the extent that other elements are not described, it may be assumed that these other elements are at least similar to corresponding elements that are described in detail elsewhere within the specification.

Referring to FIGS. 11A and 11B, the length LL1 of the first boundary line L1a in the second horizontal direction (e.g., the −Y direction) may be the same as the length LL2 of the second boundary line L2a in the second horizontal direction (e.g., the −Y direction). However, a length LL5 of the second source or drain layer 132a in the second horizontal direction (e.g., the −Y direction) may be greater than the length LL1 of the first boundary line L1a in the second horizontal direction (e.g., the −Y direction) and the length LL2 of the second boundary line L2a in the second horizontal direction (e.g., the −Y direction). Similarly, the length of the third boundary line L1b in the second horizontal direction (e.g., the −Y direction) may be the same as the length of the fourth boundary line L2b in the second horizontal direction (e.g., the −Y direction). However, the length of the fifth source or drain layer 132b in the second horizontal direction (e.g., the −Y direction) may be greater than the length of the third boundary line L1b in the second horizontal direction (e.g., the −Y direction) and the length of the fourth boundary line L2b in the second horizontal direction (e.g., the −Y direction).

The first source or drain layer 131a contacts the first inner spacer layer 150a and may be spaced apart from the first outer spacer layer 160a by the first inner spacer layer 150a. Similarly, the fourth source or drain layer 131b may contact the second inner spacer layer 150b and may be spaced apart from the second outer spacer layer 160b by the second inner spacer layer 150b. The second source or drain layer 132a may contact the first inner spacer layer 150a and the first outer spacer layer 160a. The fifth source or drain layer 132b may contact the second inner spacer layer 150b and the second outer spacer layer 160b.

Referring to FIGS. 11A and 11B, the length LL3 of the fifth boundary line L3a in the second horizontal direction (e.g., the −Y direction) may be the same as the length LL4 of the sixth boundary line L4a in the second horizontal direction (e.g., the −Y direction). However, a length LL6 of the second source or drain layer 132a in the second horizontal direction (e.g., the −Y direction) may be greater than the length LL3 of the fifth boundary line L3a in the second horizontal direction (e.g., the −Y direction) and the length LL4 of the sixth boundary line L4a in the second horizontal direction (e.g., the −Y direction). Similarly, the length of the seventh boundary line L3b in the second horizontal direction (e.g., the −Y direction) may be the same as the length of the eighth boundary line L4b in the second horizontal direction (e.g., the −Y direction). However, the length of the fifth source or drain layer 132b in the second horizontal direction (e.g., the −Y direction) may be greater than the length of the seventh boundary line L3b in the second horizontal direction (e.g., the −Y direction) and the length of the eighth boundary line L4b in the second horizontal direction (e.g., the −Y direction).

FIGS. 12A to 20A are plan views illustrating a method of manufacturing a semiconductor device, according to an embodiment of the present disclosure. FIGS. 12B to 20B are cross-sectional views illustrating the semiconductor device taken along line B-B' of FIGS. 12A to 20A, respectively. FIGS. 12C to 20C are cross-sectional views illustrating the semiconductor device taken along line C-C' of FIGS. 12A to 20A, respectively. FIGS. 15D to 20D are cross-sectional views illustrating the semiconductor device taken along line E-E' of FIGS. 15B to 20B and 15C to 20C, respectively. FIG. 16E is an enlarged view illustrating area F16 of FIG. 16D.

Figure 12A:
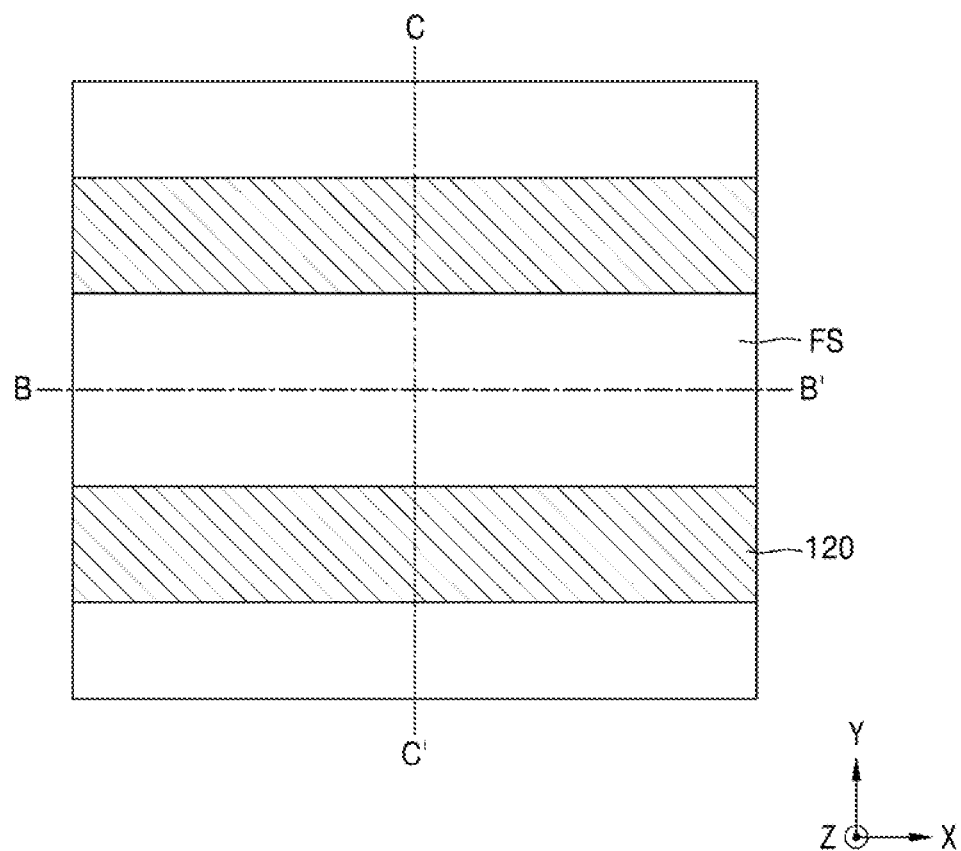
Figure 12B:
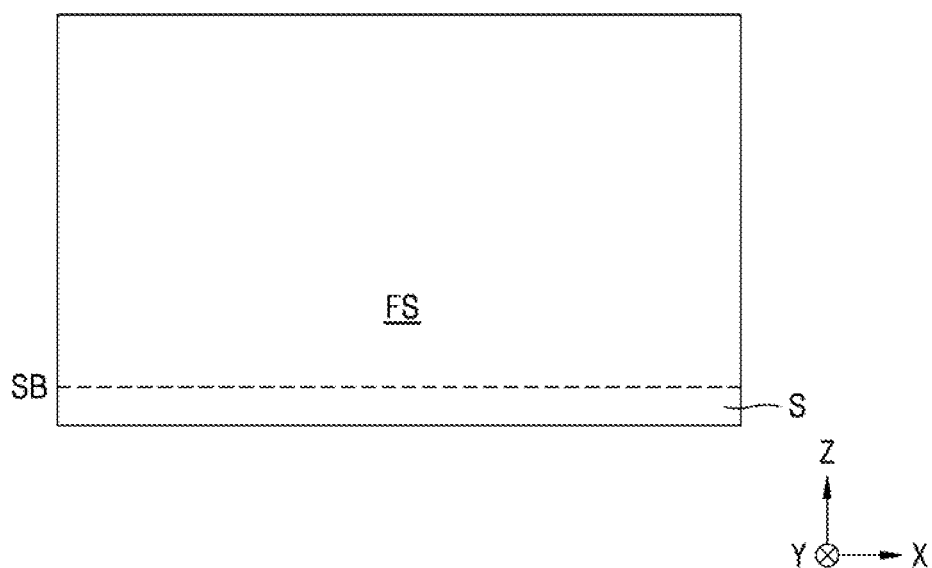
Figure 12C:
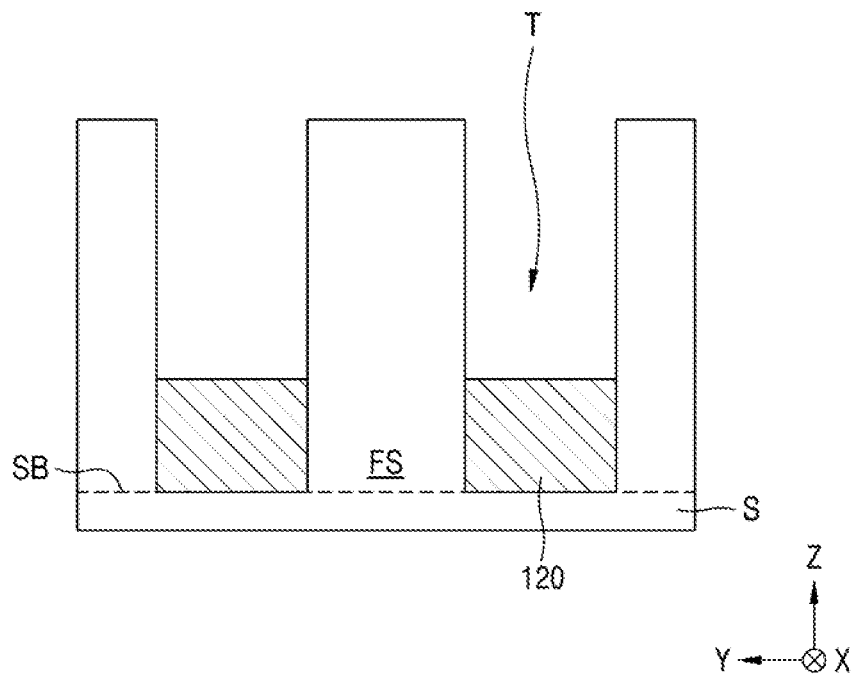

Referring to FIGS. 12A to 12C, the fin structure FS may be formed by forming a plurality of trenches T extending in the first horizontal direction (e.g., the X direction) in the substrate S, respectively. Further, the device isolation layer 120 may be formed in the trench T.

Figure 13A:
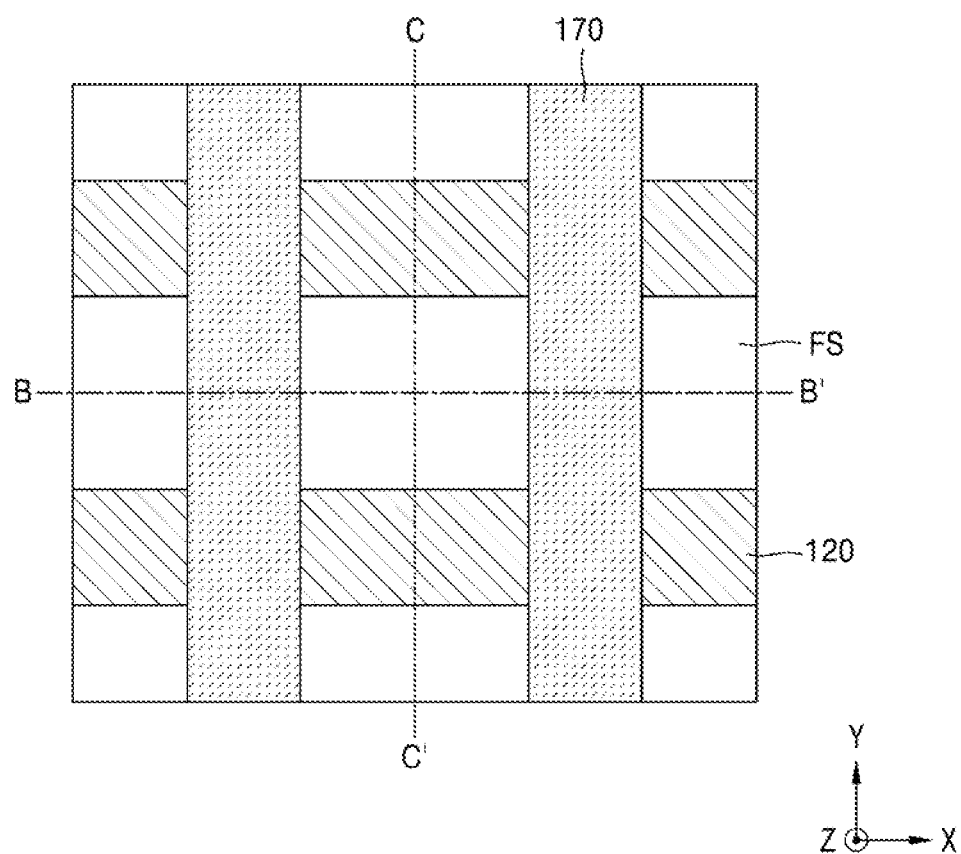
Figure 13B:
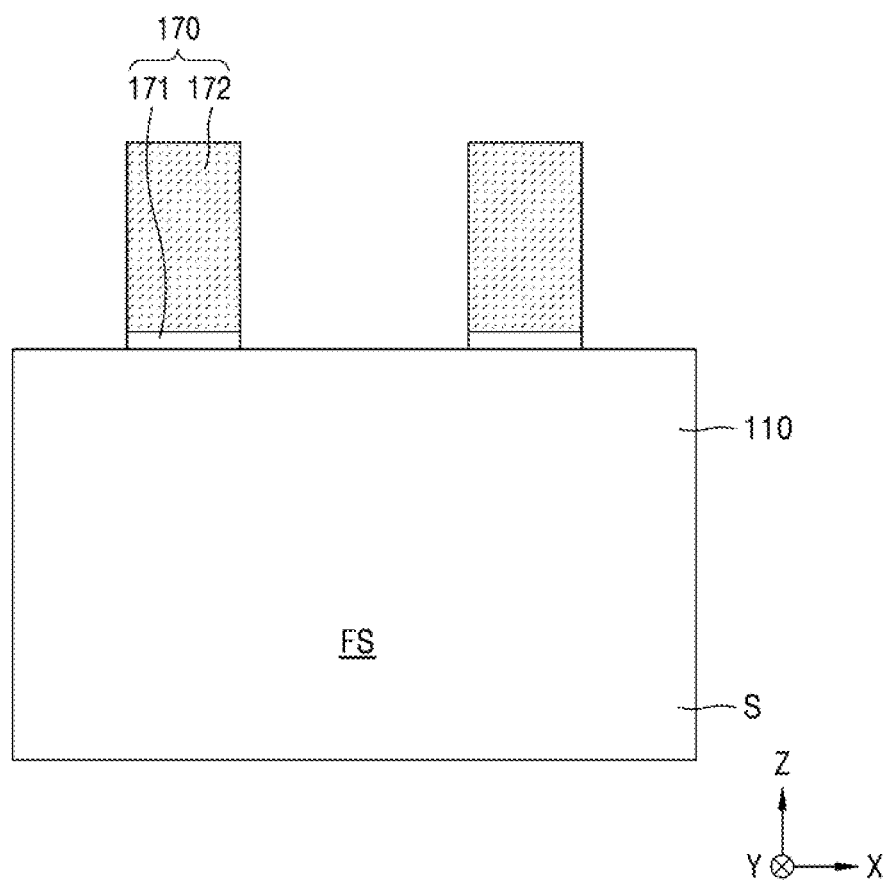
Figure 13C:
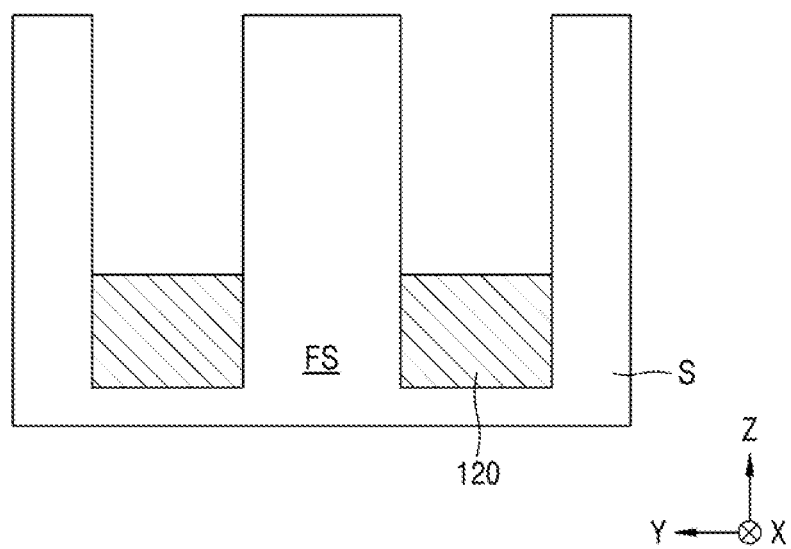

Referring to FIGS. 13A to 13C, a dummy gate structure 170 extending in the second horizontal direction (e.g., the −Y direction) may be formed on the fin structure FS. The dummy gate structure 170 may include, for example, a dummy gate insulating layer 171 and a dummy gate electrode layer 172 on the fin structure FS. The dummy gate insulating layer 171 may include, for example, an oxide. The dummy gate electrode layer 172 may include, for example, polysilicon. In some embodiments of the present disclosure, the dummy gate structure 170 may further include a capping layer on the dummy gate electrode layer 172, and the capping layer may include, for example, silicon nitride.

Figure 14A:
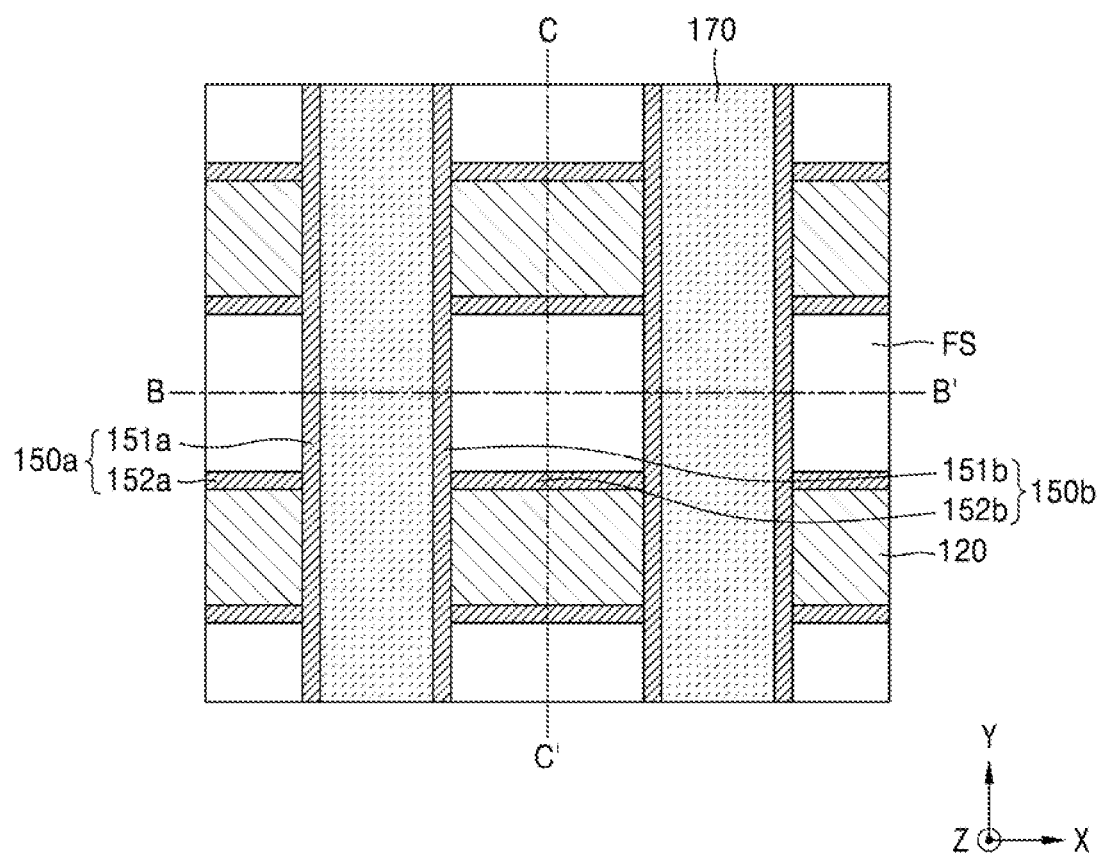
Figure 14B:
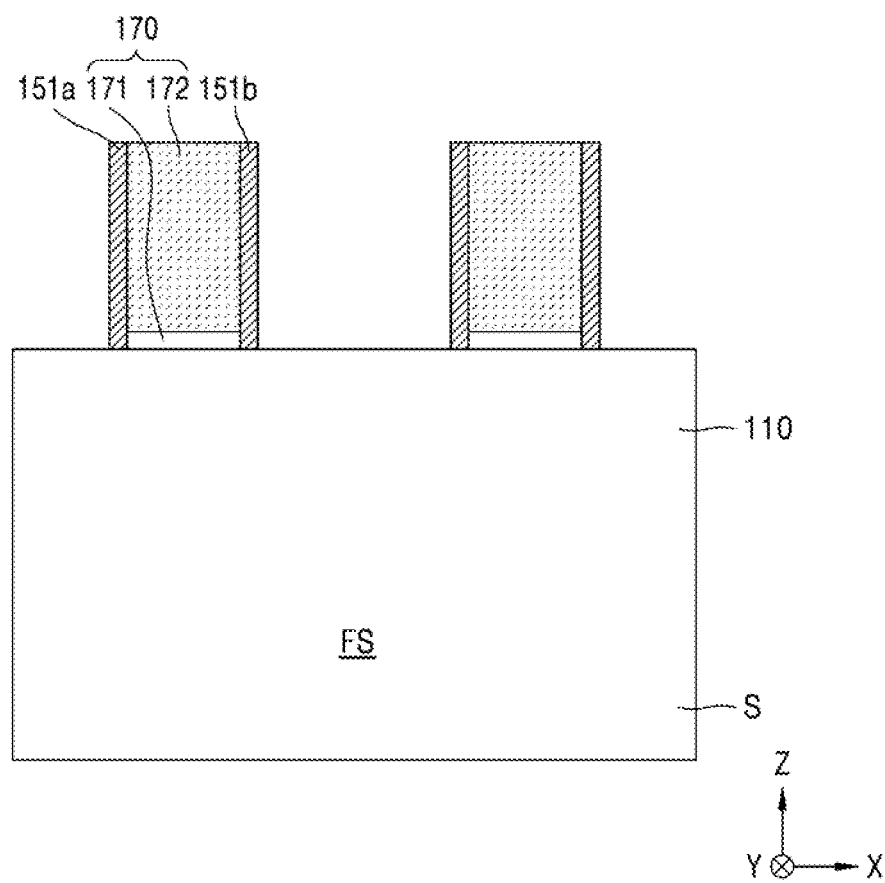
Figure 14C:
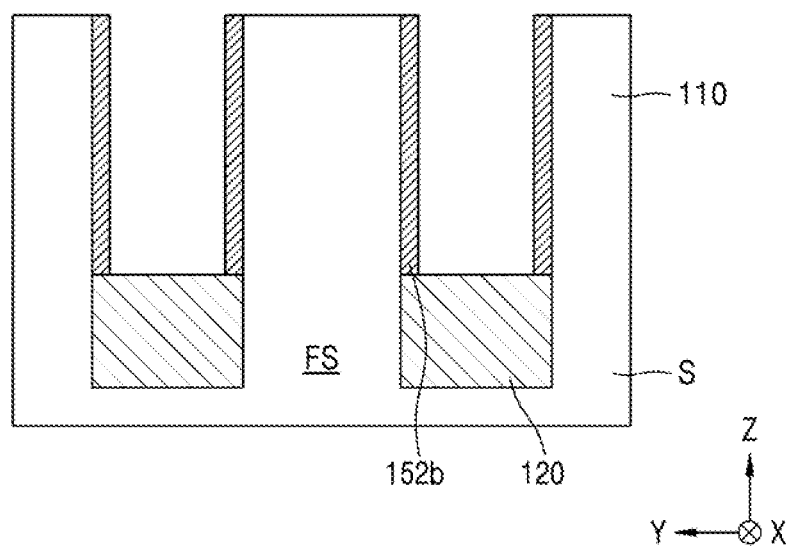

Referring to FIGS. 14A to 14C, the first inner spacer layer 150a including the first portion 151a on a side surface of the dummy gate structure 170 and the second portion 152a on a side surface of the fin structure FS, and the second inner spacer layer 150b including the first portion 151b on the opposite side surface of the dummy gate structure 170 and the second portion 152b on a side surface of the fin structure FS may be formed. For example, the first inner spacer layer 150a and the second inner spacer layer 150b may be formed by depositing an inner spacer material layer on the dummy gate structure 170, the fin structure FS, and the device isolation layer 120, and by removing portions of the inner spacer material layer on an upper surface of the dummy gate structure 170, an upper surface of the fin structure FS, and an upper surface of the device isolation layer 120 through anisotropic etching.

Referring to FIGS. 15A to 15D, a plurality of recesses R may be formed in the fin structure FS by etching the fin structure FS using the dummy gate structure 170, the first portion 151a of the first inner spacer layer 150a, and the first portion 151b of the second inner spacer layer 150b as an etching mask, and a plurality of channels 110 spaced apart by recesses R may be formed. The first side surface S1 of the channel 110 and the second side surface S2 of the channel 110 may be exposed through the recess R.

Figure 15A:
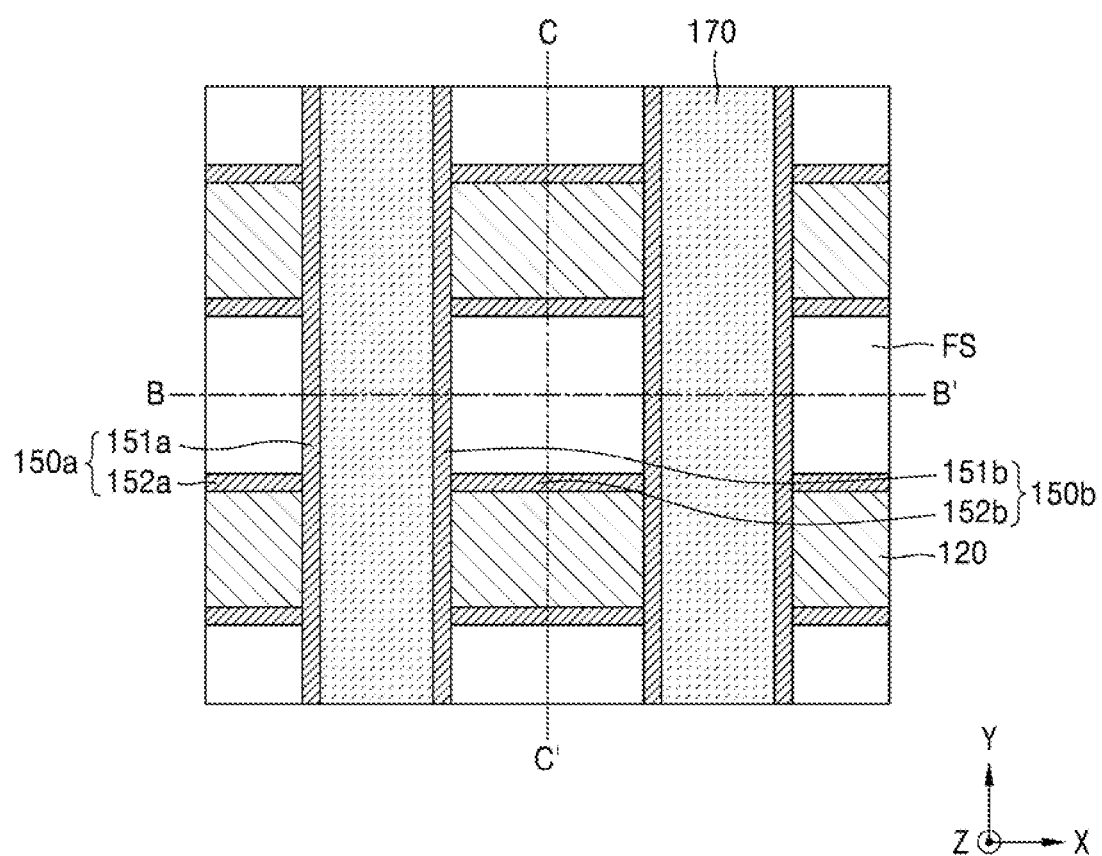
Figure 15B:
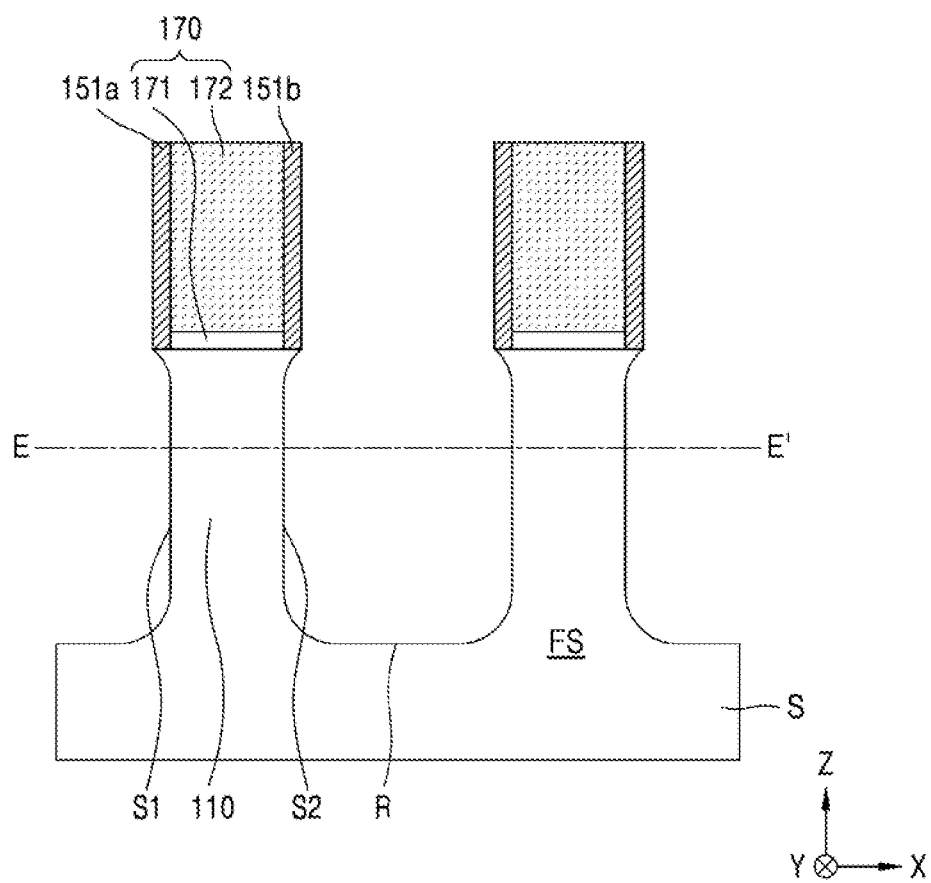
Figure 15C:
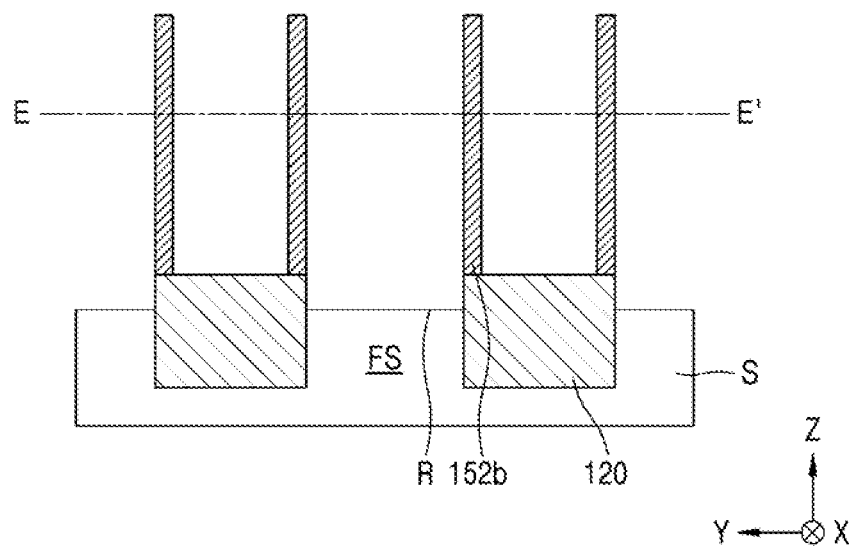
Figure 15D:
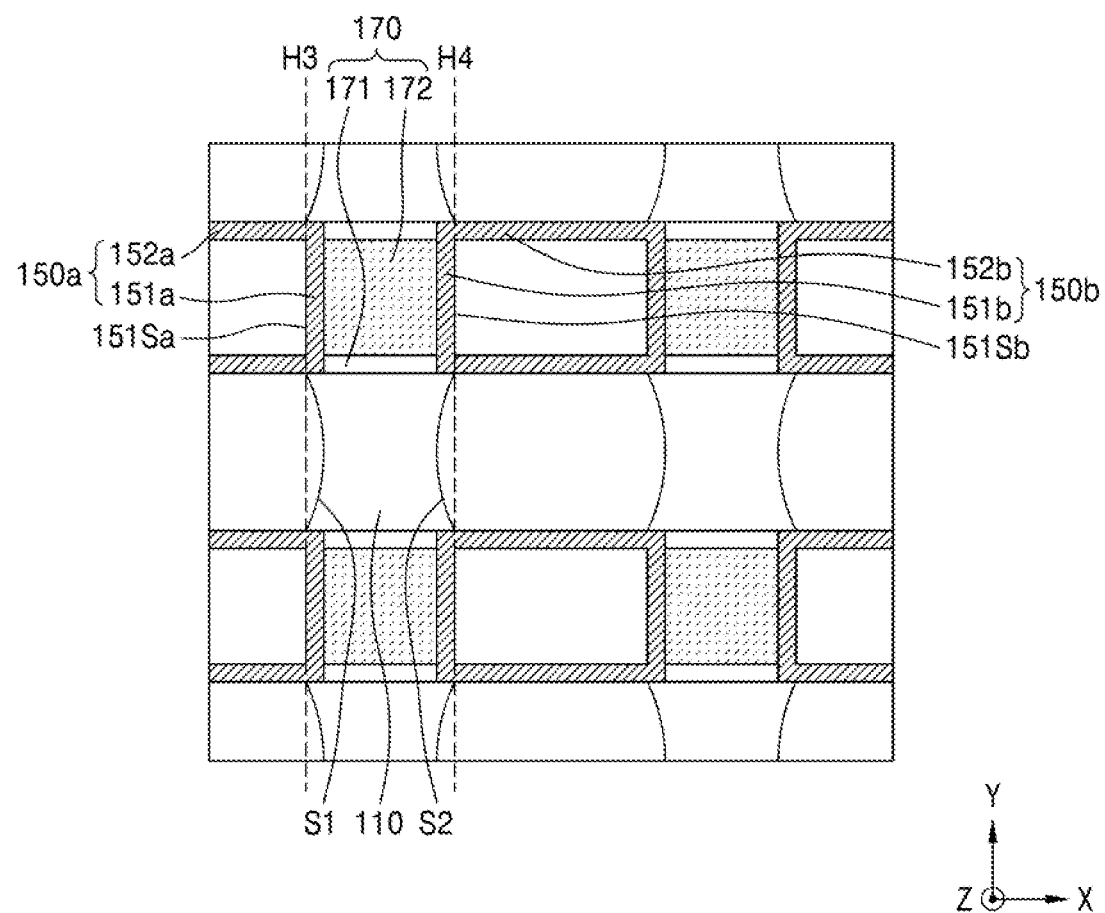
Figure 16A:
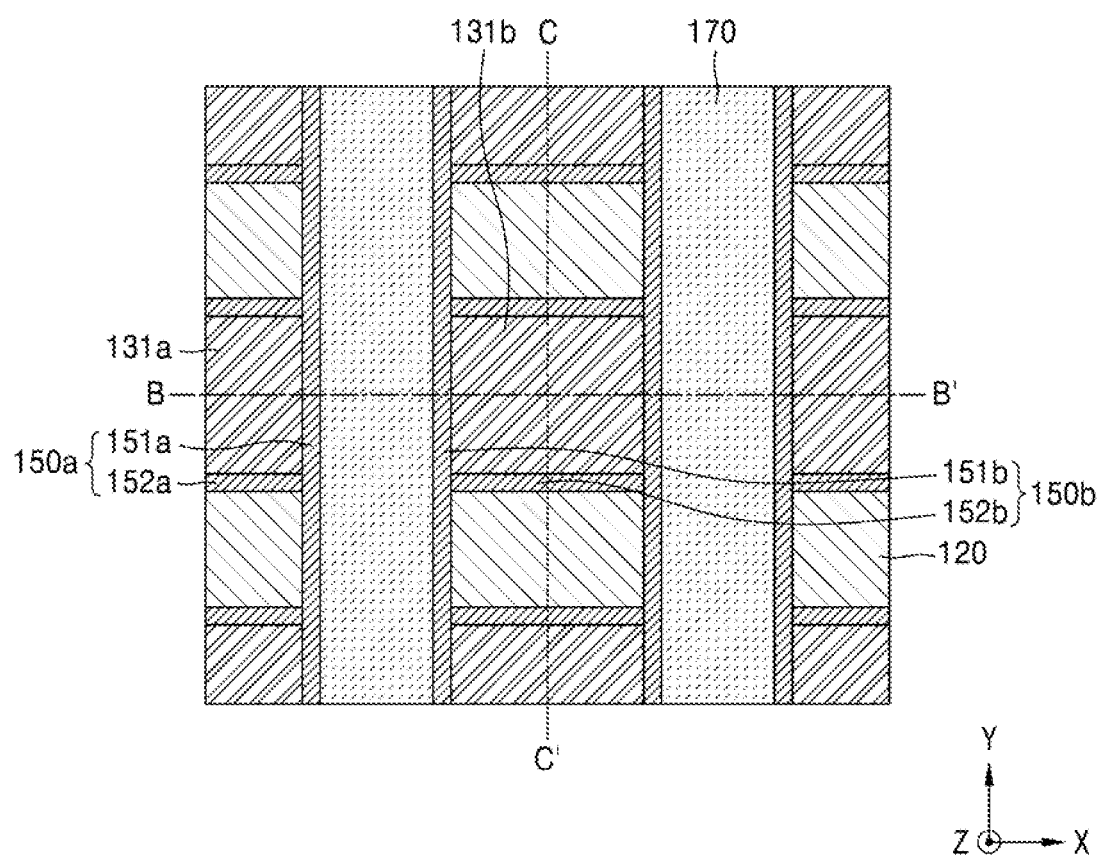
Figure 16B:
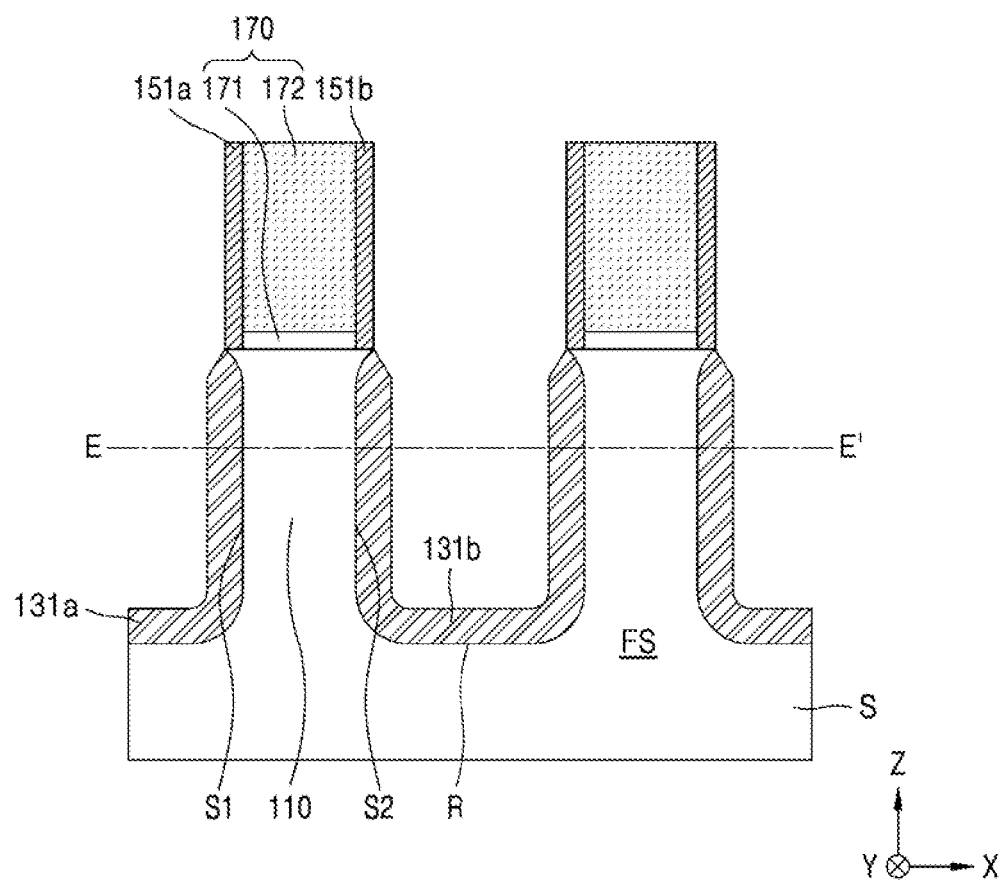
Figure 16C:
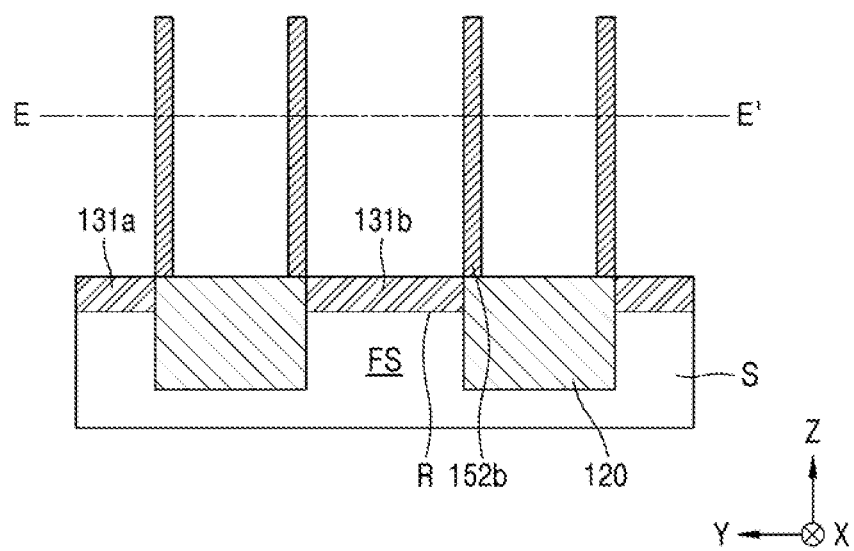
Figure 16D:
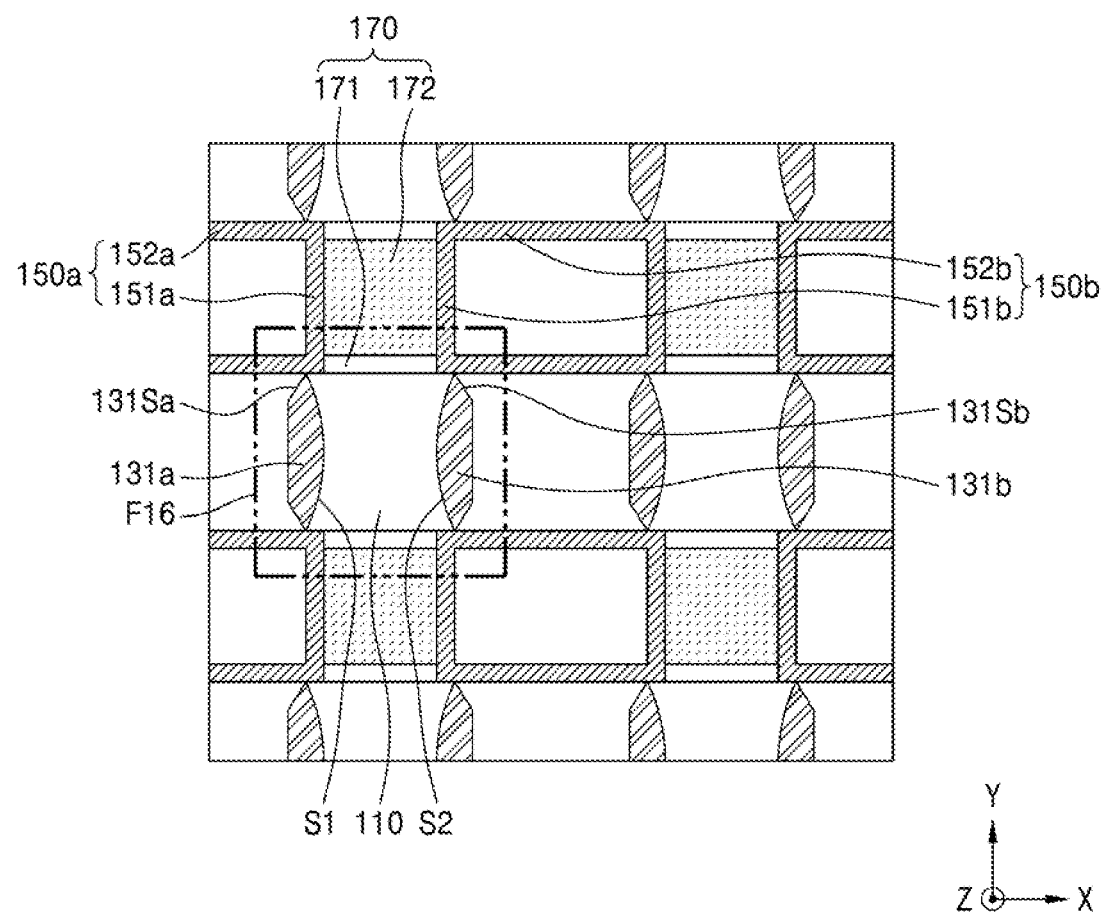
Figure 16E:
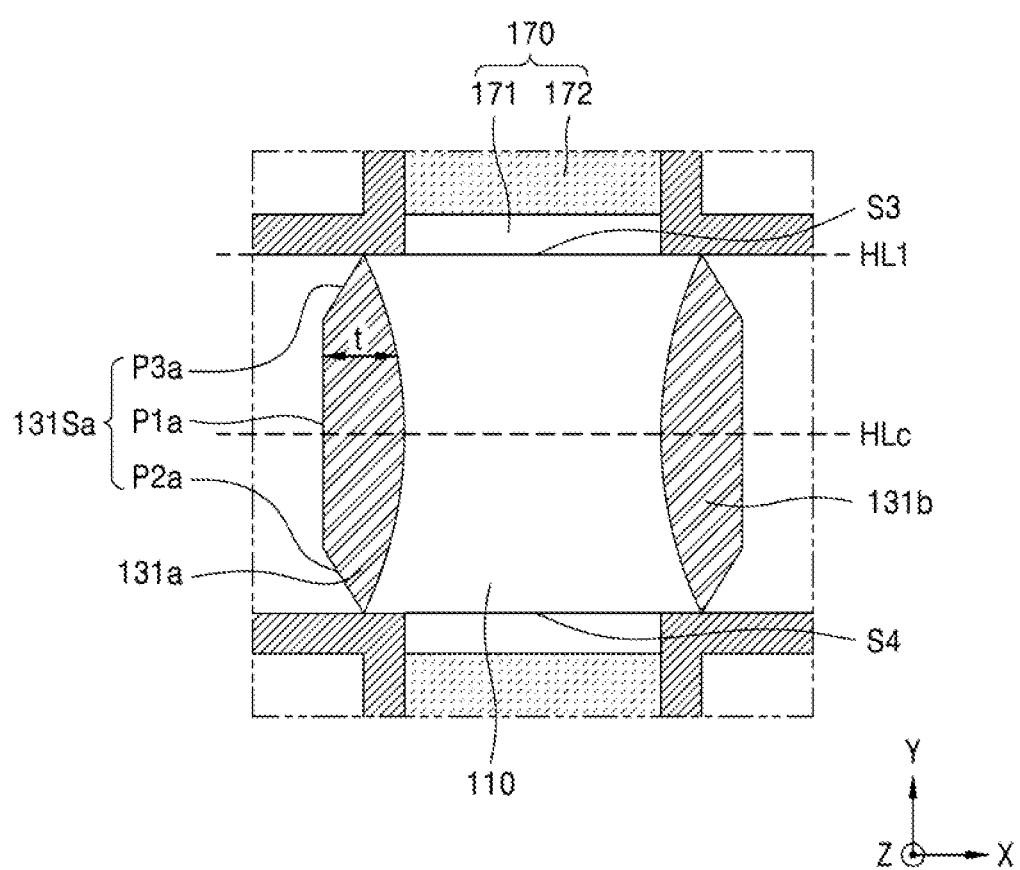
FIG. 16E is an enlarged view illustrating area F16 of FIG. 16D.
Figure 17A:
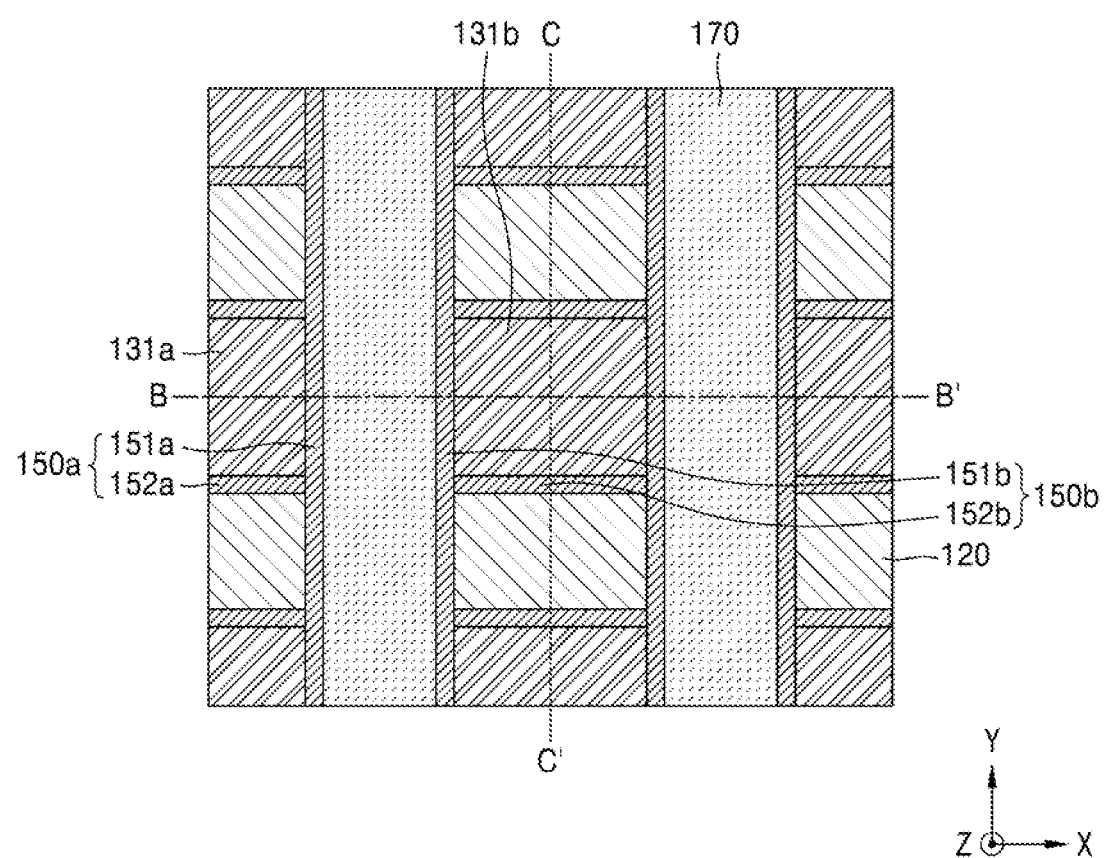
Figure 17B:
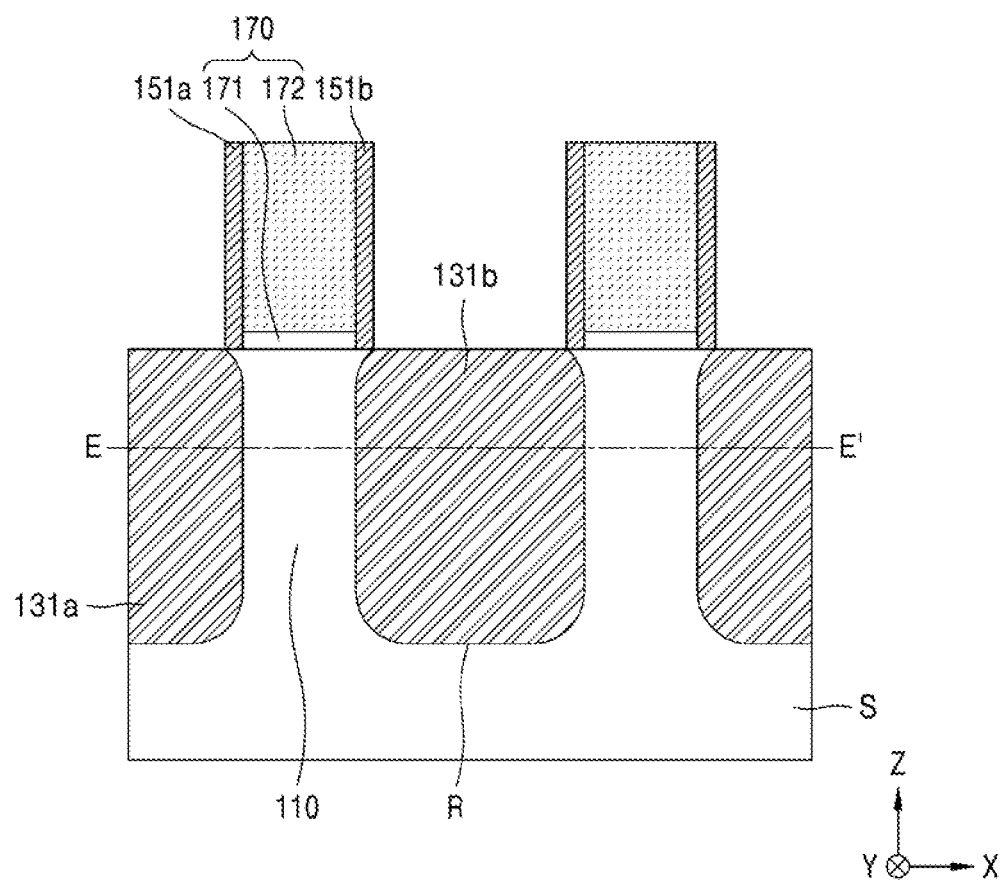
Figure 17C:
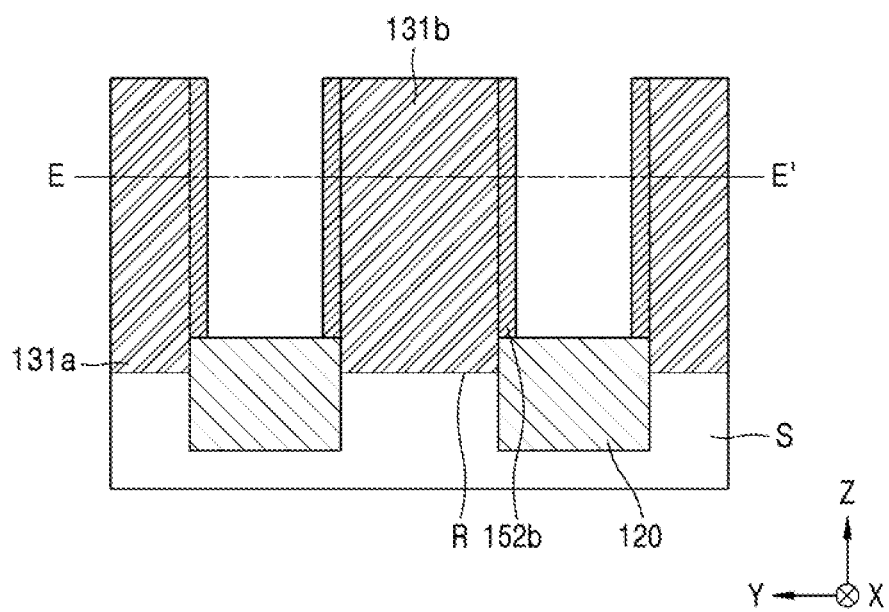
Figure 17D:
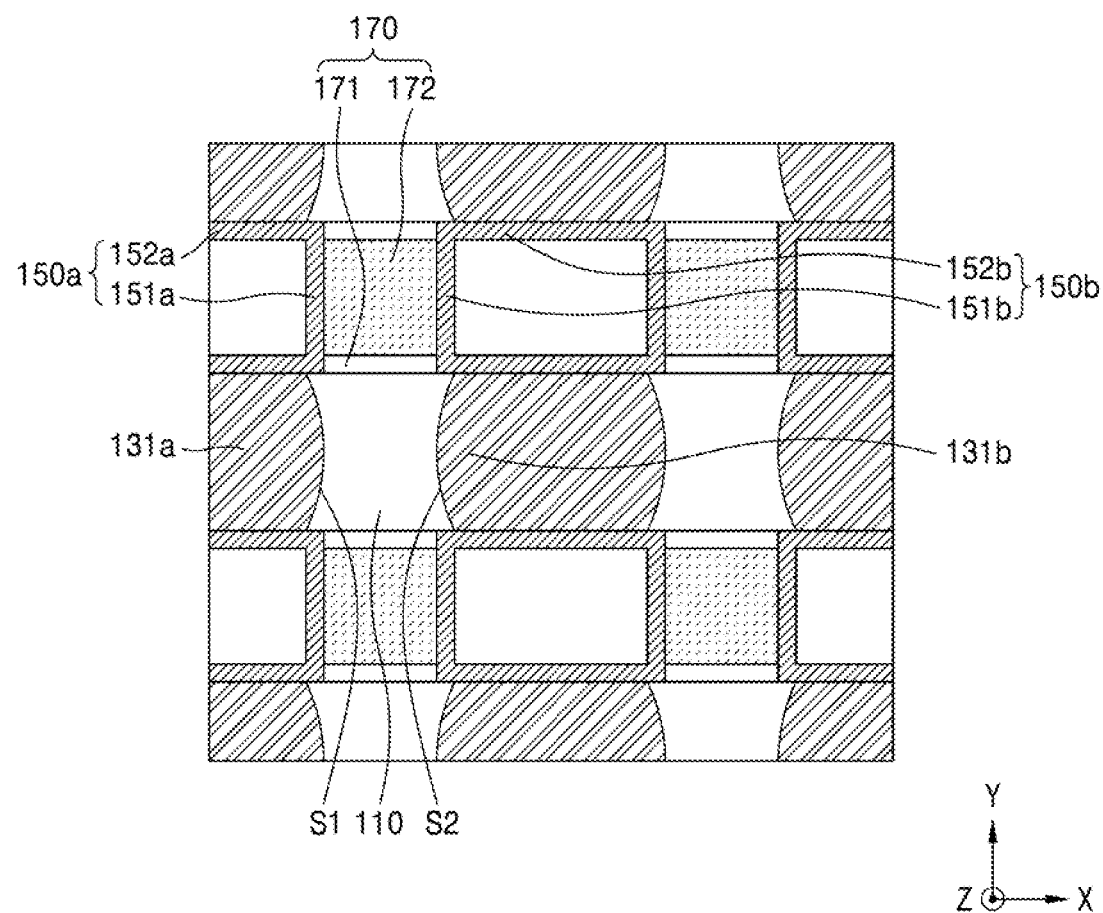
Figure 18A:
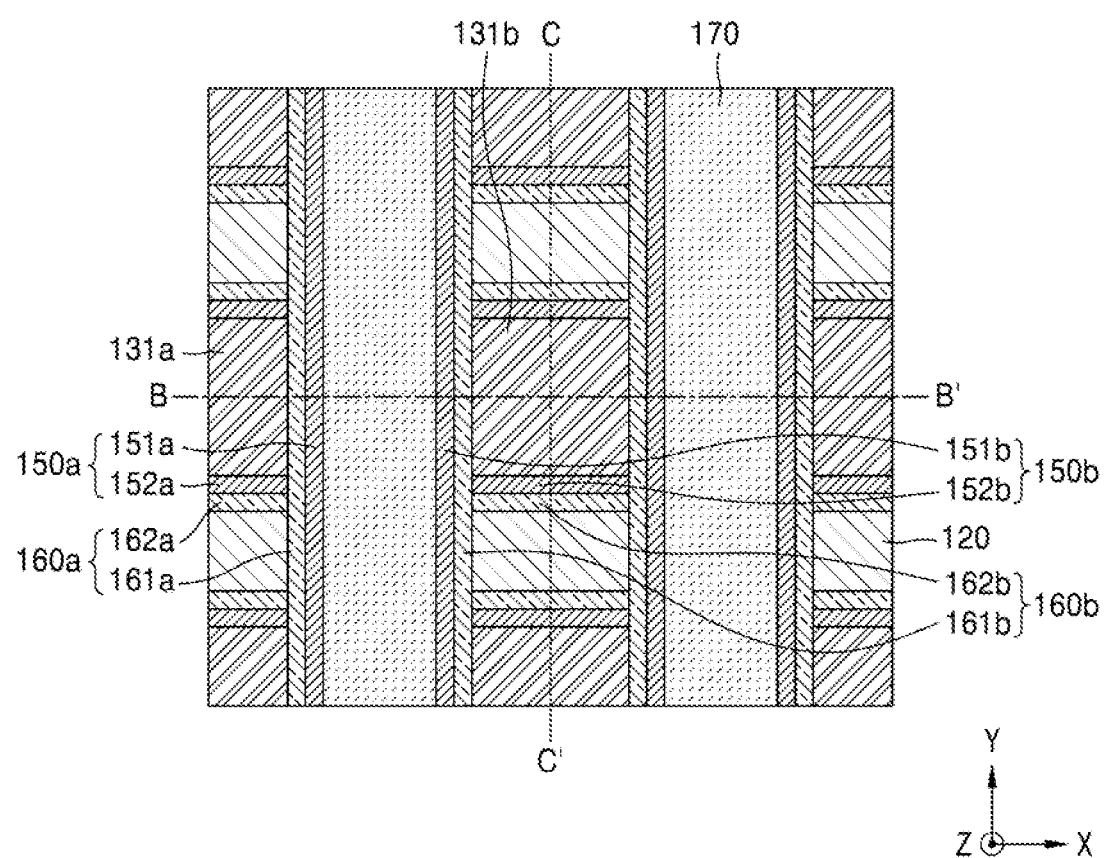
Figure 18B:
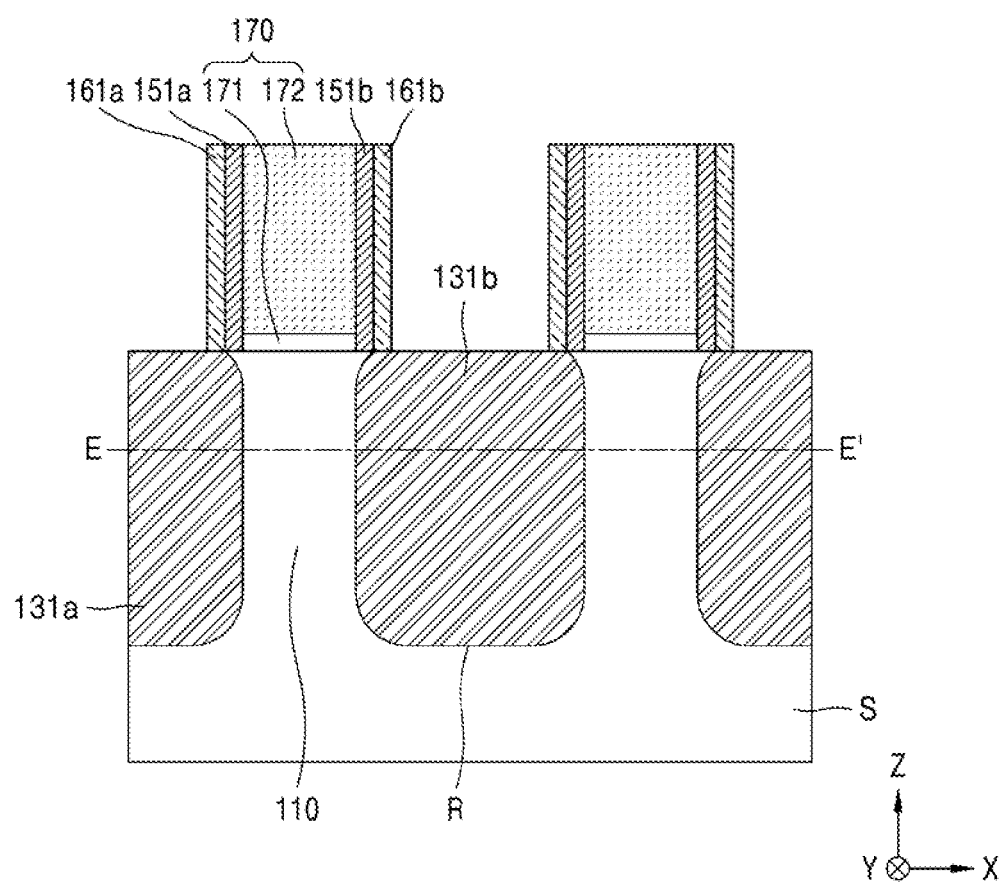
Figure 18C:
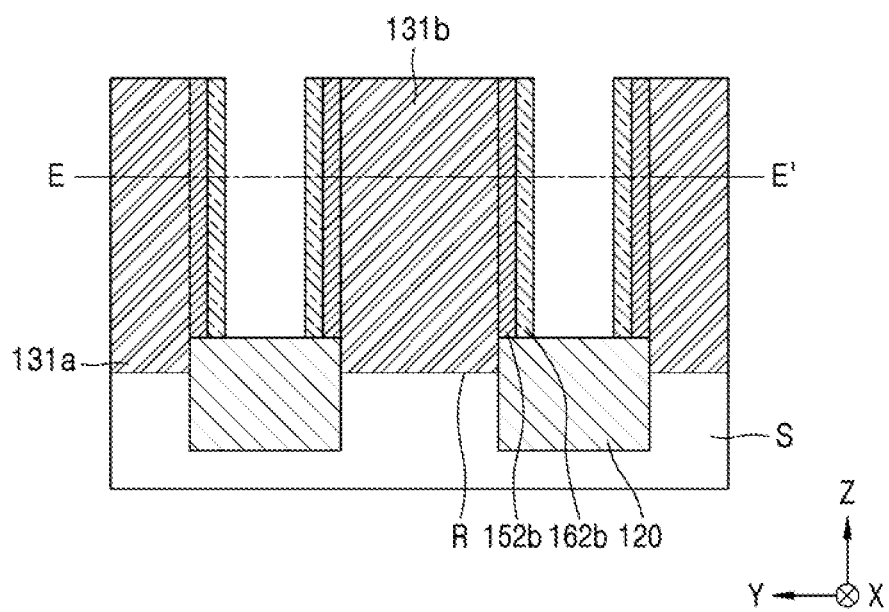
Figure 18D:
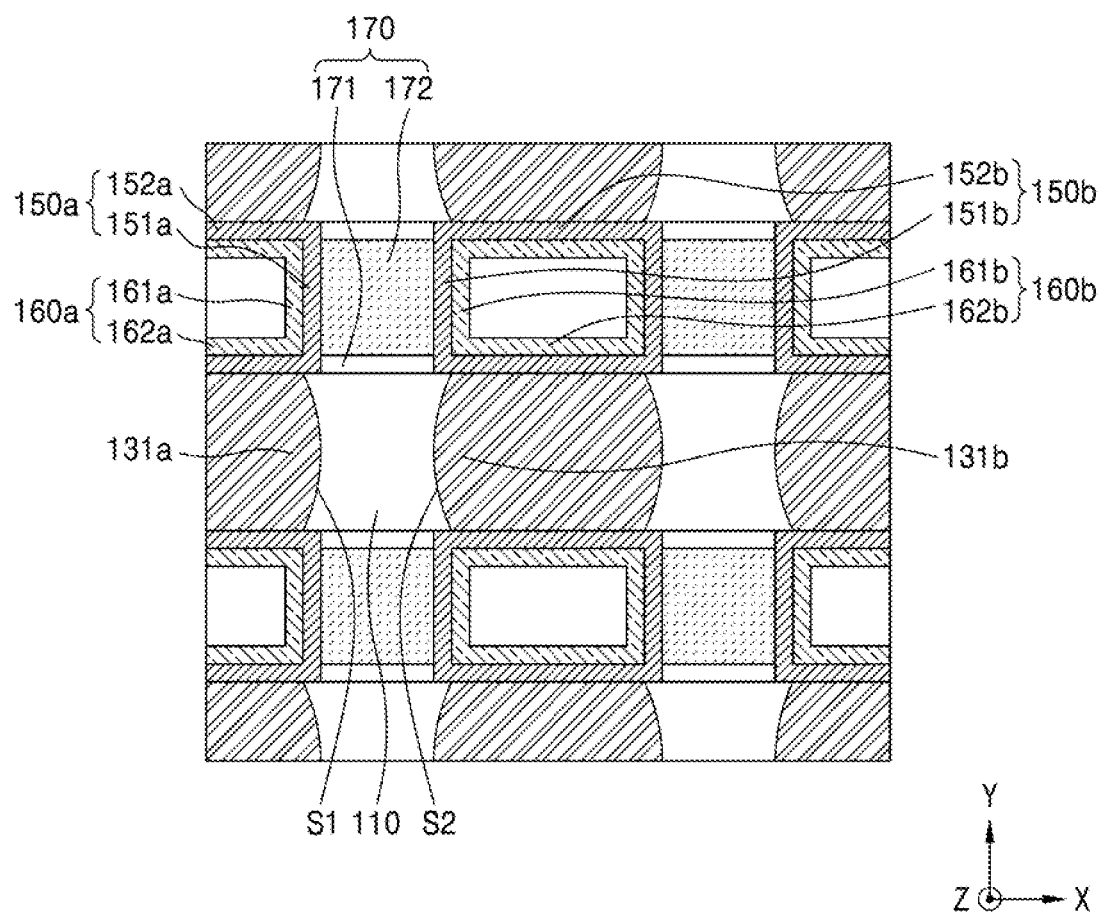

When a perfect anisotropic etching process is used, on the cross-section of FIG. 15D, the first side surface S1 of the channel 110 and the second side surface S2 of the channel 110 may be straight lines. However, when an etching process having slight isotropy is used, or both an anisotropic etching process and an isotropic etching process are used, on the cross-section of FIG. 15D, the first side surface S1 of the channel 110 and the second side surface S2 of the channel 110 may be convex curves and may extend toward each other.

Because the first portion 151a of the first inner spacer layer 150a and the first portion 151b of the second inner spacer layer 150b are used as an etching mask of the fin structure FS, on a cross-sectional plane of FIG. 15D, the first side surface S1 of the channel 110 passes through at least the outer surface 151Sa of the first portion 151a of the first inner spacer layer 150a and may be etched to a third horizontal line H3 parallel to the second horizontal direction (e.g., the −Y direction). Thus, on the cross-sectional plane of FIG. 15D, the first side surface S1 of the channel 110 may be on the same line as the third horizontal line H3 or on the right side of the third horizontal line H3. Similarly, on the cross-sectional plane of FIG. 15D, the second side surface S2 of the channel 110 passes through at least the outer surface 151Sa of the first portion 151a of the second inner spacer layer 150b and may be etched to a fourth horizontal line H4 parallel to the second horizontal direction (e.g., the −Y direction). Thus, on the cross-sectional plane of FIG. 15D, the first side surface S1 of the channel 110 may be on the same line as the fourth horizontal line H4 or on the left side of the fourth horizontal line H4.

Referring to FIGS. 16A to 16E, the first source or drain layer 131a and the fourth source or drain layer 131b may be formed respectively on two recesses R of the fin structure FS through epitaxial growth on the recess R of the fin structure FS. At an initial stage of growth, due to a difference in growth rate according to a crystal plane, in the cross-section of FIG. 16D, a surface 131Sa of the first source or drain layer 131a may be convex extending in a direction opposite to the first horizontal direction (e.g., the −X direction), and a surface 131Sb of the fourth source or drain layer 131b may be convex extending in the first horizontal direction (e.g., the X direction). For example, the surface 131Sa of the first source or drain layer 131a may include a first straight portion P1a perpendicular to the first horizontal direction (e.g., the X direction), a second straight portion P2a that is oblique to the first horizontal direction (e.g., the X direction) and the second horizontal direction (e.g., the Y direction) and extends from one end of the first straight portion P1a to the channel 110, respectively, and a third straight portion P3a that is oblique to the first horizontal direction (e.g., the X direction) and the second horizontal direction (e.g., the Y direction) and extends from an end opposite to the first straight portion P1a to the channel 110, respectively. Therefore, a thickness t of the first source or drain layer 131a in the first horizontal direction (e.g., the X direction) may be minimum along the first horizontal line HL1, and may be maximum along the central horizontal line HLc.

When opposite ends of the first source or drain layer 131a close to the dummy gate structure 170 are sufficiently thin, the first source or drain layer 131a might not be able to block the second and third source or drain layers 132a and 133a (see FIGS. 20A to 20C) from an etchant for later removing the dummy gate structure 170. Accordingly, there is a possibility that a manufacturing yield of the semiconductor device may decrease due to etching of the second and third source or drain layers 132a and 133a (see FIGS. 20A to 20C). To solve such a manufacturing yield problem, a method as described below with reference to FIGS. 17A to 19D may be used.

Referring to FIGS. 17A to 17D, the first source or drain layer 131a and the fourth source or drain layer 131b may be significantly thicker than a desired thickness. In some embodiments of the present disclosure, the first source or drain layer 131a and the fourth source or drain layer 131b may be formed to almost entirely fill each recess R.

Referring to FIGS. 18A to 18D, the first outer spacer layer 160a on the first inner spacer layer 150a and the second outer spacer layer 160b on the second inner spacer layer 150b may be formed. The first outer spacer layer 160a may include the first portion 161a on the first portion 151a of the first inner spacer layer 150a, and the second portion 162a on the second portion 152a of the first inner spacer layer 150a. Similarly, the second outer spacer layer 160b may include the first portion 161b on an outer surface of the first portion 151b of the second inner spacer layer 150b, and the second portion 162b on the outer surface of the second portion 152b of the second inner spacer layer 150b.

For example, an outer spacer material layer may be formed on the first inner spacer layer 150a, the second inner spacer layer 150b, the dummy gate structure 170, the first source or drain layer 131a, the fourth source or drain layer 131b, and the device isolation layer 120, and the first outer spacer layer 160a and the second outer spacer layer 160b may be formed by removing portions on an upper surface of the dummy gate structure 170, on the upper surface of the first source or drain layer 131a, on the upper surface of the fourth source or drain layer 131 b, and on the upper surface of the device isolation layer 120 through anisotropic etching.

Referring to FIGS. 19A to 19D, the first source or drain layer 131a and the fourth source or drain layer 131b may be etched using the first portion 161a of the first outer spacer layer 160a and the first portion 161b of the second outer spacer layer 160b as an etching mask.

Figure 19A:
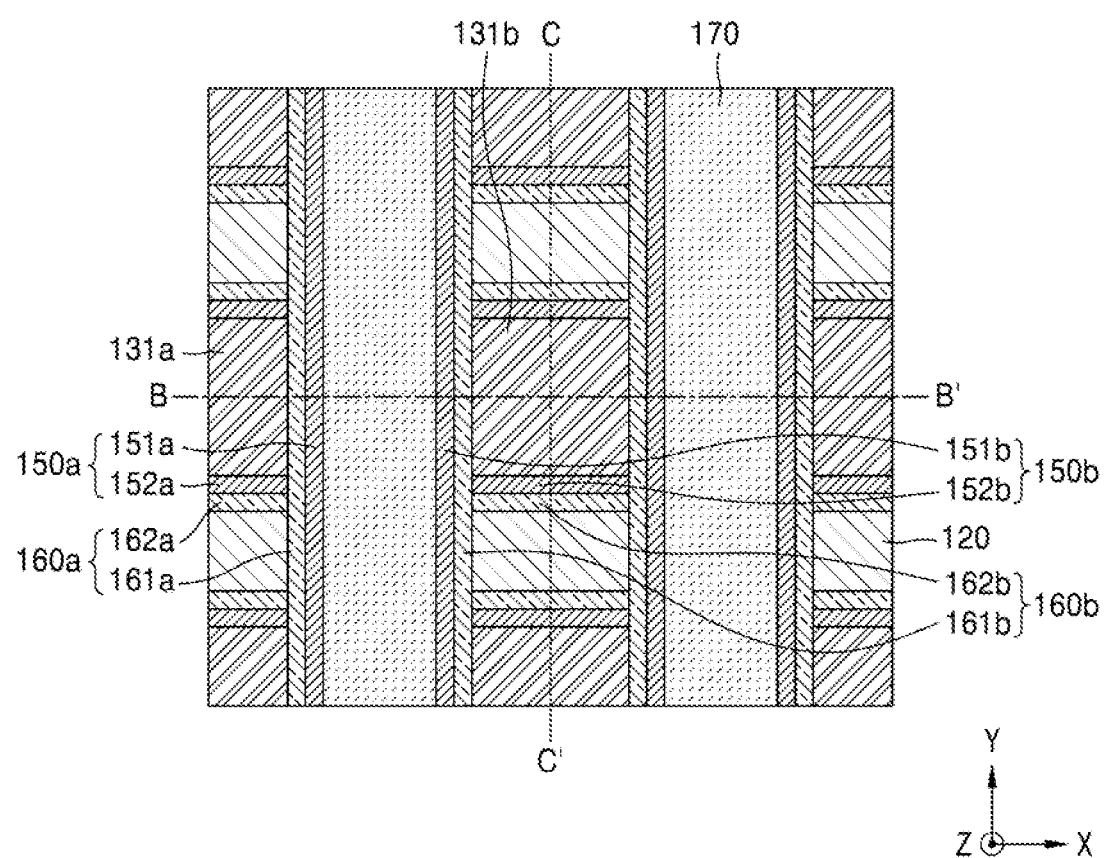
Figure 19B:
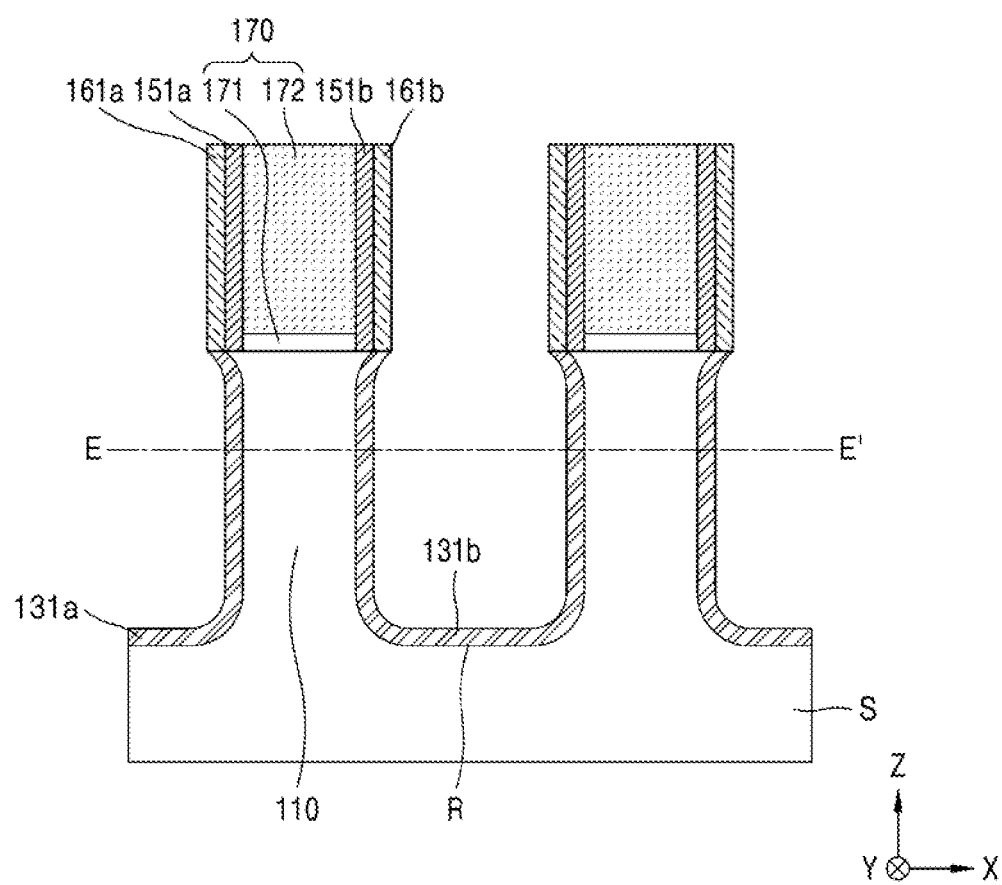
Figure 19C:
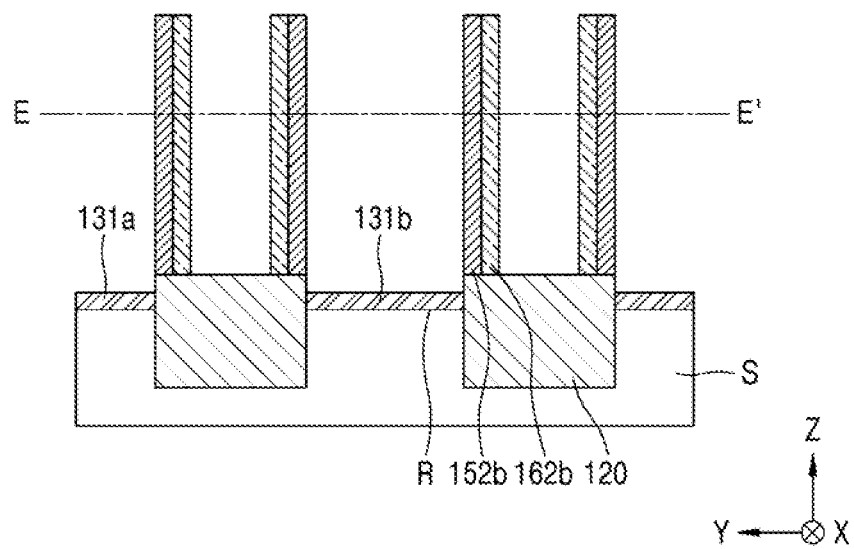
Figure 19D:
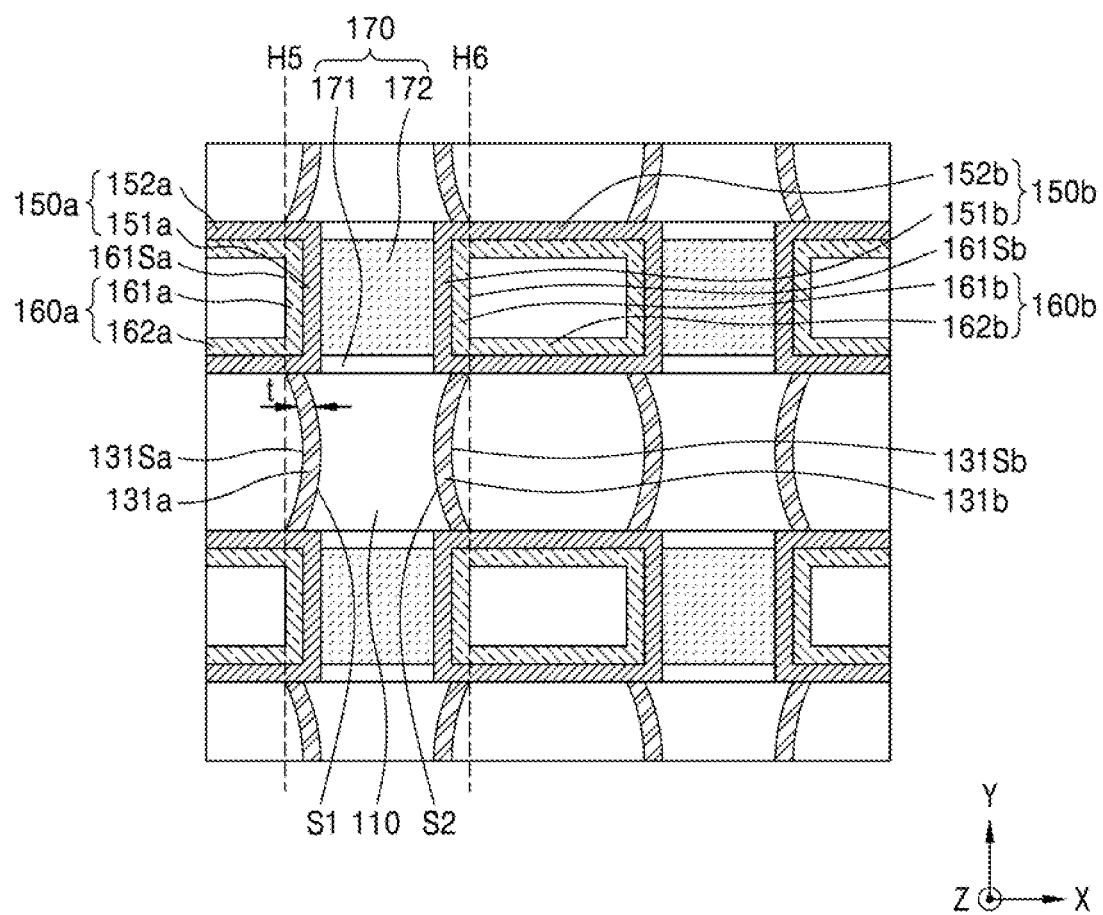
Figure 20A:
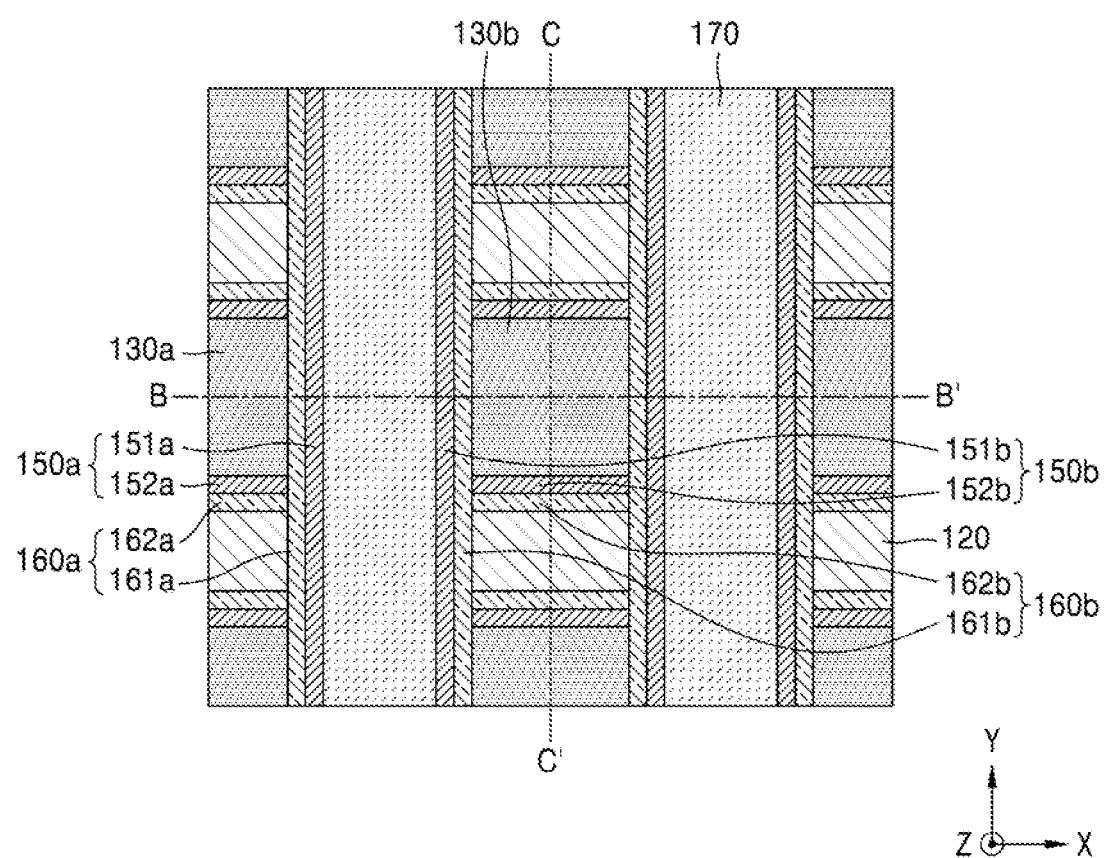
Figure 20B:
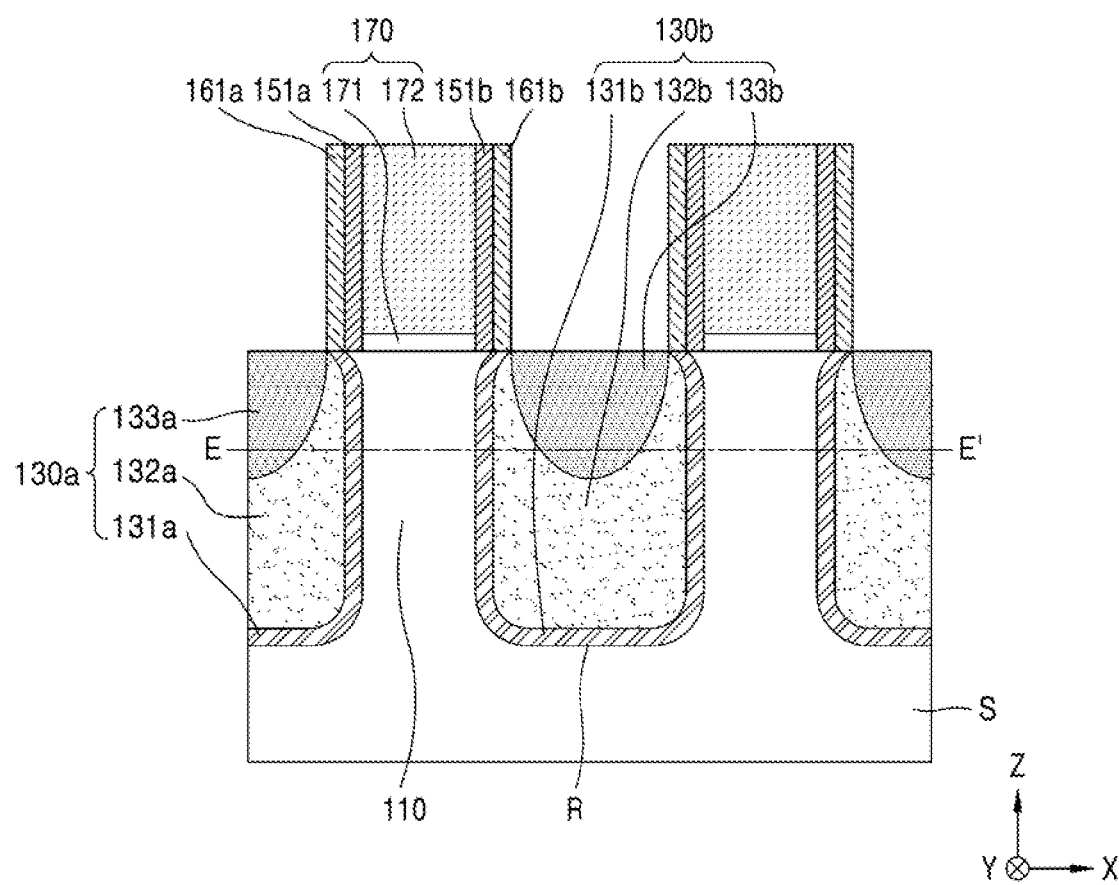
Figure 20C:
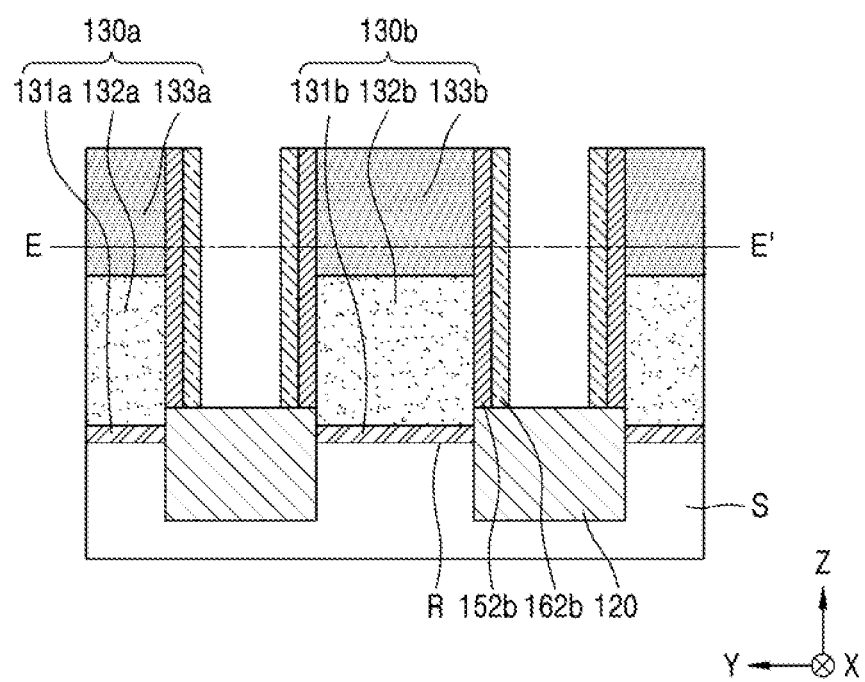
Figure 20D:
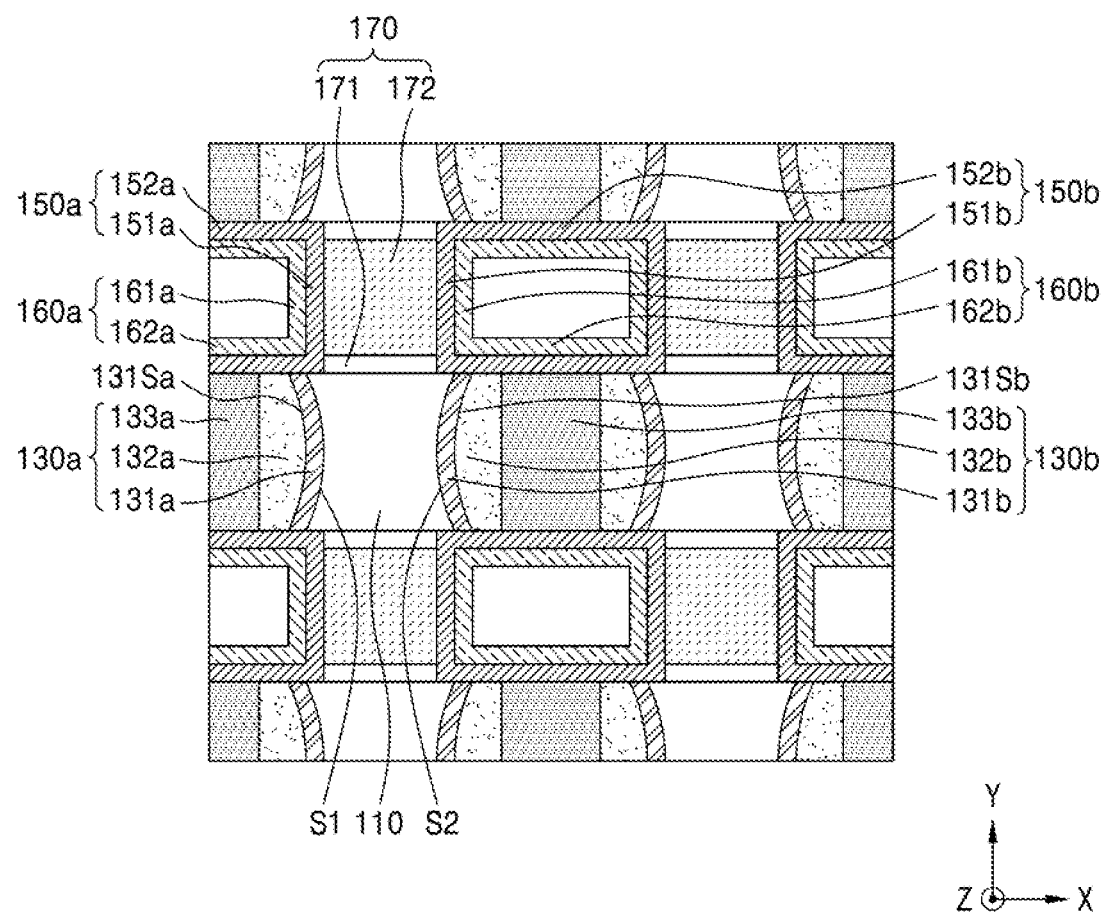

When a perfect anisotropic etching process is used, on the cross-section of FIG. 19D, the surface 131Sa of the first source or drain layer 131a and the surface 131Sb of the fourth source or drain layer 131b may appear as straight lines. However, when an etching process having slight isotropy is used, or both an anisotropic etching process and an isotropic etching process are used, on the cross-section of FIG. 19D, the surface 131Sa of the first source or drain layer 131a and the surface 131Sb of the fourth source or drain layer 131b may appear as convex curves extending toward the channel 110. Accordingly, the thickness t of the first source or drain layer 131a in the first horizontal direction (e.g., the X direction) may be formed relatively uniform. In particular, ends of the first source or drain layer 131a near the dummy gate structure 170 may be formed thick enough to block an etchant while the dummy gate structure 170 is removed.

Because the first portion 161a of the first outer spacer layer 160a and the first portion 161b of the second outer spacer layer 160b are used as an etching mask, on a cross-sectional plane of FIG. 19D, the surface 131Sa of the first source or drain layer 131a passes through at least the outer surface 161Sa of the first portion 161a of the first outer spacer layer 160a and may be etched to a fifth horizontal line H5 parallel to the second horizontal direction (e.g., the −Y direction). Thus, on a cross-sectional plane of FIG. 19D, the surface 131Sa of the first source or drain layer 131a may be on the same line as the fifth horizontal line H5 or on the right side of the fifth horizontal line H5. Similarly, on the cross-sectional plane of FIG. 19D, the surface 131Sb of the fourth source or drain layer 131b passes through at least the outer surface 161Sb of the first portion 161b of the second outer spacer layer 160b and may be etched to a sixth horizontal line H6 parallel to the second horizontal direction (e.g., the −Y direction). Thus, on the cross-sectional plane of FIG. 19D, the surface 131Sb of the fourth source or drain layer 131b may be on the same line as the sixth horizontal line H6 or on the left side of the sixth horizontal line H6.

In general, a growth rate of the first source or drain layer 131a may vary according to a width of the channel 110, and this phenomenon is referred to as a loading effect. Even if the growth rate of the first source or drain layer 131a is different according to the width of the channel, because a thickness of the final first source or drain layer 131a is determined by etching the first source or drain layer 131a using the first outer spacer layer 160a as an etching mask, the thickness of the final first source or drain layer 131a may be the same regardless of the width of the channel. For example, a loading effect of the growth of the first source or drain layer 131a may be reduced.

Referring to FIGS. 20A to 20D, the second source or drain layer 132a and the fifth source or drain layer 132b may be formed on the first source or drain layer 131a and the fourth source or drain layer 131b, respectively, by epitaxial growth. Next, the third source or drain layer 133a and the sixth source or drain layer 133b may be formed on the second source or drain layer 132a and the fifth source or drain layer 132b, respectively, by epitaxial growth. Because a crystal plane of a surface of the first source or drain layer 131a for forming the second source or drain layer 132a is formed by an etching process regardless of the width of the channel, a loading effect of growth of the second source or drain layer 132a may also be reduced.

Next, the dummy gate structure 170 may be removed. Because ends of the first source or drain layer 131a near the dummy gate structure 170 have a sufficient thickness, the first source or drain layer 131a may prevent an etchant for removing the dummy gate structure 170 from etching the second source or drain layer 132a and the third source or drain layer 133a. In addition, the first source or drain layer 131a doped with carbon may increase the resistance of the first source or drain layer 131a to an etchant. Accordingly, the first source or drain layer 131a doped with carbon may better prevent the etchant for removing the dummy gate structure 170 from etching the second source or drain layer 132a and the third source or drain layer 133a. Therefore, a manufacturing yield of the semiconductor device may be increased.

In addition, in general, when Ge concentration of the first source or drain layer 131 a increases, the resistance of the first source or drain layer 131a to an etchant decreases. However, when the first source or drain layer 131a that has a uniform thickness and is doped with carbon is used, even if the Ge concentration of the first source or drain layer 131a is increased, the first source or drain layer 131a may sufficiently protect the second source or drain layer 132a and the third source or drain layer 133a from an etchant. Accordingly, the performance of the semiconductor device may be increased by increasing the Ge concentration of the first source or drain layer 131a without reducing a manufacturing yield of the semiconductor device.

Referring to FIGS. 1A to 1F, the gate structure 140 may be formed in a space from which the dummy gate structure 170 is removed. For example, the gate insulating layer 142 may be formed on the upper surface S5 of the channel 110, the third side surface S3 of the channel 110, and the fourth side surface S4 of the channel 110, and the gate electrode layer 141 may be formed on the gate insulating layer 142. The semiconductor device 100 shown in FIGS. 1A to 1F may be manufactured according to the methods described with reference to FIGS. 12A to 20D.

The semiconductor devices 100-1, 100-2, and 100-3 of FIGS. 2A to 4B may be manufactured by increasing the anisotropy of an etching process of the fin structure FS as described with reference to FIGS. 15A to 15D, and/or by increasing the anisotropy of an etching processes of the first source or drain layer 131a and a fourth source or drain layer 134a as described with reference to FIGS. 19A to 19D. In addition, the semiconductor device 100-4 of FIGS. 5A and 5B may be formed by exposing the bottom of the recess R during the etching processes of the first source or drain layer 131a and the fourth source or drain layer 134a described with reference to FIGS. 19A to 19D.

FIGS. 21A to 25A are plan views illustrating a method of manufacturing a semiconductor device, according to an embodiment of the present disclosure. FIGS. 21B to 25B are cross-sectional views illustrating the semiconductor device taken along line B-B' of FIGS. 21A to 25A, respectively. FIGS. 21C to 25C are cross-sectional views illustrating the semiconductor device taken along line C-C' of FIGS. 21A to 25A, respectively. FIGS. 23D to 25D are cross-sectional views illustrating the semiconductor device taken along line G-G' of FIGS. 23B to 25B and 23C to 25C, respectively.

Figure 21A:
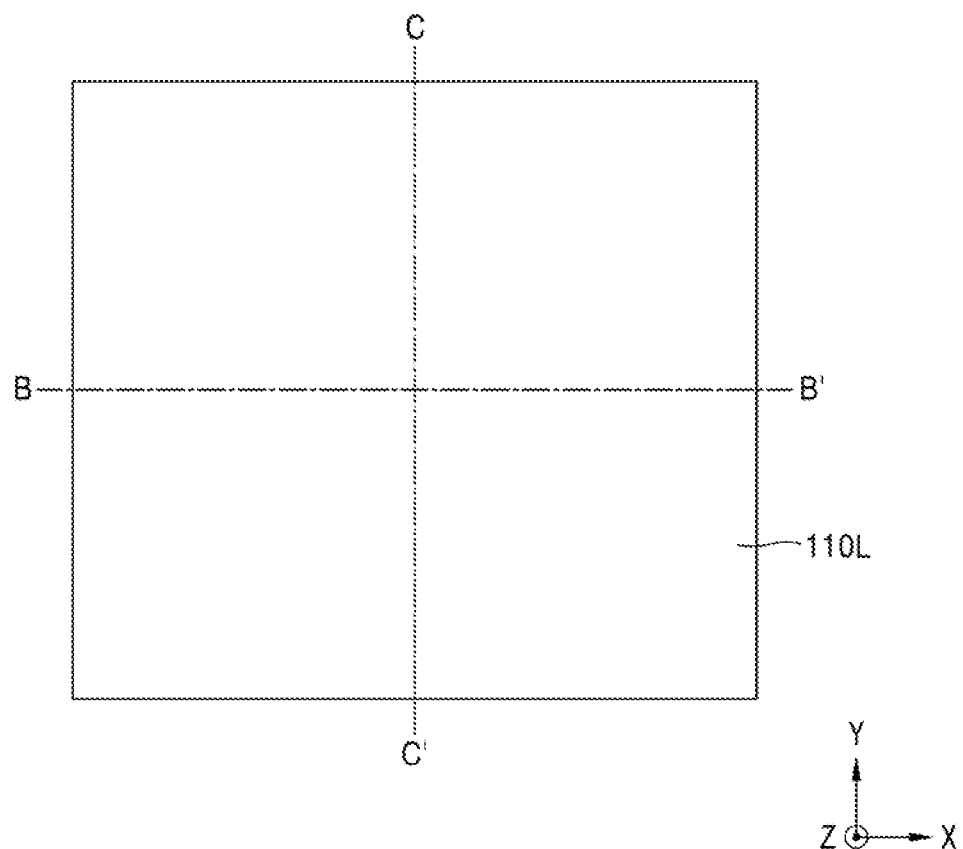
Figure 21B:
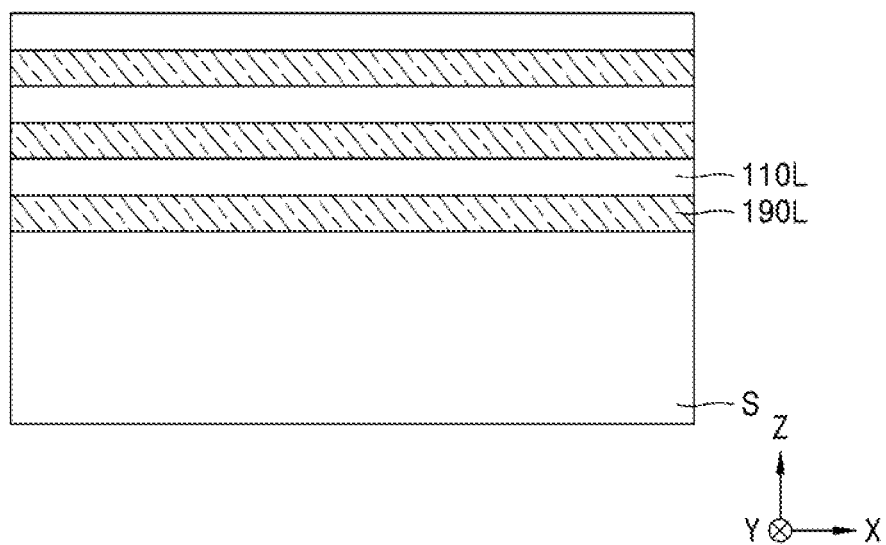
Figure 21C:
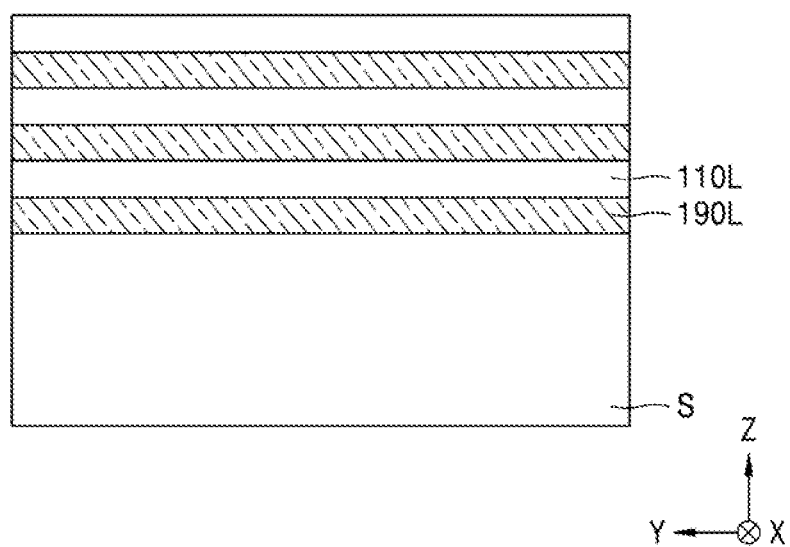

Referring to FIGS. 21A to 21C, a plurality of sacrificial layers 190L and a plurality of channel layers 110L may be alternately stacked on the substrate S. In some embodiments of the present disclosure, the plurality of sacrificial layers 190L may include Ge or SiGe, and the plurality of channel layers 110L may include Si. The plurality of sacrificial layers 190L and the plurality of channel layers 110L may be formed by epitaxial growth.

Figure 22A:
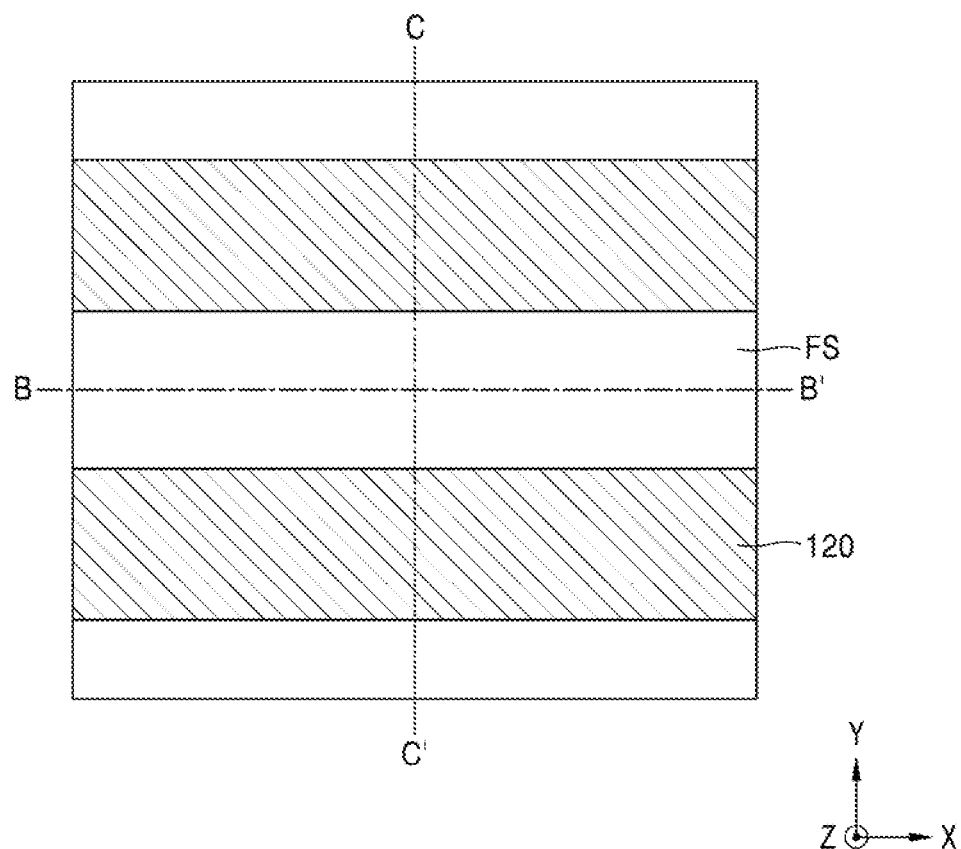
Figure 22B:
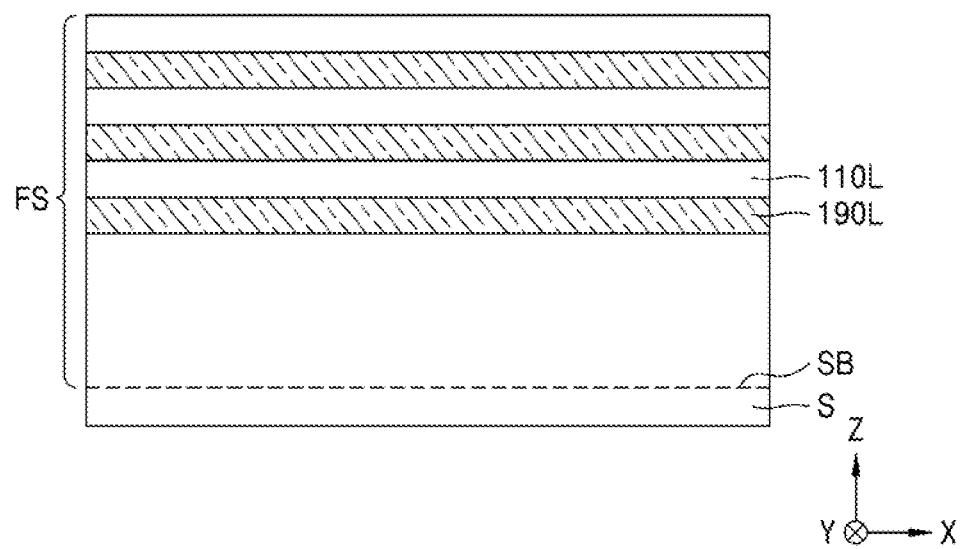
Figure 22C:
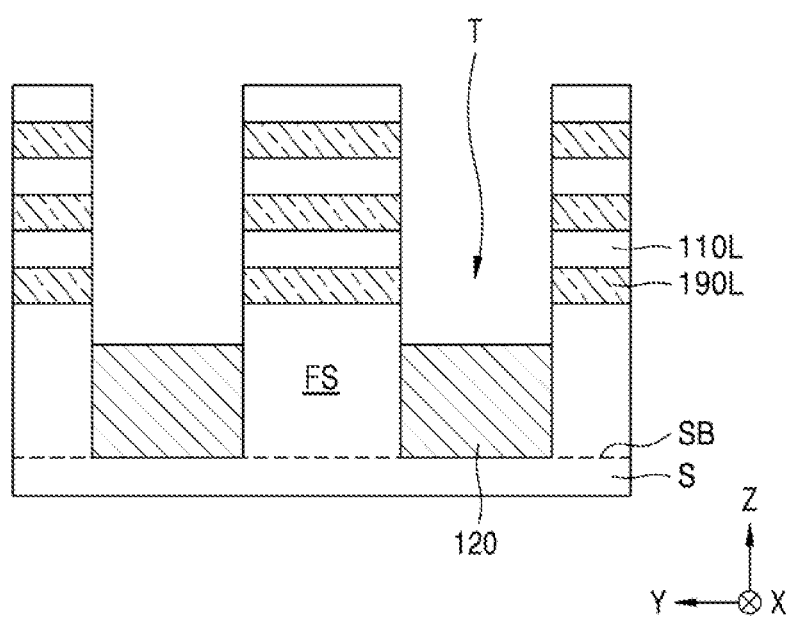
Figure 23A:
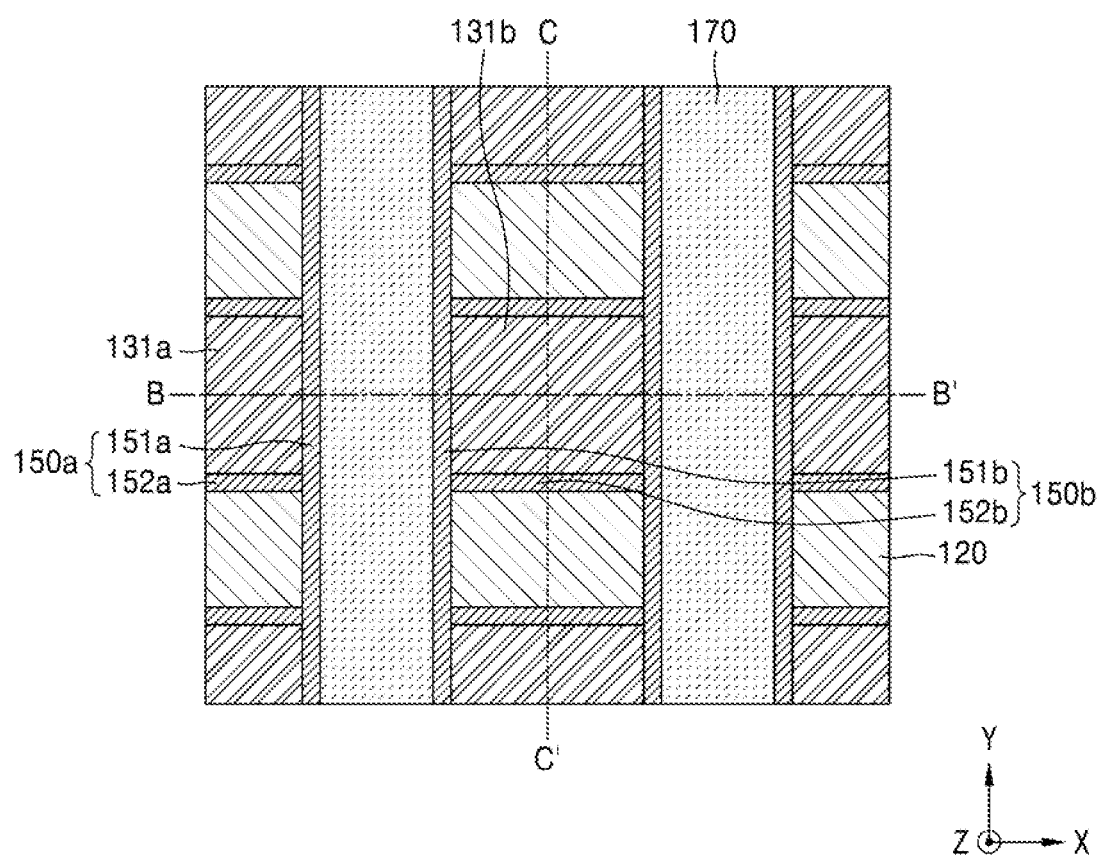
Figure 23B:
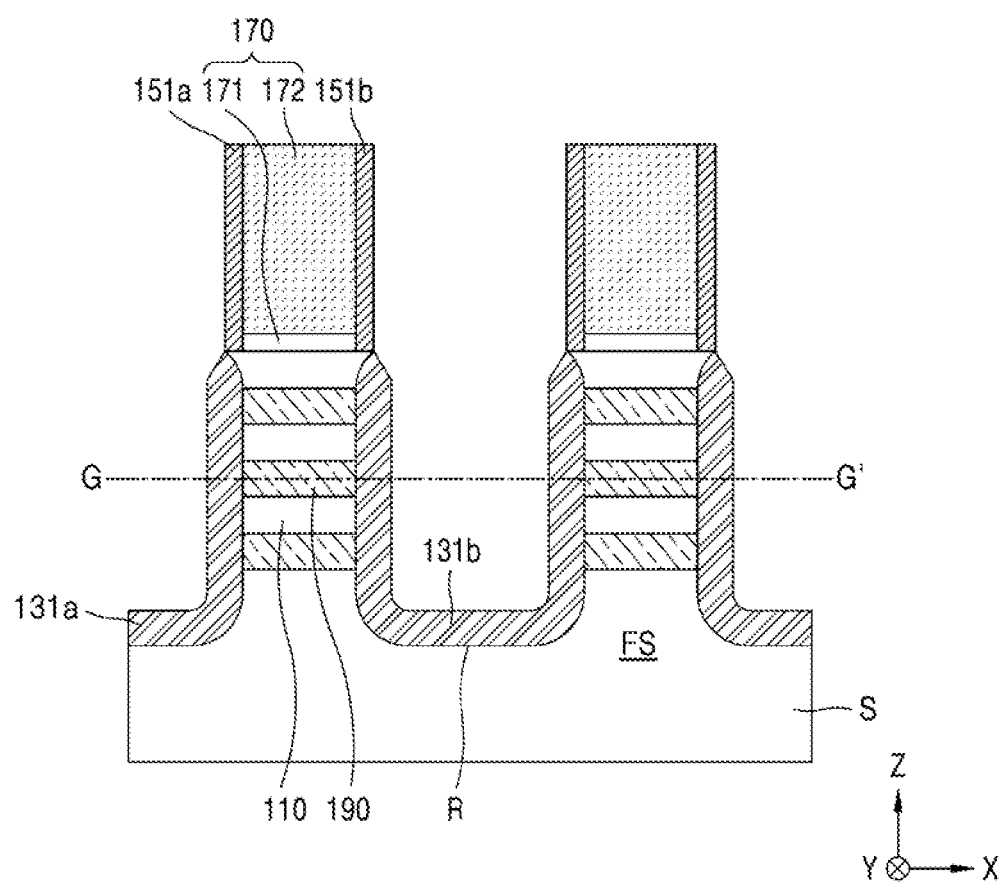
Figure 23C:
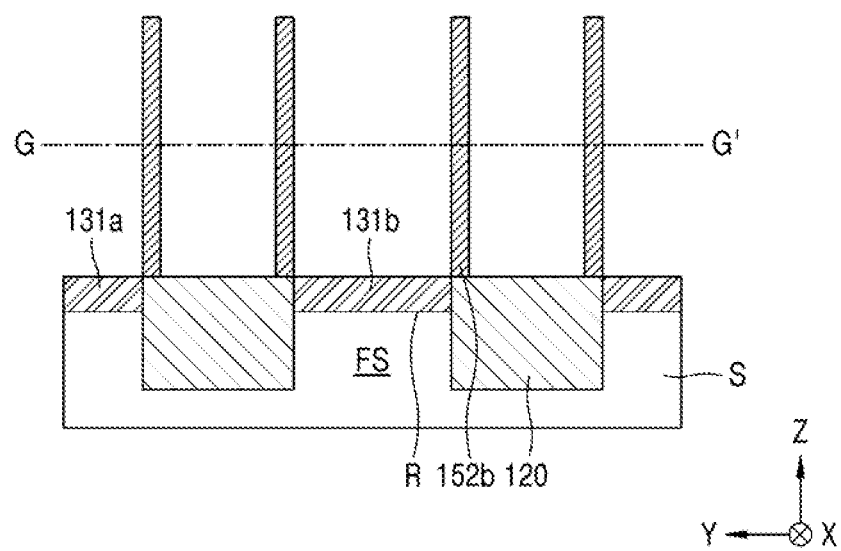
Figure 23D:
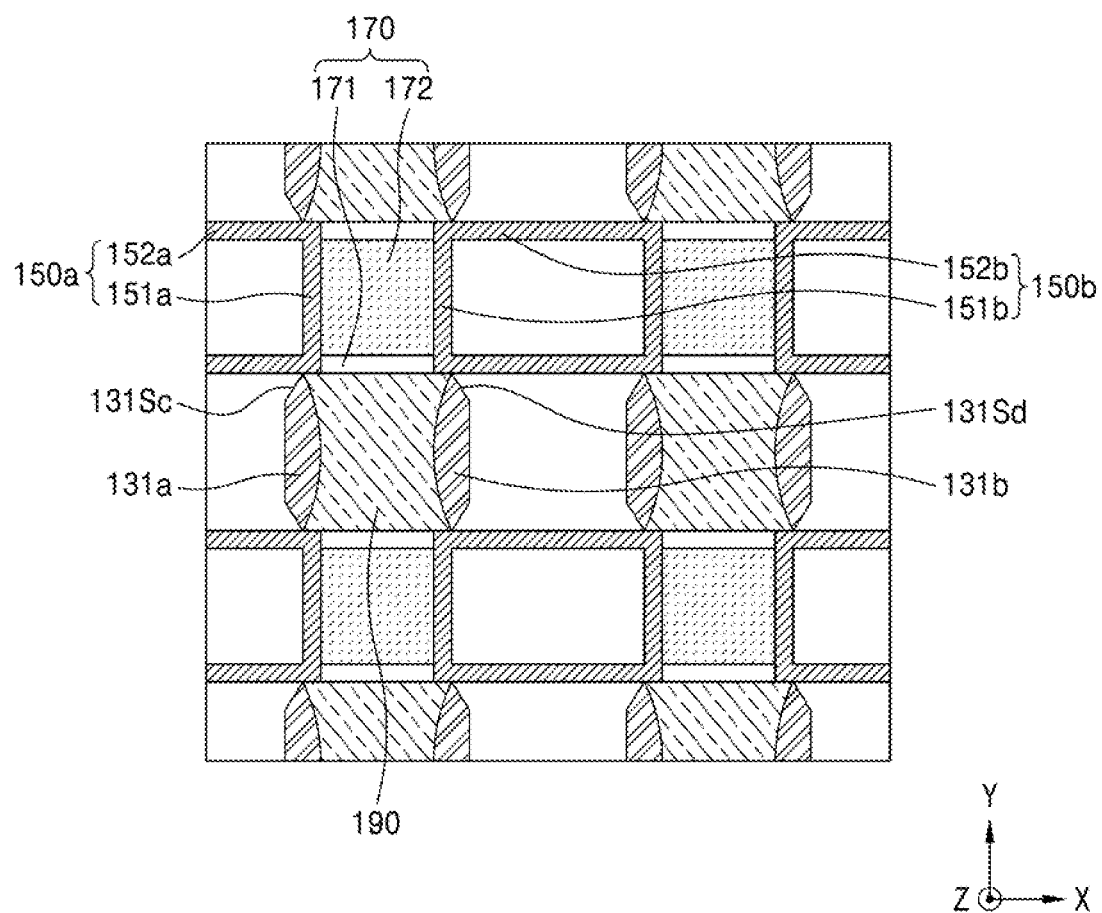

Referring to FIGS. 22A to 22C, a mask pattern extending in the first horizontal direction (e.g., the X direction) may be formed on an uppermost channel layer 110L, and a plurality of trenches T may be formed by etching the plurality of sacrificial layers 190L, the plurality of channel layers 110L, and the substrate S using the mask pattern as an etching mask. Two adjacent trenches T may define the fin structure FS extending in the first horizontal direction (e.g., the X direction). The device isolation layer 120 may be formed in the trench T.

Referring to FIGS. 23A to 23D, similar to the description given with reference to FIGS. 13A to 13C, the dummy gate structure 170 may be formed on the fin structure FS. Next, similar to the description given with reference to FIGS. FIGS. 14A to 14C, the first inner spacer layer 150a and the second inner spacer layer 150b may be formed. Next, similar to the description given with reference to FIGS. 15A to 15D, by forming a plurality of recesses R in the fin structure FS, a plurality of sacrificial patterns 190 and the plurality of channels 110 may be formed from a sacrificial layer 190L (see FIGS. 22A to 22C) and the channel layer 110L.

Next, similar to the description given with reference to FIGS. 16A to 16D, the first source or drain layer 131a and the fourth source or drain layer 131b may be formed on the recesses R of the fin structure FS by epitaxial growth. Due to a difference in growth rate according to a crystal direction, a surface 131Sc of the first source or drain layer 131a on the cross-sectional view illustrating FIG. 23D may be convex extending in a direction opposite to the first horizontal direction (e.g., the –X direction). In addition, a thickness of the first source or drain layer 131a in the first horizontal direction (e.g., the X direction) may decrease at opposite ends of the dummy gate structure 170. The first source or drain layer 131a contacts a sacrificial pattern 190, and then, when the sacrificial pattern 190 is removed, an etchant needs to be blocked. However, a portion of the first source or drain layer 131a might not have a sufficient thickness to block the etchant. Therefore, the methods described with reference to FIGS. 17A to 19C may be applied as follows.

Referring to FIGS. 24A to 24D, the first source or drain layer 131a may be significantly thicker than a desired thickness. In some embodiments of the present disclosure, the first source or drain layer 131a may be formed to fill the entire recess R. Next, the first outer spacer layer 160a on the first inner spacer layer 150a and the second outer spacer layer 160b on the second inner spacer layer 150b may be formed. Next, the first source or drain layer 131a and the fourth source or drain layer 131b may be etched using the first portion 161a of the first outer spacer layer 160a and the first portion 161b of the second outer spacer layer 160b as an etching mask.

Figure 24A:
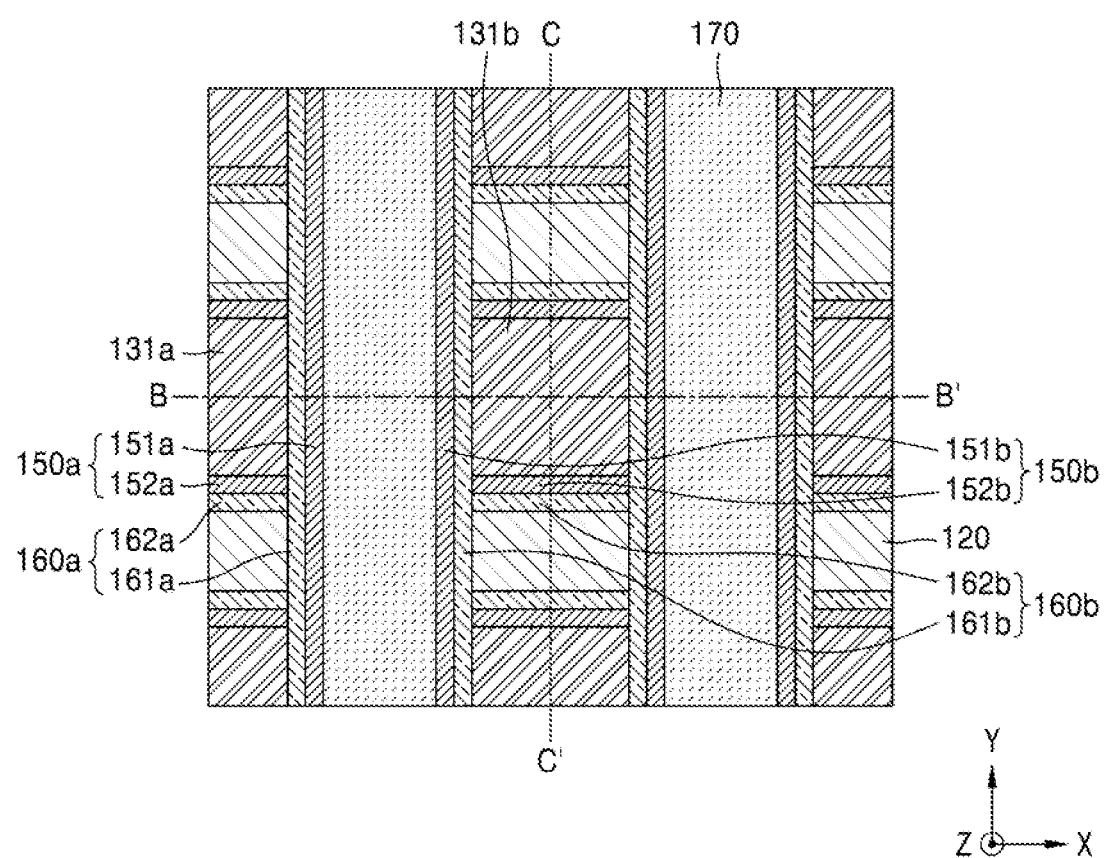
Figure 24B:
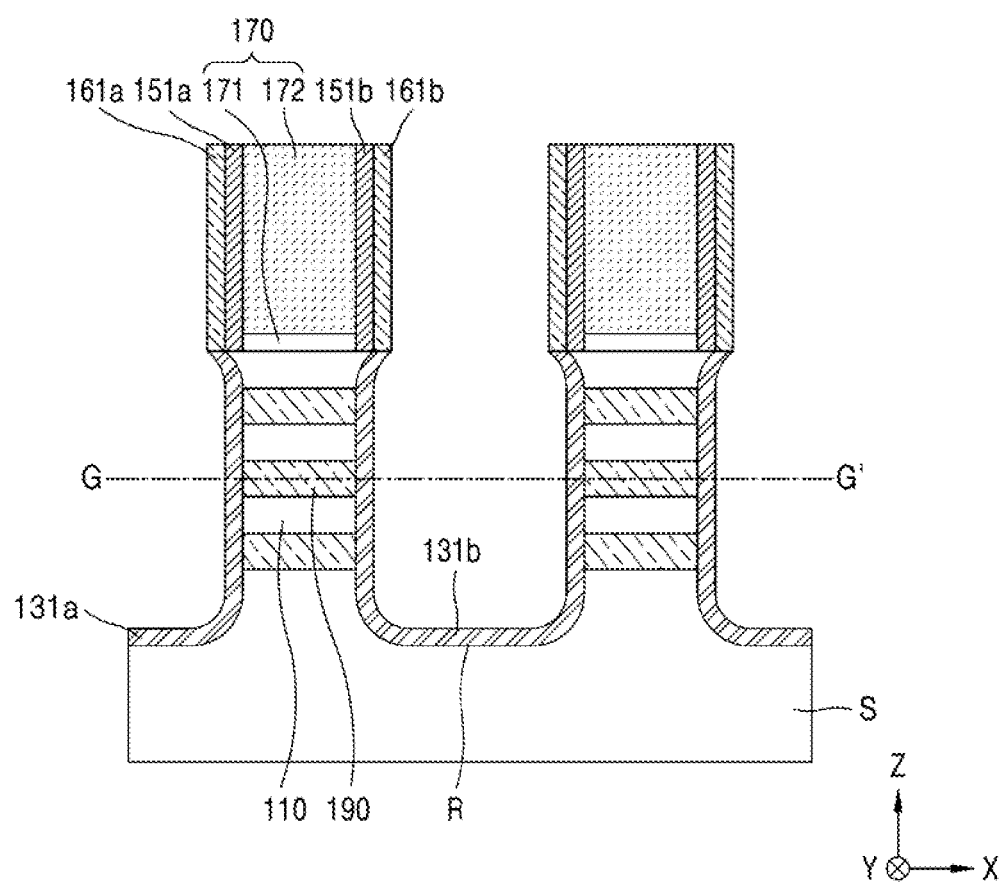
Figure 24C:
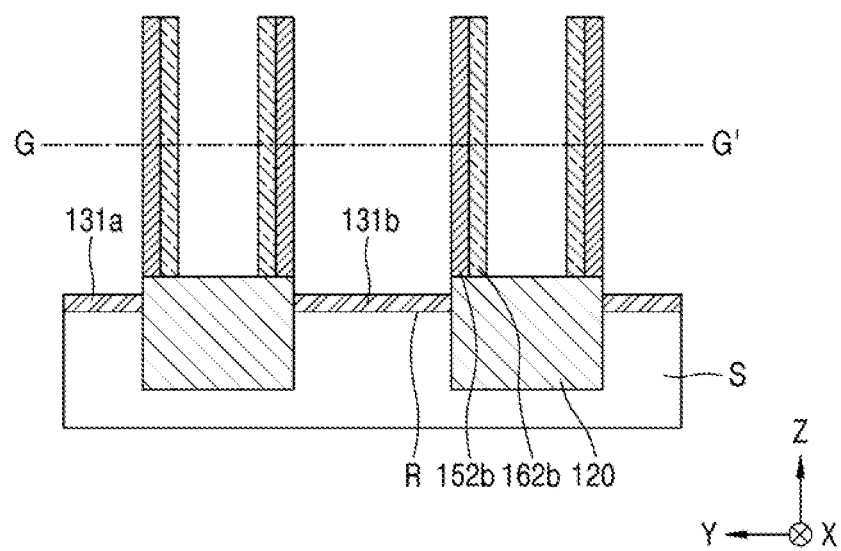
Figure 24D:
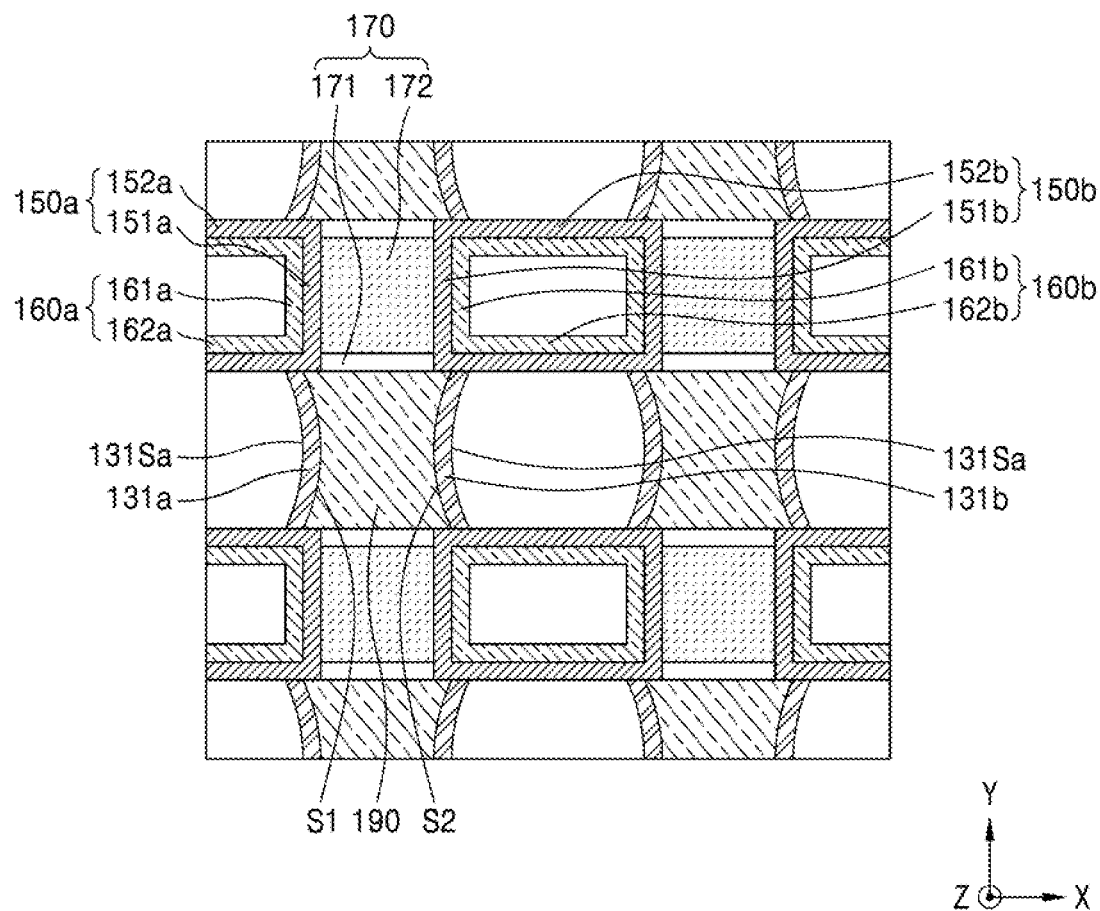
Figure 25A:
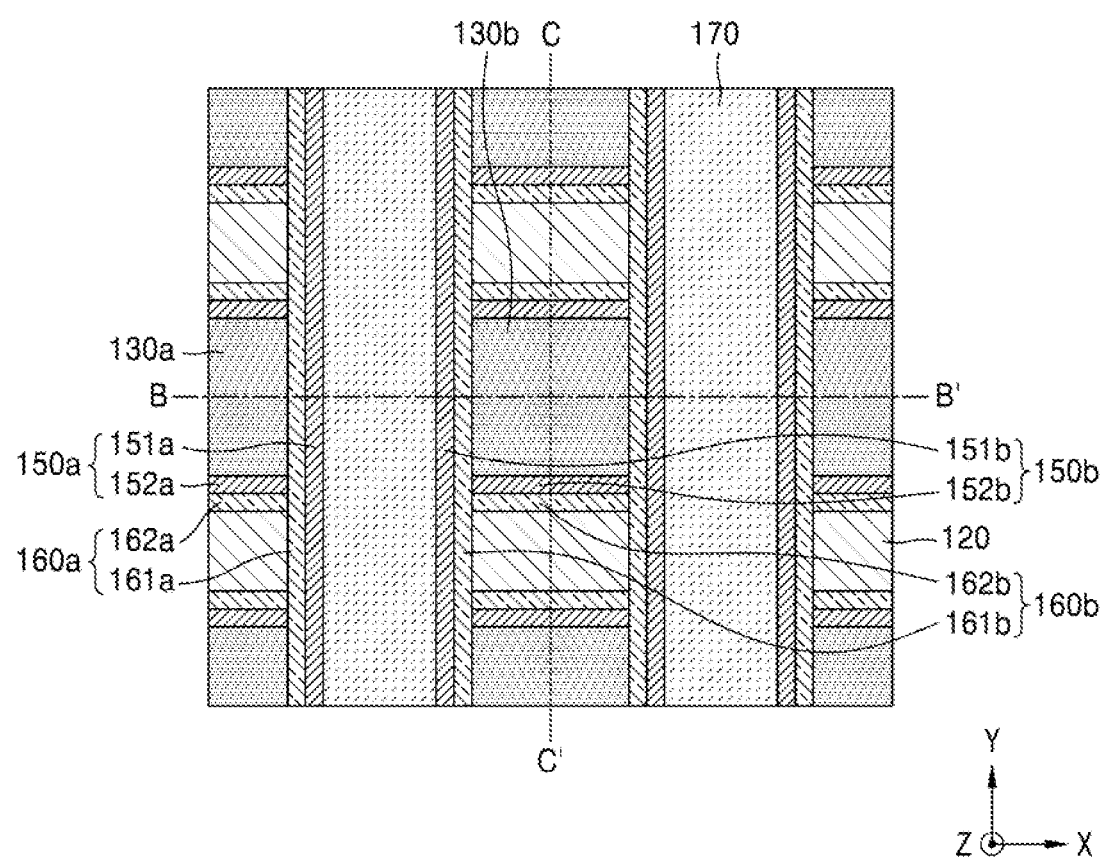
Figure 25B:
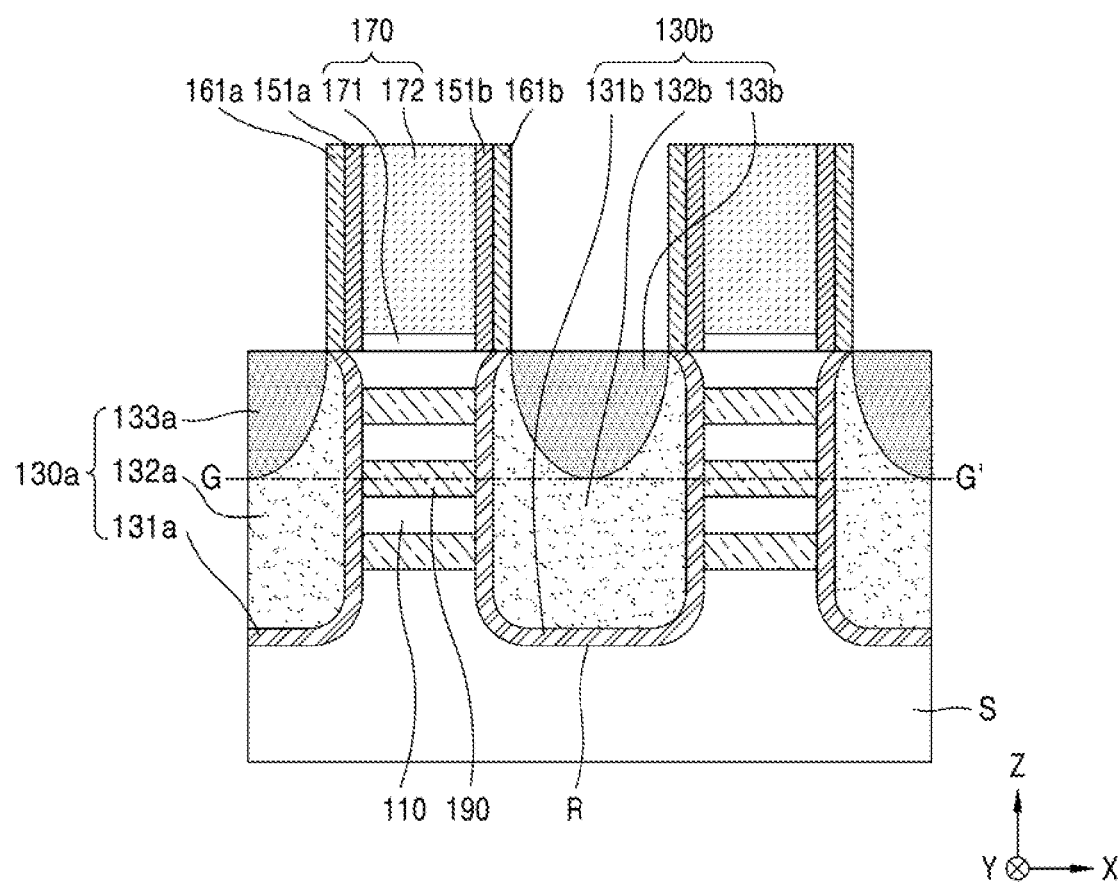
Figure 25C:
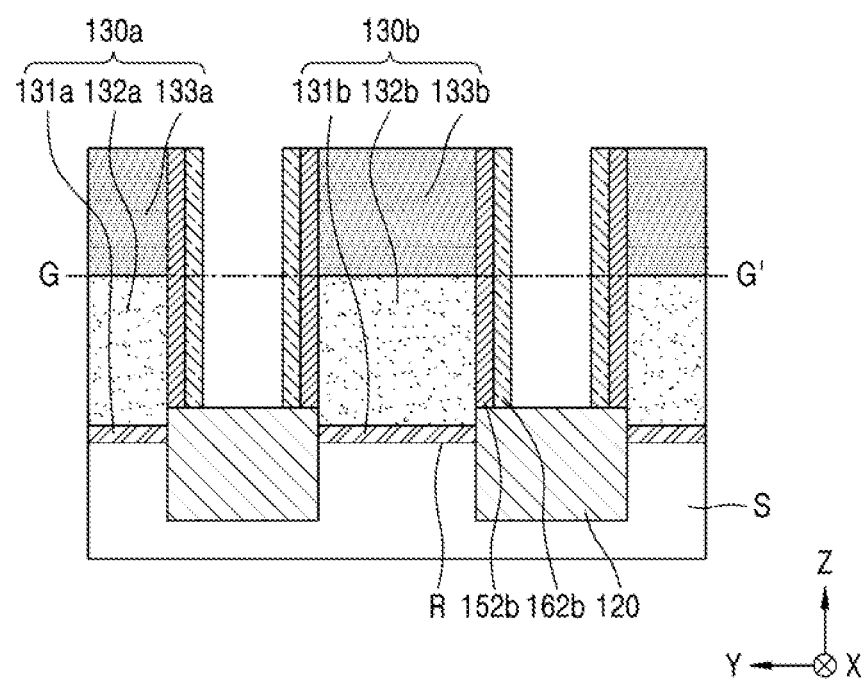
Figure 25D:
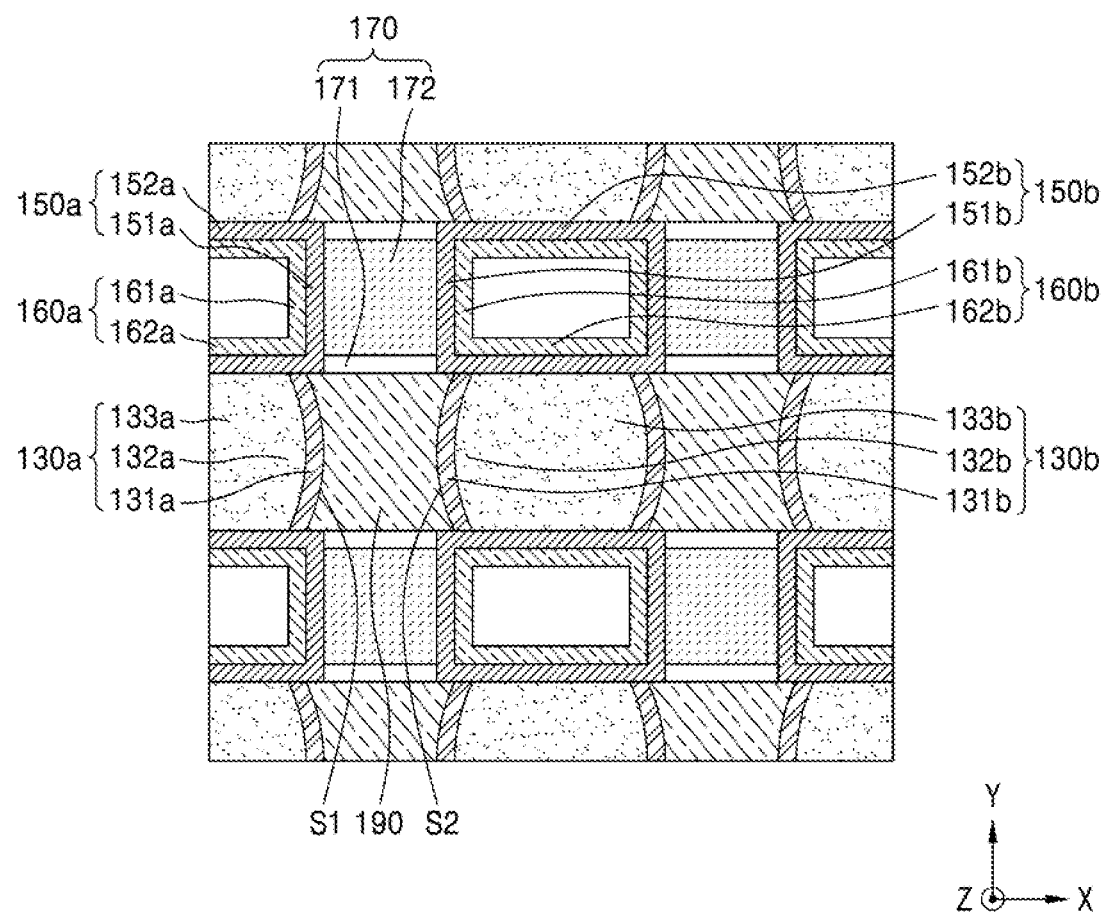

When a perfect anisotropic etching process is used, on the cross-section of FIG. 24D, the surface 131Sa of the first source or drain layer 131a and the surface 131Sb of the fourth source or drain layer 131b may appear as straight lines. However, when an etching process having slight isotropy is used, or an isotropic etching process is used after an anisotropic etching process, on the cross-section of FIG. 24D, the surface 131Sa of the first source or drain layer 131a and the surface 131Sb of the fourth source or drain layer 131b may appear as convex curves extending towards the sacrificial pattern 190. A thickness of the first source or drain layer 131a in the first horizontal direction (e.g., the X direction) may be formed relatively uniform. In particular, ends of the first source or drain layer 131a near the dummy gate structure 170 may be thick enough to block an etchant while the dummy gate structure 170 and the sacrificial pattern 190 are removed.

Referring to FIGS. 25A to 25D, the second source or drain layer 132a and the fifth source or drain layer 132b may be formed on the first source or drain layer 131a and the fourth source or drain layer 131b, respectively, by epitaxial growth. Next, the third source or drain layer 133a and the sixth source or drain layer 133b may be formed on the second source or drain layer 132a and the fifth source or drain layer 132b, respectively, by epitaxial growth.

Next, the dummy gate structure 170 and the sacrificial pattern 190 may be removed. When the sacrificial pattern 190 includes SiGe, an etchant for removing the sacrificial pattern 190 may also etch the source or drain structures 131a to 133a including SiGe. However, the first source or drain layer 131a having Ge concentration lower than that of the second source or drain layer 132a and a sufficient thickness may protect the second source or drain layer 132a and the third source or drain layer 133a from the etchant. Because the first source or drain layer 131a has a sufficient thickness at opposite ends over the entire length, the first source or drain layer 131a may prevent an etchant for removing the dummy gate structure 170 and the sacrificial pattern 190 from etching the second source or drain layer 132a and the third source or drain layer 133a. Therefore, a manufacturing yield of the semiconductor device may be increased. By doping the first source or drain layer 131a with carbon, resistance of the first source or drain layer 131a to an etchant may be increased. In addition, even if Ge concentration of the first source or drain layer 131a is increased in order to enhance the performance of the semiconductor device, a decrease in manufacturing yield due to etching of the second source or drain layer 132a and the third source or drain layer 133a may be prevented.

Referring to FIGS. 6A to 6F, the gate structure 140 may be formed in a space from which the dummy gate structure 170 and the sacrificial pattern 190 are removed. For example, the gate insulating layer 142 may be deposited in a space from which the dummy gate structure 170 and the sacrificial pattern 190 are removed, and the gate electrode layer 141 may be formed within the gate insulating layer 142. The semiconductor device 100-5 shown in FIGS. 6A to 6F may be manufactured according to the methods described with reference to FIGS. 21A to 25D.

When the first outer spacer layer 160a and the second outer spacer layer 160b shown in FIGS. 24A to 24D are formed after the processes according to FIGS. 21A to 23D are performed, the second portion 152a of the first inner spacer layer 150a, the second portion 162a of the first outer spacer layer 160a, the second portion 152b of the second inner spacer layer 150b, and the second portion 162b of the second outer spacer layer 160b may be removed through anisotropic etching. Accordingly, as shown in FIGS. 25A to 25D, when the second source or drain layer 132a, the third source or drain layer 133a, the fifth source or drain layer 132b, and the sixth source or drain layer 133b are grown, growth of the second source or drain layer 132a, the third source or drain layer 133a, the fifth source or drain layer 132b, and the sixth source or drain layer 133b in the second horizontal direction (e.g., the −Y direction) might not be limited by the second portion 152a of the first inner spacer layer 150a, the second portion 162a of the first outer spacer layer 160a, the second portion 152b of the second inner spacer layer 150b, and the second portion 162b of the second outer spacer layer 160b. The semiconductor device 100-10 of FIGS. 11A to 11C may be manufactured by such a method.

FIGS. 26A to 29A are plan views illustrating a method of manufacturing a semiconductor device, according to an embodiment of the present disclosure. FIGS. 26B to 29B are cross-sectional views illustrating the semiconductor device taken along line B-B' of FIGS. 26A to 29A, respectively. FIGS. 26C to 29C are cross-sectional views illustrating the semiconductor device taken along line C-C' of FIGS. 26A to 29A, respectively. FIGS. 27D to 29D are cross-sectional views illustrating the semiconductor device taken along line G-G' of FIGS. 27B to 29B and 27C to 29C, respectively.

Figure 26A:
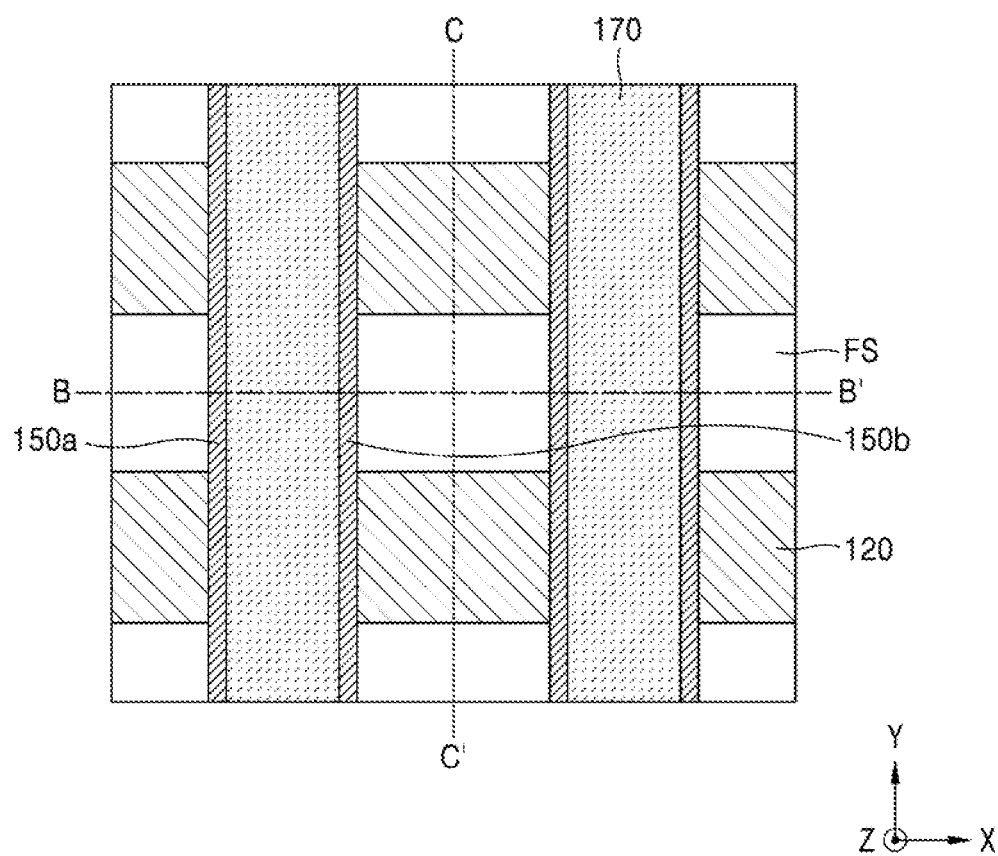
Figure 26B:
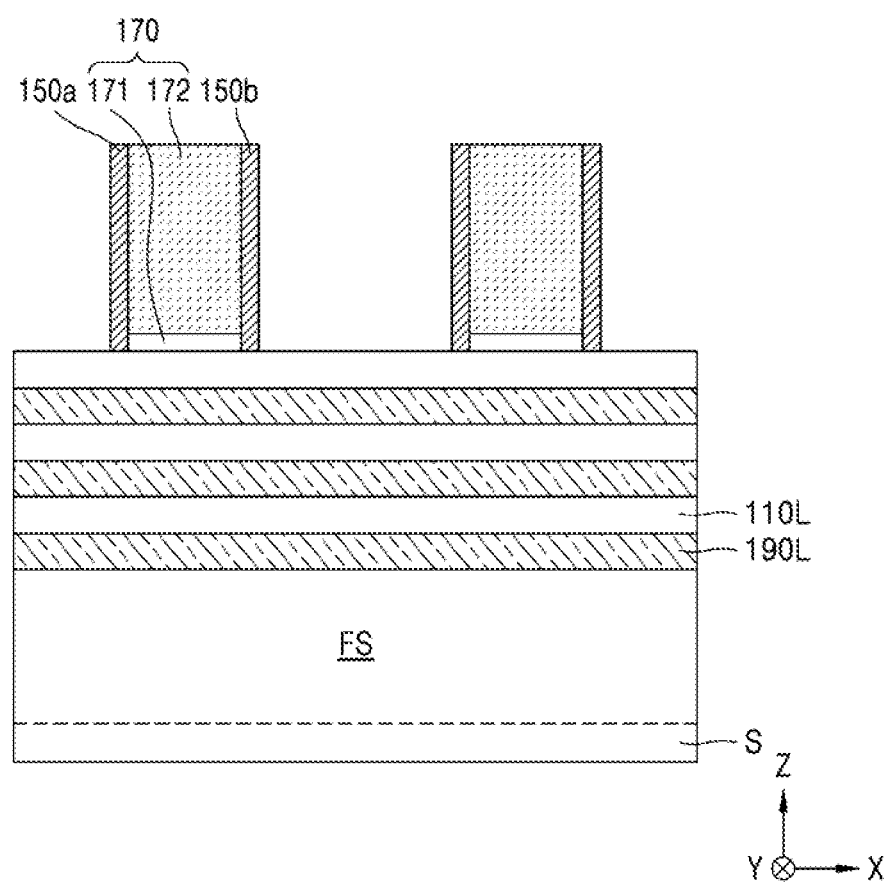
Figure 26C:
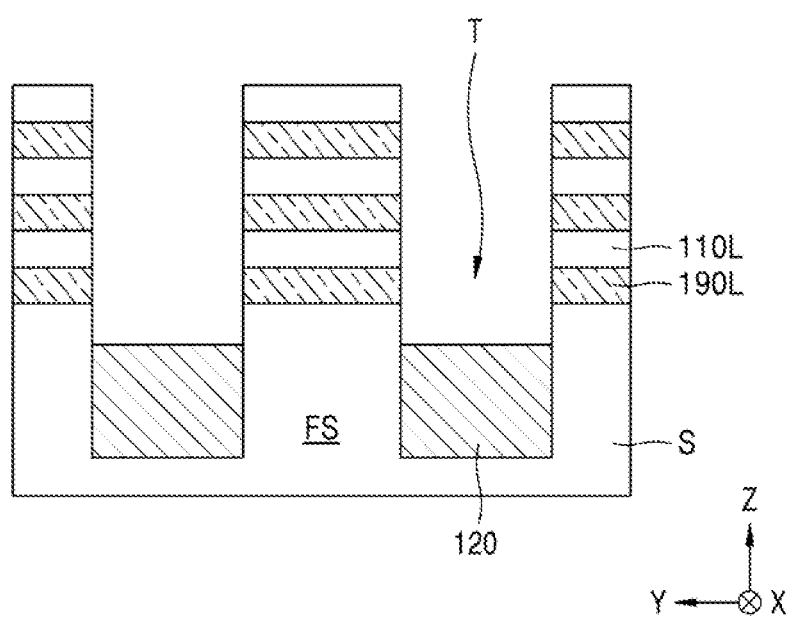
Figure 27A:
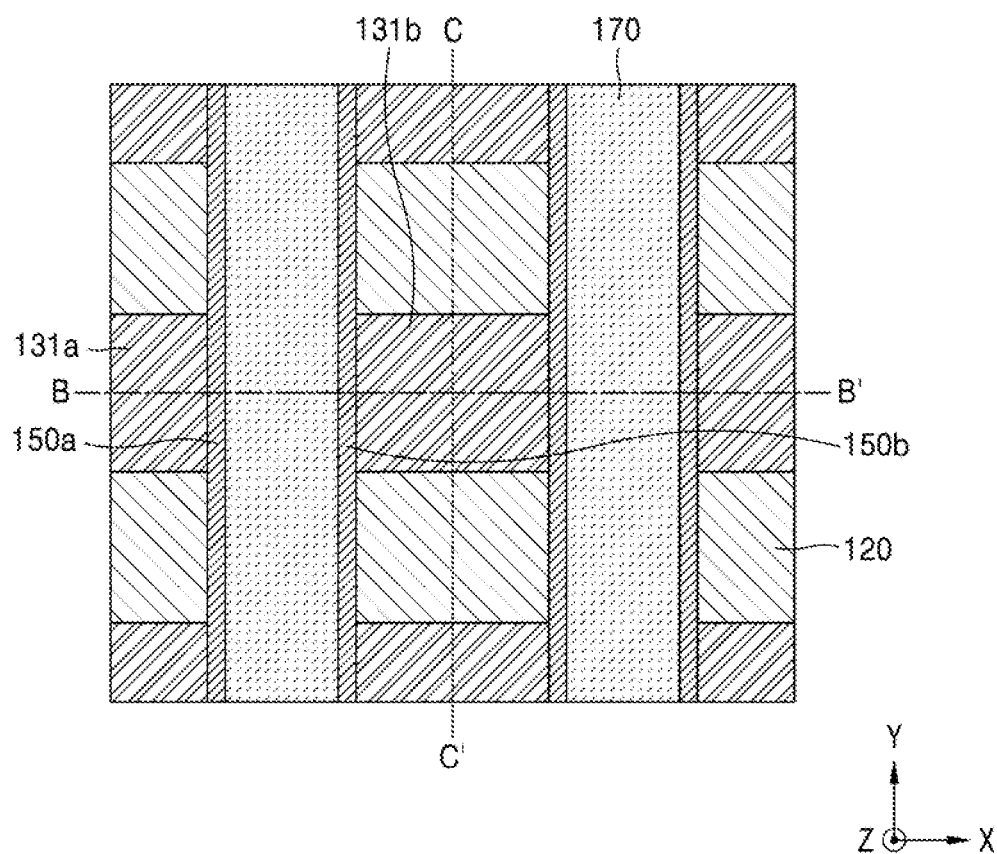
Figure 27B:
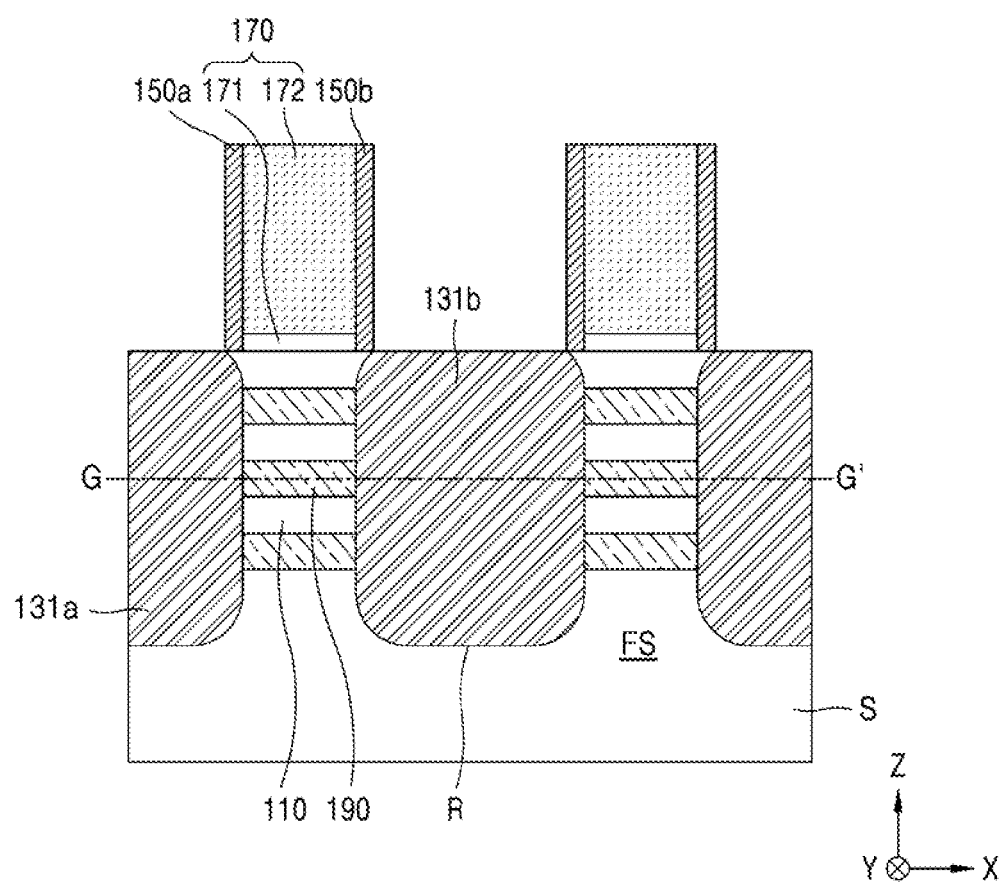
Figure 27C:
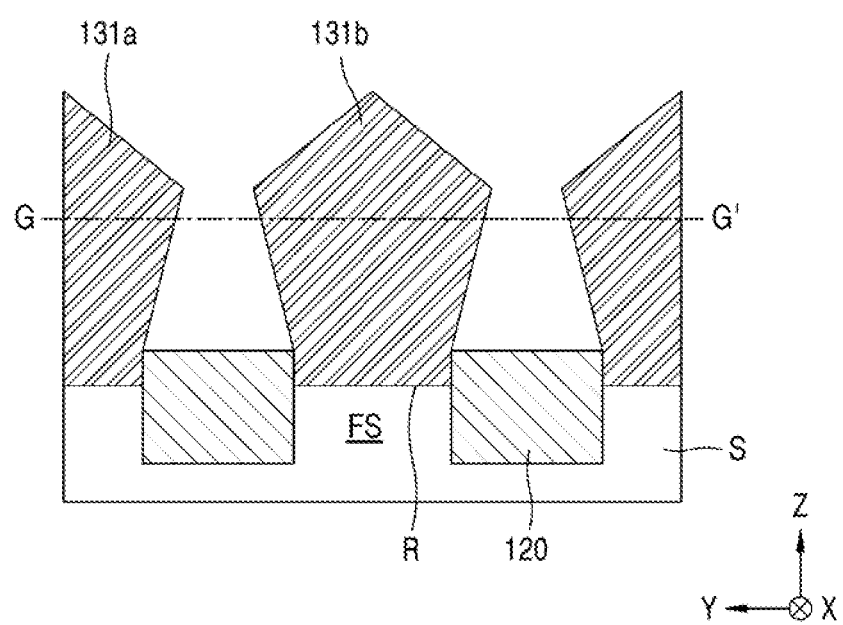
Figure 27D:
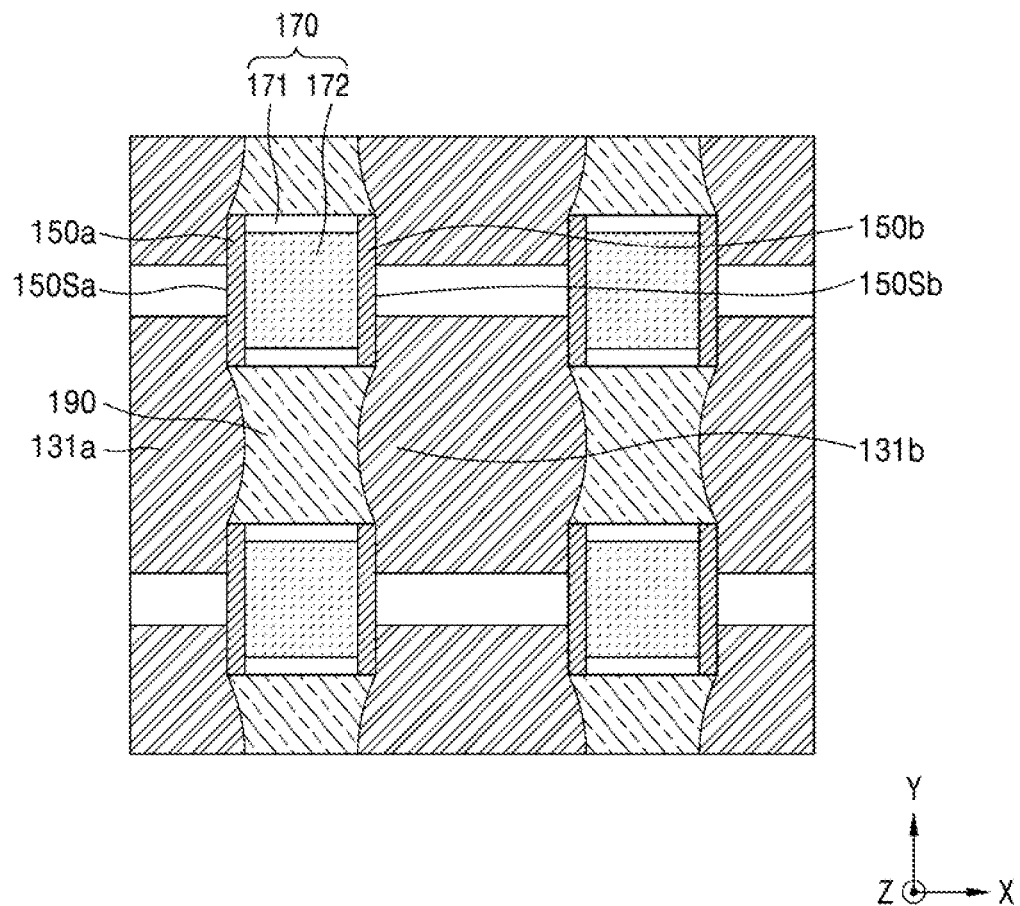
Figure 28A:
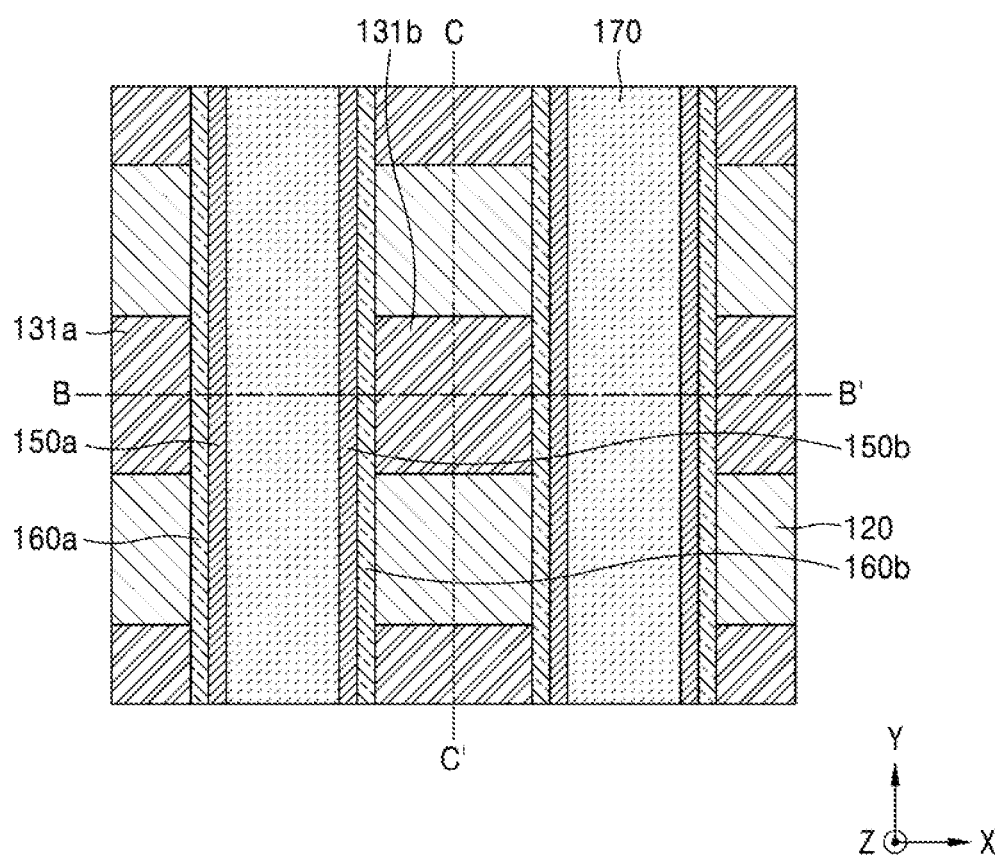
Figure 28B:
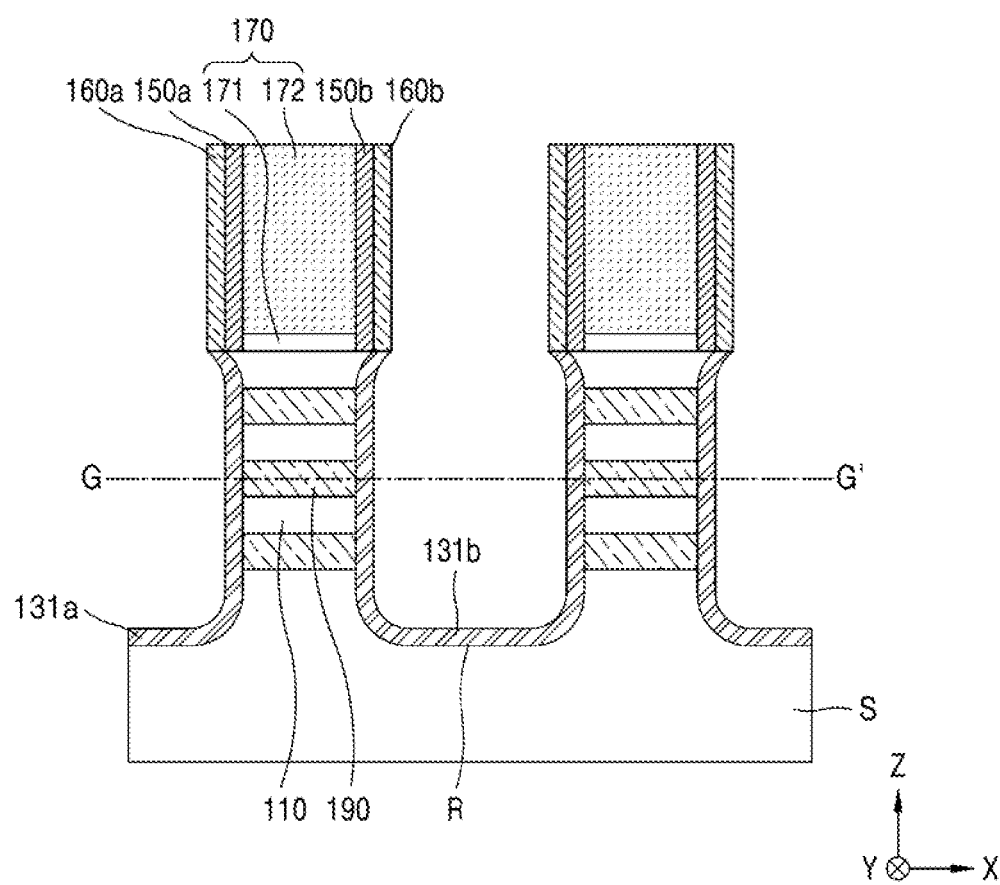
Figure 28C:
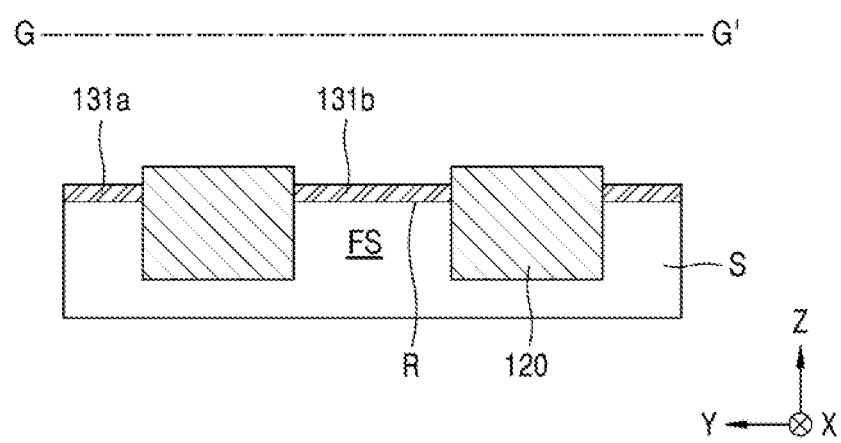
Figure 28D:
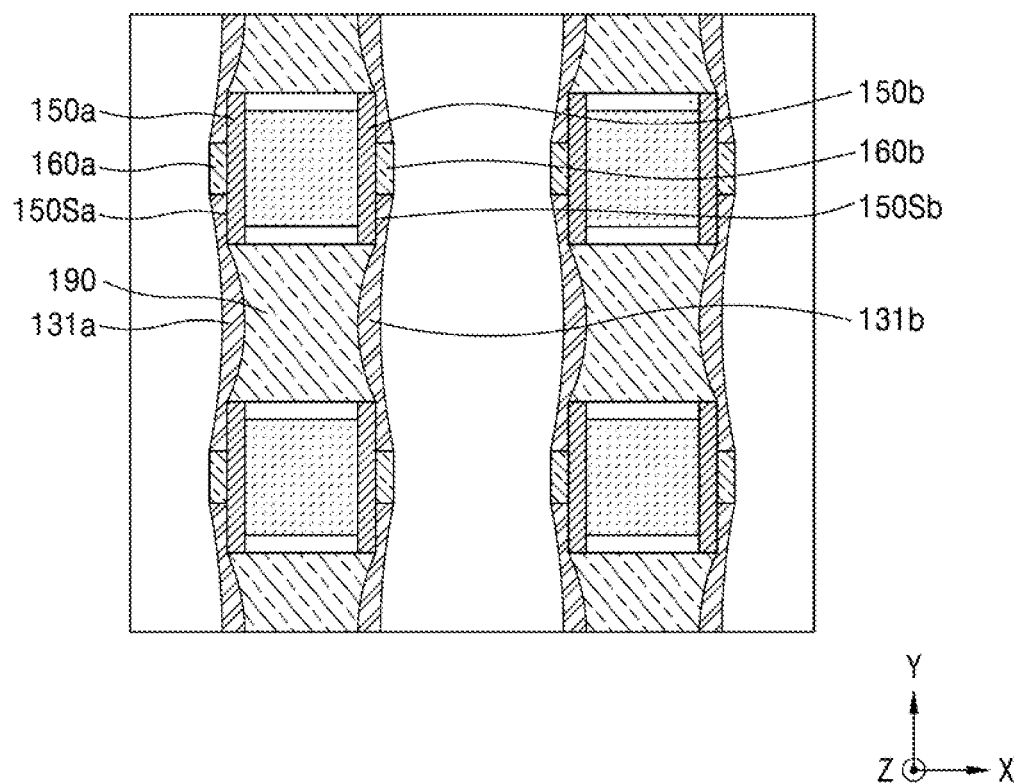
Figure 29A:
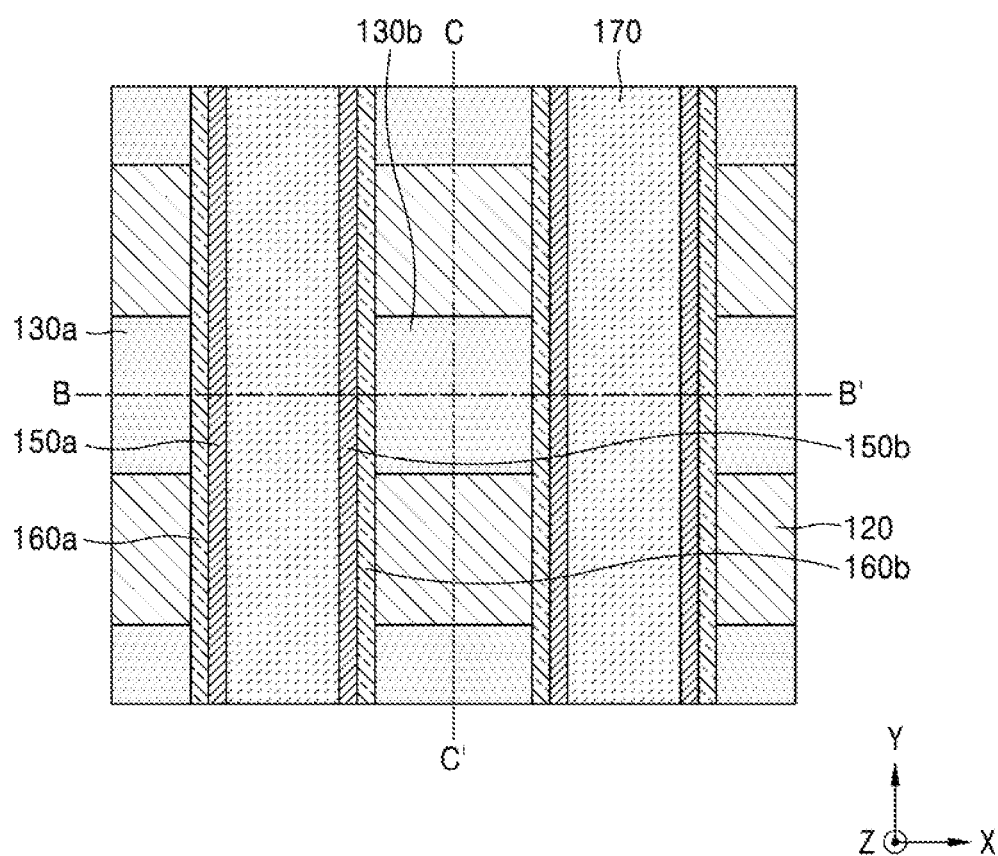
Figure 29B:
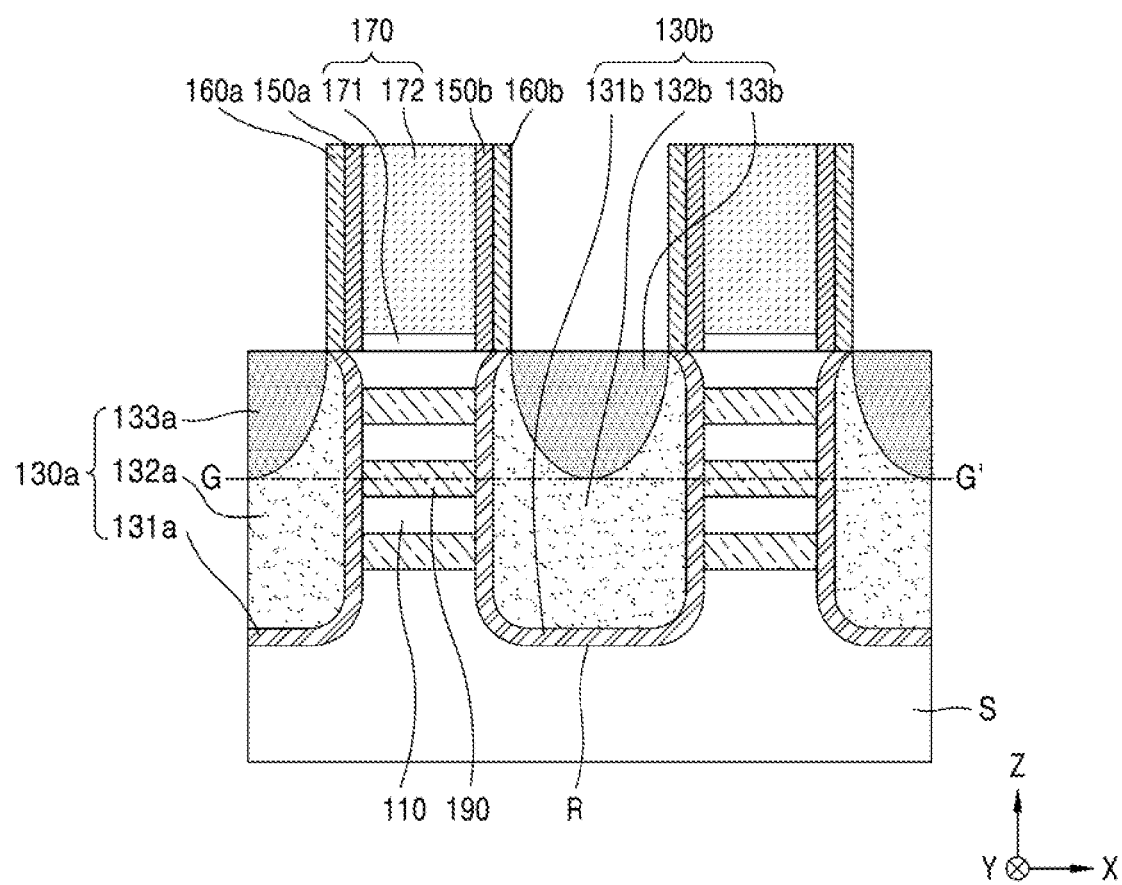
Figure 29C:
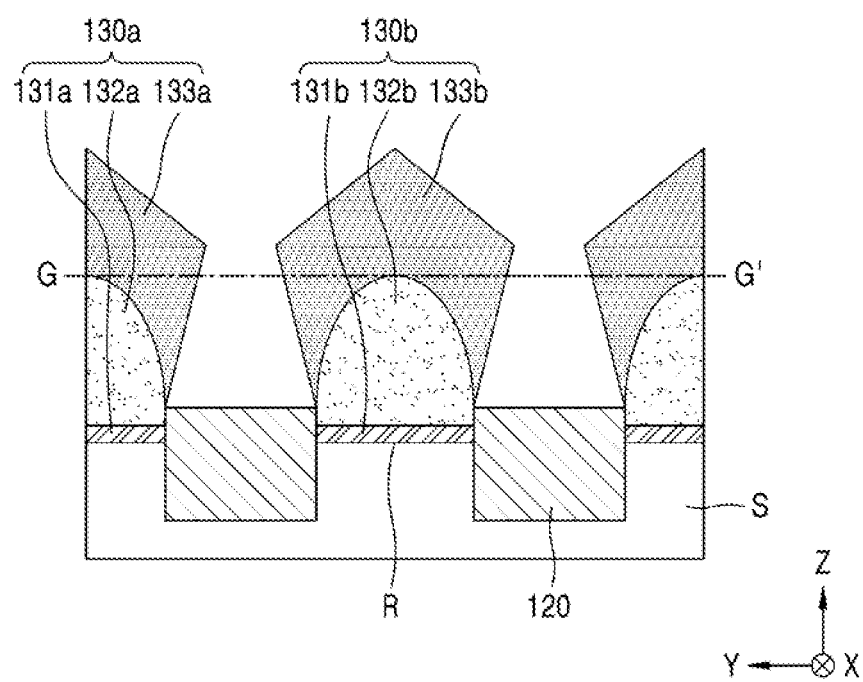
Figure 29D:
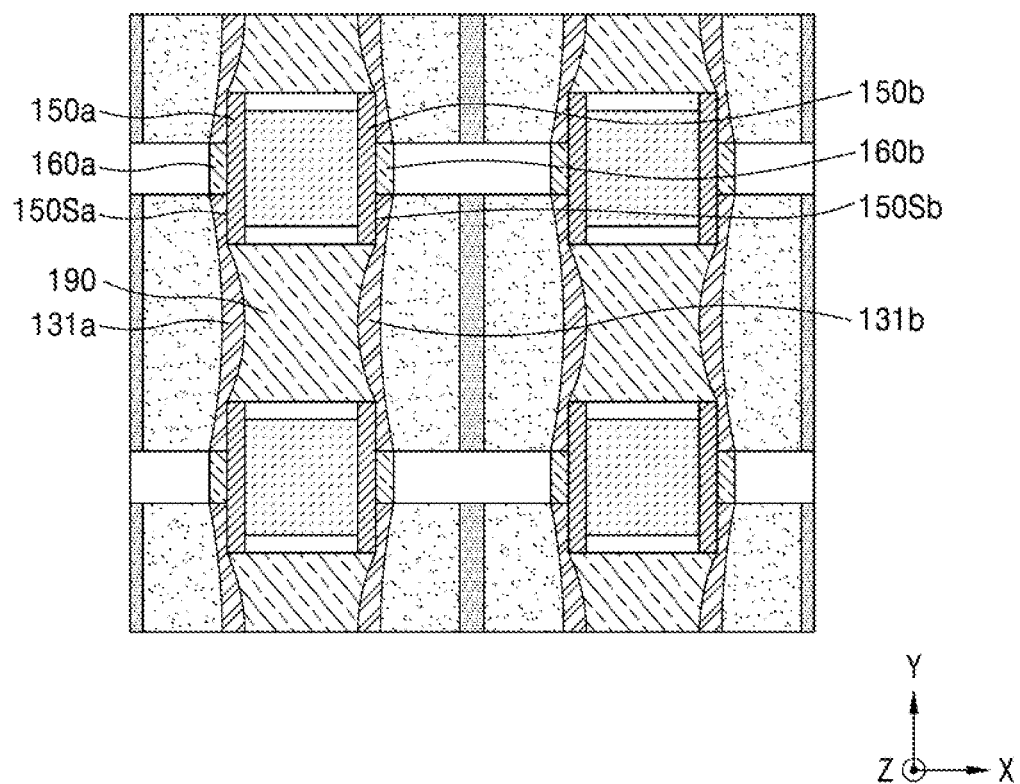

Referring to FIGS. 26A to 26C, the plurality of sacrificial layers 190L and the plurality of channel layers 110L may be alternately stacked on the substrate S in the same manner as described with reference to FIGS. 21A to 21C. Next, the fin structure FS may be formed by forming a plurality of trenches T in the same manner as described with reference to FIGS. 22A to 22C. Further, the device isolation layer 120 may be formed in the trench T. Next, the dummy gate structure 170 extending in the second horizontal direction (e.g., the −Y direction) may be formed on the fin structure FS.

Next, the first inner spacer layer 150a on a side surface of the dummy gate structure 170 and the second inner spacer layer 150b on the opposite side surface of the dummy gate structure 170 may be formed. The first inner spacer layer 150a and the second inner spacer layer 150b might not remain on side surfaces of the fin structure FS. For example, the first inner spacer layer 150a and the second inner spacer layer 150b may be formed by depositing an inner spacer material layer on the fin structure FS, the dummy gate structure 170, and the device isolation layer 120, and by removing portions of the inner spacer material layer on the side surfaces of the fin structure FS as well as an upper surface of the dummy gate structure 170, an upper surface of the fin structure FS, and an upper surface of the device isolation layer 120 through anisotropic etching.

Referring to FIGS. 27A to 27D, a plurality of recesses R may be formed by etching the fin structure FS using the dummy gate structure 170, the first inner spacer layer 150a, and the second inner spacer layer 150b as an etching mask. A plurality of channels 110 and a plurality of sacrificial patterns 190 may be formed by forming the recesses R.

Next, the first source or drain layer 131a and the fourth source or drain layer 131b having a sufficient thickness on the recesses R may be formed using epitaxial growth. In some embodiments of the present disclosure, the first source or drain layer 131a and the fourth source or drain layer 131b may be formed to almost entirely fill each recess R. Because there is no first inner spacer layer 150a and second inner spacer layer 150b on a side surface of the fin structure FS, growth of the first source or drain layer 131a and the fourth source or drain layer 131b might not be limited by the first inner spacer layer 150a and the second inner spacer layer 150b. Accordingly, the first source or drain layer 131a and the fourth source or drain layer 131b may be formed greater in the second horizontal direction (e.g., the −Y direction) than the fin structure FS, the channel 110, and the sacrificial pattern 190. Thus, in some embodiments of the present disclosure, on a cross-sectional plane of FIG. 27D, the first source or drain layer 131a and the fourth source or drain layer 131b may contact the outer surface 150Sa of the first inner spacer layer 150a and the outer surface 150Sb of the second inner spacer layer 150b, respectively.

Referring to FIGS. 28A to 28D, the first outer spacer layer 160a and the second outer spacer layer 160b may be formed on an outer surface of the first inner spacer layer 150a and an outer surface of the second inner spacer layer 150b, respectively. On the cross-sectional view illustrating FIG. 28D, because the first source or drain layer 131a may partially cover the outer surface 150Sa of the first inner spacer layer 150a, the first outer spacer layer 160a may be formed on the rest of the outer surface 150Sa of the first inner spacer layer 150a. Similarly, because the fourth source or drain layer 131b may partially cover the outer surface 150Sb of the second inner spacer layer 150b, the second outer spacer layer 160b may be formed on the rest of the outer surface 150Sb of the second inner spacer layer 150b.

Next, the first source or drain layer 131a is etched using the first outer spacer layer 160a as an etching mask, and the fourth source or drain layer 131b may be etched using the second outer spacer layer 160b as an etching mask.

Referring to FIGS. 29A to 29D, the second source or drain layer 132a and the fifth source or drain layer 132b may be formed on the first source or drain layer 131a and the fourth source or drain layer 131b, respectively, by epitaxial growth. Next, the third source or drain layer 133a and the sixth source or drain layer 133b may be formed on the second source or drain layer 132a and the fifth source or drain layer 132b, respectively, by epitaxial growth. Because the first inner spacer layer 150a, the second inner spacer layer 150b, the first outer spacer layer 160a, and the second outer spacer layer 160b do not interfere with growth of the second source or drain layer 132a, the third source or drain layer 133a, the fifth source or drain layer 132b, and the sixth source or drain layer 133b in the second horizontal direction (e.g., the −Y direction), the first source or drain structure 130a and the second source or drain structure 130b may be greater than the fin structure FS, the channel 110, and the sacrificial pattern 190 in the second horizontal direction (e.g., the −Y direction).

Next, referring to FIGS. 7A to 7E, the gate structure 140 may be formed in a space from which the dummy gate structure 170 and the sacrificial pattern 190 are removed. The semiconductor device 100-6 illustrated in FIGS. 7A to 7E may be manufactured according to the methods described with reference to FIGS. 26A to 29D. In addition, the semiconductor devices 100-7, 100-8, and 100-9 of FIGS. 8 to 10 may be manufactured by increasing the anisotropy of a process of forming the recess R and/or by increasing the anisotropy of a process of etching the first source or drain layer 131a and the fourth source or drain layer 134a.

Figure 30:
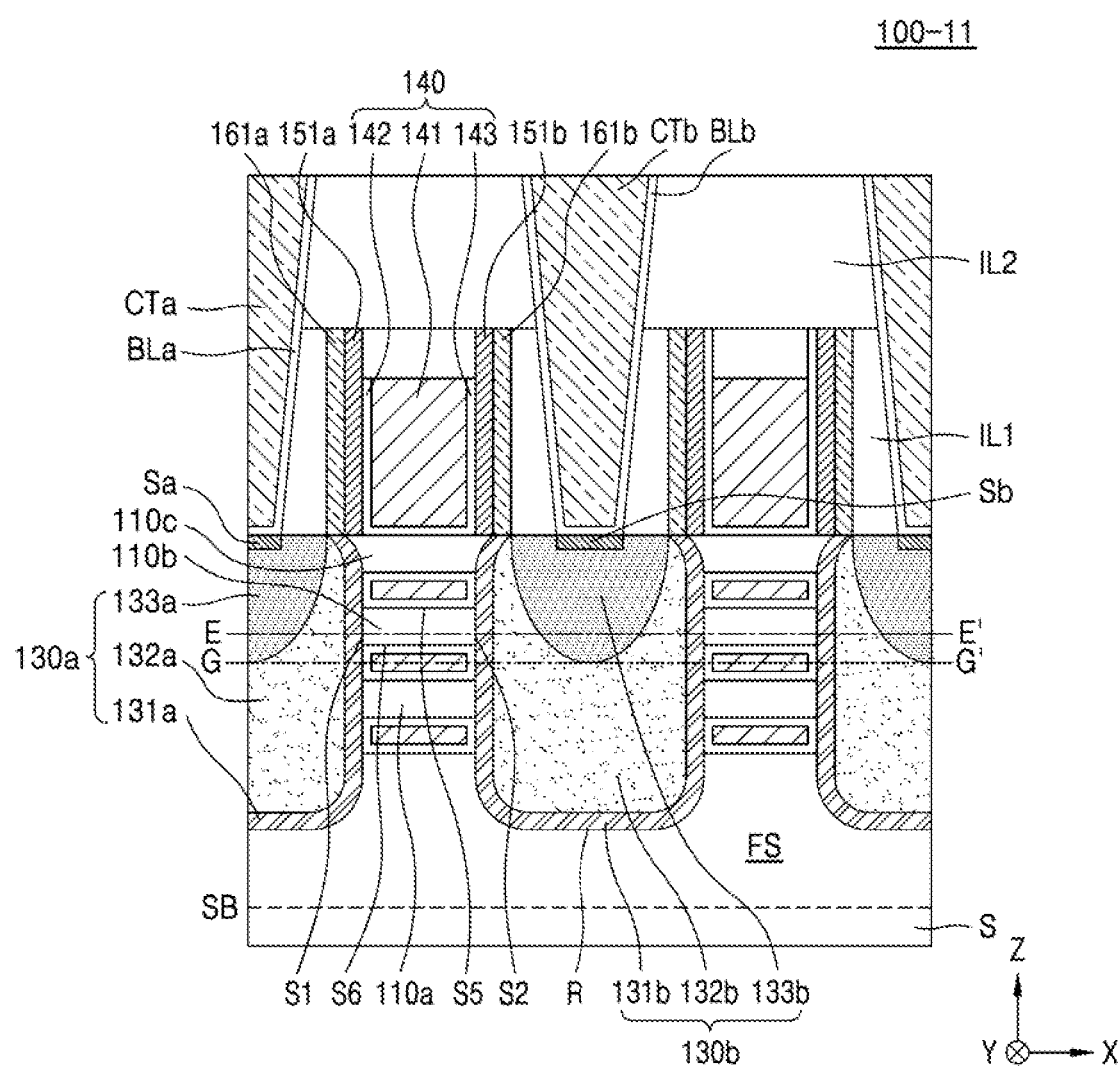
FIG. 30 is a cross-sectional view illustrating a semiconductor device according to an embodiment of the present disclosure.

FIG. 30 is a cross-sectional view illustrating a semiconductor device 100-11 according to an embodiment of the present disclosure.

Referring to FIG. 30, the gate structure 140 may further include a gate capping layer 143 covering the gate insulating layer 142 and the gate electrode layer 141. The gate capping layer 143 may include, for example, silicon nitride.

The semiconductor device 100-11 may further include a first interlayer insulating layer IL1 on the first source or drain structure 130a and the second source or drain structure 130b. The semiconductor device 100-11 may further include a second interlayer insulating layer IL2 on the gate structure 140 and the first interlayer insulating layer IL1. The first interlayer insulating layer IL1 and the second interlayer insulating layer IL2 may each include silicon oxide, silicon nitride, or a low-x dielectric material.

The semiconductor device 100-11 may further include a first contact CTa penetrating the first interlayer insulating layer IL1 and the second interlayer insulating layer IL2 to contact the first source or drain structure 130a. The semiconductor device 100-11 may further include a second contact CTb penetrating the first interlayer insulating layer IL1 and the second interlayer insulating layer IL2 to contact the second source or drain structure 130b. In some embodiments of the present disclosure, the first contact CTa and the second contact CTb may include, for example, tungsten, gold, silver, copper, titanium, tantalum, molybdenum (Mo), or a combination thereof. In some embodiments of the present disclosure, the semiconductor device 100-11 may further include a first barrier layer BLa on a surface of the first contact CTa, and a second barrier layer BLb on a surface of the second contact CTb. The first and second barrier layers Bla and BLb may include Ti, tantalum (Ta), titanium nitride (TiN), tantalum nitride (TaN), or graphene. In some embodiments of the present disclosure, the semiconductor device 100-11 may further include a first silicide layer Sa between the first contact CTa and the first source or drain structure 130a, and a second silicide layer Sb between the second contact CTb and the second source or drain structure 130b. The first silicide layer Sa and the second silicide layer Sb may include, for example, titanium silicide, tantalum silicide, or a combination thereof. In some embodiments of the present disclosure, the first contact CTa and the second contact CTb may have a tapered shape. For example, an X-direction dimension of the first contact CTa and an X-direction dimension of the second contact CTb may increase in the Z direction.

Figure 31:
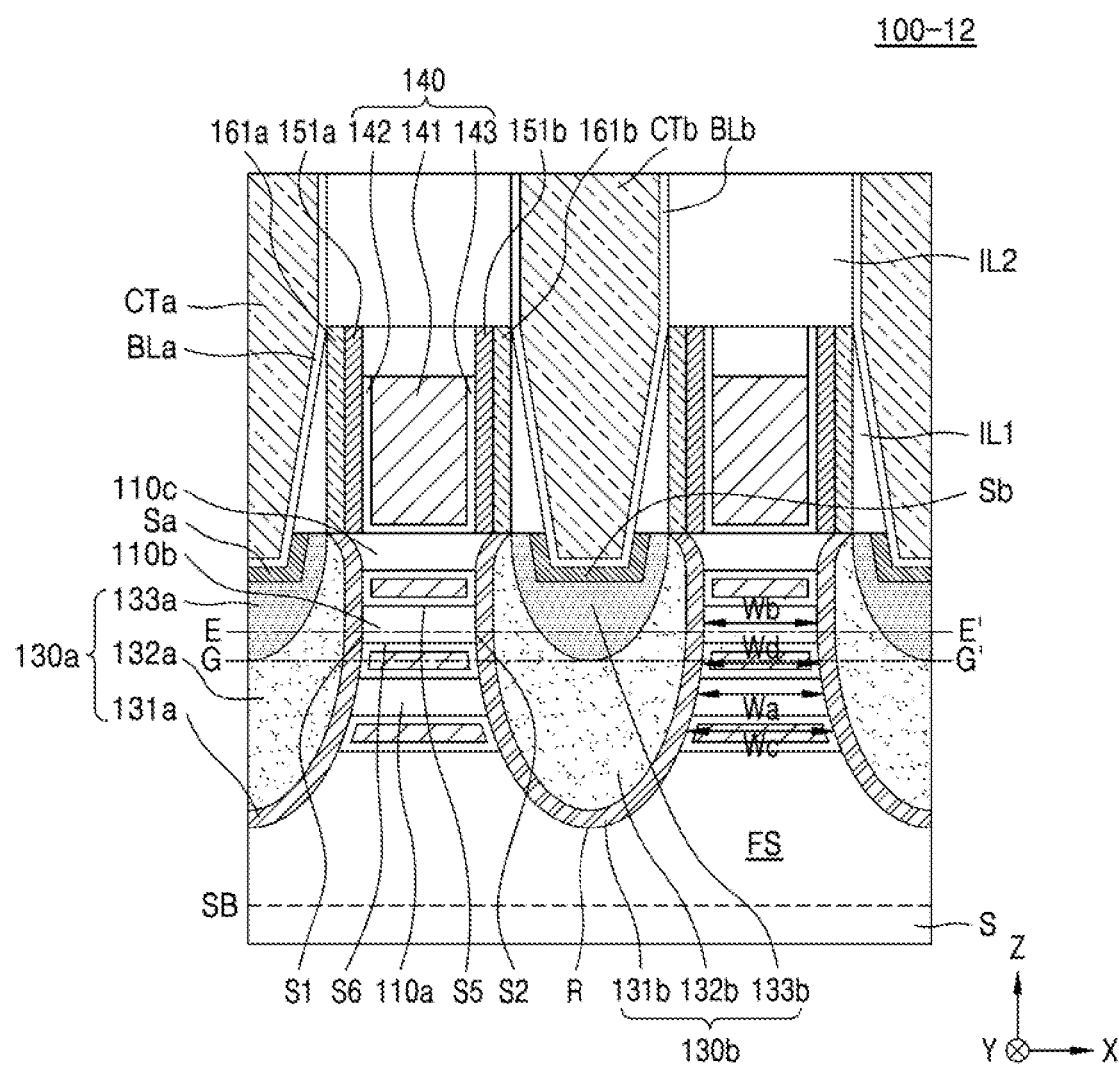
FIG. 31 is a cross-sectional view illustrating a semiconductor device according to an embodiment of the present disclosure.

FIG. 31 is a cross-sectional view illustrating a semiconductor device 100-12 according to an embodiment of the present disclosure.

Referring to FIG. 31, a portion of the first contact CTa may be recessed into the first source or drain structure 130a, and a portion of the second contact CTb may be recessed into the second source or drain structure 130b. A width Wa of the first channel 110a may be greater than a width Wb of the second channel 110b. In addition, a width Wc of a portion of the gate structure 140 under the first channel 110a may be greater than a width Wd of a portion of the gate structure 140 between the first channel 110a and the second channel 110b.

Figure 32:
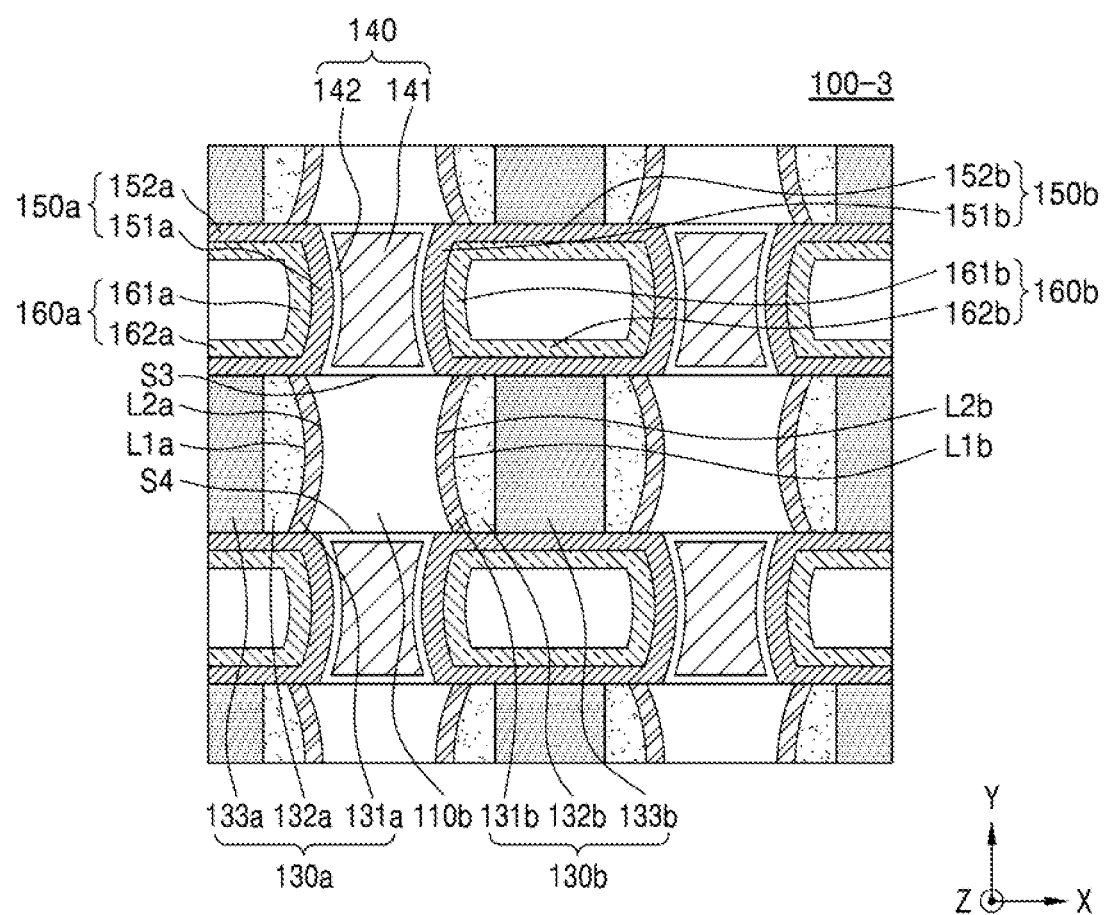
FIG. 32 is a cross-sectional view illustrating a semiconductor device according to an embodiment of the present disclosure.

FIG. 32 is a cross-sectional view illustrating a semiconductor device 100-13 according to an embodiment of the present disclosure.

Referring to FIG. 32, when compared with the semiconductor device 100-5 of FIG. 6E, the first portion 151a of the first inner spacer layer 150a and the first portion 151b of the second inner spacer layer 150b may be convex, extending toward the gate structure 140. In addition, the first portion 161a of the first outer spacer layer 160a and the first portion 161b of the second outer spacer layer 160b may be convex, extending toward the gate structure 140.

Figure 33:
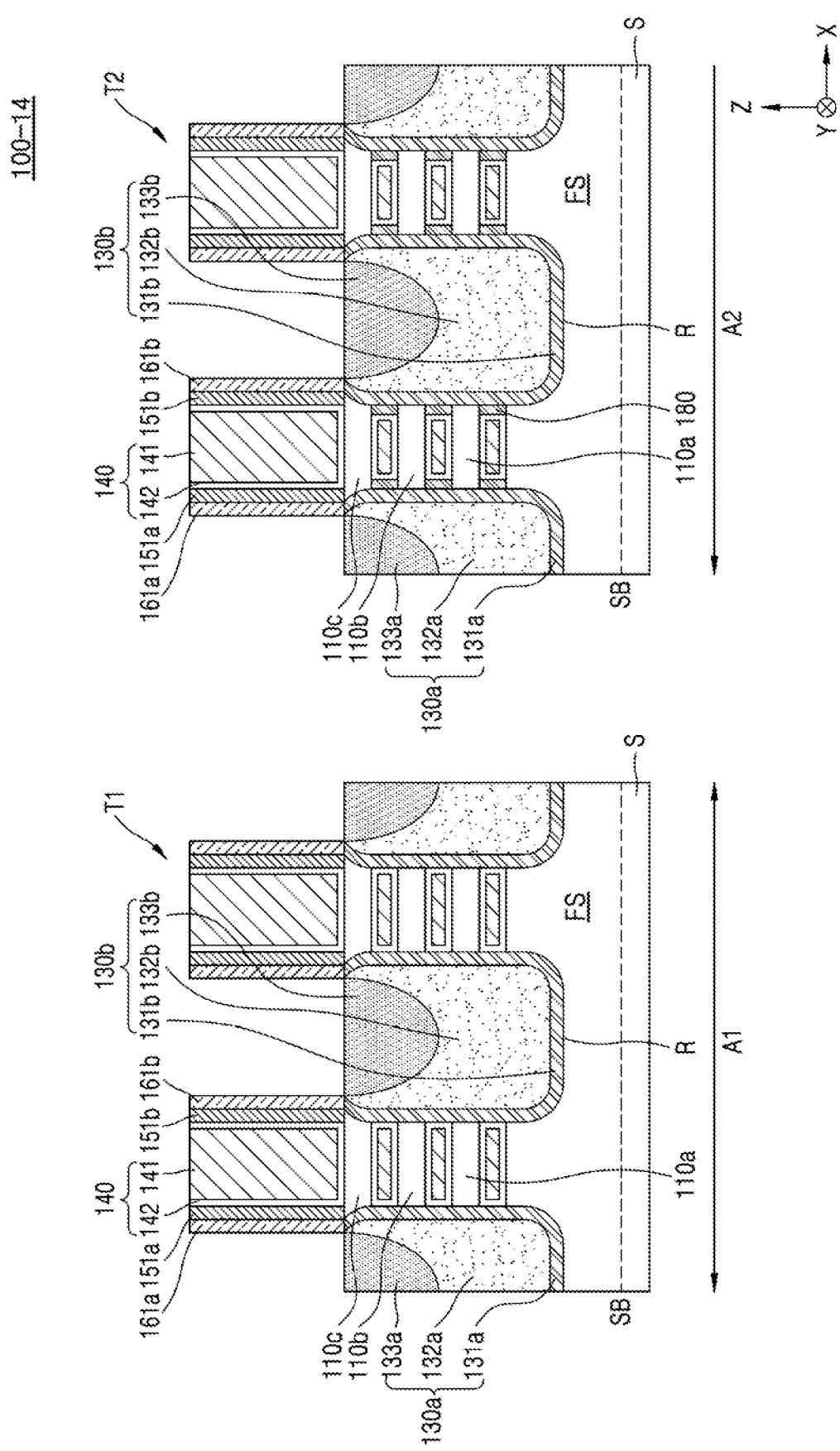
FIG. 33 is a cross-sectional view illustrating a semiconductor device according to an embodiment of the present disclosure.

FIG. 33 is a cross-sectional view illustrating a semiconductor device 100-14 according to an embodiment of the present disclosure.

Referring to FIG. 33, the substrate S may include a first area A1 and a second area A2. A plurality of first transistors T1 may be formed on the first area A1. A plurality of second transistors T2 may be formed on the second area A2. For example, a first transistor T1 may be a PMOS transistor, and a second transistor T2 may be an NMOS transistor.

The second transistor T2 may further include an inter-channel spacer layer 180 compared to the first transistor T1. Inter-channel spacer layers 180 may be located between adjacent channels, for example, between the second channel 110b and the third channel 110c, and between the first channel 110a and the second channel 110b, respectively. The inter-channel spacer layer 180 may be between the gate insulating layer 142 and the first source or drain layer 131a and between the gate insulating layer 142 and the fourth source or drain layer 131b. For example, the inter-channel spacer layers 180 may be respectively located in a space defined by the first channel 110a, the second channel 110b, the gate insulating layer 142, and the first source or drain layer 131a, a space defined by the first channel 110a, the second channel 110b, the gate insulating layer 142, and the fourth source or drain layer 131b, a space defined by the second channel 110b, the third channel 110c, the gate insulating layer 142, and the first source or drain layer 131a, and a space defined by the second channel 110b, the third channel 110c, the gate insulating layer 142, and the fourth source or drain layer 131b.

While the inventive concept has been particularly shown and described with reference to embodiments thereof, it will be understood that various changes in form and details may be made therein without departing from the spirit and scope of the present disclosure.

What is claimed is:

1. A semiconductor device, comprising:
   a channel;
   a first source or drain structure disposed on a first side surface of the channel;
   a second source or drain structure disposed on a second side surface of the channel that is spaced apart from the first side surface of the channel in a first horizontal direction;
   a gate structure including a gate electrode layer at least partially surrounding an upper surface of the channel, a third side surface of the channel, a fourth side surface of the channel spaced apart from the third side surface of the channel in a second horizontal direction, and a gate insulating layer disposed between the gate electrode layer and the channel;
   an inner spacer layer disposed on a side surface of the gate structure; and
   an outer spacer layer disposed on an outer surface of the inner spacer layer,
   wherein the first source or drain structure includes a first source or drain layer disposed on the channel and a second source and/or drain layer disposed on the first source or drain layer, and
   wherein, on a plane of the semiconductor device that passes through the channel and is parallel to the first horizontal direction and the second horizontal direction, at least one of a first boundary line of the first source or drain layer in contact with the second source or drain layer and a second boundary line of the first source or drain layer in contact with the channel is convex, extending toward the channel.

2. The semiconductor device of claim 1, wherein, on the plane, the first boundary line is convex, extending toward the channel, and the second boundary line is a straight line.

3. The semiconductor device of claim 1, wherein, on the plane, the first boundary line is a straight line, and the second boundary line is convex, extending toward the channel.

4. The semiconductor device of claim 1, wherein, on the plane, both of the first boundary line and the second boundary line are convex, each extending toward the channel.

5. The semiconductor device of claim 1, wherein each of the first source or drain layer and the second source or drain layer includes SiGe.

6. The semiconductor device of claim 1, wherein the second source or drain layer has Ge concentration that is greater than that of the first source or drain layer.

7. The semiconductor device of claim 1, wherein the first source or drain layer is doped with carbon.

8. The semiconductor device of claim 1, wherein the first boundary line is either straight or is convex, extending towards the channel.

9. The semiconductor device of claim 1, wherein, on the plane, a length of the first boundary line in the second horizontal direction is greater than a length of the second boundary line in the second horizontal direction.

10. A semiconductor device, comprising:
    a channel;
    a first source or drain structure including a first source or drain layer disposed on a first side surface of the channel and a second source or drain layer disposed on the first source or drain layer;
    a second source or drain structure including a third source or drain layer disposed on a second side surface of the channel spaced apart from the first side surface of the channel in a first horizontal direction and a fourth source or drain layer disposed on the third source or drain layer;
    a gate structure including a gate electrode layer at least partially surrounding an upper surface of the channel, a third side surface of the channel, a fourth side surface of the channel that is spaced apart from the third side surface of the channel in a second horizontal direction, and a gate insulating layer disposed between the gate electrode layer and the channel;
    a first inner spacer layer disposed on a first side surface of the gate structure;
    a second inner spacer layer disposed on a second side surface of the gate structure spaced from the first side surface of the gate structure in the first horizontal direction;
    a first outer spacer layer disposed on an outer surface of the first inner spacer layer; and
    a second outer spacer layer disposed on an outer surface of the second inner spacer layer,
    wherein, on a plane of the semiconductor device that passes through the channel and is parallel to the first horizontal direction and the second horizontal direction, a first distance between the second source or drain layer and the fourth source or drain layer along a first horizontal line that passes through the third side surface of the channel and is parallel to the first horizontal direction is greater than a second distance between the second source or drain layer and the fourth source or drains layer along a second horizontal line that passes between the third side surface of the channel and the fourth side surface of the channel and is parallel to the first horizontal direction.

11. The semiconductor device of claim 10, wherein, on the plane, a maximum distance between the second source or drain layer and the fourth source or drain layer in the first horizontal direction is less than or equal to a distance between outer surfaces of the first outer spacer layer and the second outer spacer layer in the first horizontal direction.

12. The semiconductor device of claim 10, wherein, on the plane, a maximum distance between the first source or drain layer and the third source or drain layer is less than or equal to a distance between outer surfaces of the first outer spacer layer and the second outer spacer layer.

13. The semiconductor device of claim 10, wherein, on the plane, a third distance between the first source or drain layer and the third source or drain layer along the first horizontal line is greater than a fourth distance between the first source or drain layer and the third source or drain along the second horizontal line.

14. The semiconductor device of claim 10, wherein, on the plane, a thickness of the first source or drain layer along the first horizontal line is less than a thickness of the first source or drain layer along the second horizontal line.

15. The semiconductor device of claim 10, wherein, on the plane, a thickness of the first source or drain layer along the first horizontal line is greater than a thickness of the first source or drain layer along the second horizontal line.

16. The semiconductor device of claim 10, wherein, on the plane, a thickness of the first source or drain layer in the first horizontal direction is uniform.

17. A semiconductor device, comprising:
a plurality of channels spaced apart from each other in a vertical direction;
a first source or drain structure in contact with a first side surface of each of the plurality of channels;
a second source or drain structure in contact with a second side surface of each of the plurality of channels spaced apart from the first side surface of each of the plurality of channels in a first horizontal direction;
a gate structure including a gate electrode layer at least partially surrounding an upper surface of each of the plurality of channels, a lower surface of each of the plurality of channels, a third side surface of each of the plurality of channels, and a fourth side surface of each of the plurality of channels spaced apart from the third side surface of each of the plurality of channels in a second horizontal direction, and a gate insulating layer disposed between the gate electrode layer and each of the plurality of channels;
an inner spacer layer disposed on a side surface of the gate structure perpendicular to the first horizontal direction; and
an outer spacer layer disposed on an outer surface of the inner spacer layer,
wherein the first source or drain structure includes a first source or drain layer in contact with the gate insulating layer and a second source or drain layer in contact with the first source or drain layer, and,
on a plane of the semiconductor device that passes through a portion of the gate electrode layer between the plurality of channels and is perpendicular to the vertical direction, at least one of a first boundary line of the first source or drain layer in contact with the second source or drain layer and a second boundary line of the first source or drain layer in contact with the gate insulating layer is convex, extending toward the gate insulating layer.

18. The semiconductor device of claim 17, wherein, on the plane, the first source or drain layer is in contact with the inner spacer layer.

19. The semiconductor device of claim 17, wherein, on the plane, the first source or drain layer is spaced apart from an outer surface of the outer spacer layer.

20. The semiconductor device of claim 17, wherein the semiconductor device is p-type.

* * * * *